(12) United States Patent
Pyeon et al.

(10) Patent No.: US 8,010,709 B2
(45) Date of Patent: *Aug. 30, 2011

(54) APPARATUS AND METHOD FOR PRODUCING DEVICE IDENTIFIERS FOR SERIALLY INTERCONNECTED DEVICES OF MIXED TYPE

(75) Inventors: Hong Beom Pyeon, Kanata (CA); HakJune Oh, Kanata (CA); Jin-Ki Kim, Kanata (CA); Shuji Sumi, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 592 days.

This patent is subject to a terminal disclaimer.

(21) Appl. No.: 11/624,929

(22) Filed: Jan. 19, 2007

(65) Prior Publication Data

US 2008/0140948 A1    Jun. 12, 2008

Related U.S. Application Data

(63) Continuation-in-part of application No. 11/622,828, filed on Jan. 12, 2007.

(60) Provisional application No. 60/870,892, filed on Dec. 20, 2006, provisional application No. 60/868,773, filed on Dec. 6, 2006.

(51) Int. Cl.
    G06F 3/00    (2006.01)

(52) U.S. Cl. .......................... 710/8; 711/170

(58) Field of Classification Search .................. 711/170; 710/8
    See application file for complete search history.

(56) References Cited

U.S. PATENT DOCUMENTS

| | | | |
|---|---|---|---|
| 4,174,536 A | 11/1979 | Misunas et al. | |
| 4,360,870 A | 11/1982 | McVey | |
| 4,733,376 A | 3/1988 | Ogawa | |
| 4,796,231 A | 1/1989 | Pinkham | |
| 5,126,808 A | 6/1992 | Montalvo et al. | |
| 5,136,292 A | 8/1992 | Ishida | |
| 5,175,819 A | 12/1992 | Le Ngoc et al. | |

(Continued)

FOREIGN PATENT DOCUMENTS

| EP | 1717985 A1 | 11/2006 |
|---|---|---|
| WO | 01/69411 A2 | 9/2001 |

OTHER PUBLICATIONS

McVey, JM, "Programmable Identification for I/O Devices", Aug. 1979, IBM Technical Disclosure Bulletin, vol. 22, 882-883.*

(Continued)

*Primary Examiner* — Henry W Tsai
*Assistant Examiner* — Elias Mamo
(74) *Attorney, Agent, or Firm* — Mukundan Chakrapani; Borden Ladner Gervais LLP

(57) ABSTRACT

A plurality of memory devices of mixed type (e.g., DRAMs, SRAMs, MRAMs and NAND-, NOR- and AND-type Flash memories) are serially interconnected. Each device has device type information on its device type. A specific device type (DT) and a device identifier (ID) contained in a serial input (SI) are fed to one device of the serial interconnection. The device determines whether the fed DT matches the DT of the device. In a case of match, a calculator included in the device performs calculation to generate an ID for another device and the fed ID is latched in a register of the device. The generated ID is transferred to another device of the serial interconnection. In a case of no match, the ID generation is skipped and no ID is generated for another device. Such a device type match determination and ID generation or skip are performed in all devices of the serial interconnection. In cases of different device types being separately provided to the interconnected devices, sequential IDs are generated in each of the different device types and also the total number of each device type are recognized. In a case of a "don't care" code is provided to the interconnected devices, sequential IDs are generated and also, the total number of the interconnected devices is recognized, regardless of the type differences.

27 Claims, 46 Drawing Sheets

U.S. PATENT DOCUMENTS

| | | | |
|---|---|---|---|
| 5,243,703 | A | 9/1993 | Farmwald et al. |
| 5,249,270 | A | 9/1993 | Stewart et al. |
| 5,280,539 | A | 1/1994 | Yeom et al. |
| 5,319,598 | A | 6/1994 | Aralis et al. |
| 5,365,484 | A | 11/1994 | Cleveland et al. |
| 5,404,460 | A | 4/1995 | Thomsen et al. |
| 5,430,859 | A | 7/1995 | Norman et al. |
| 5,440,694 | A | 8/1995 | Nakajima |
| 5,452,259 | A | 9/1995 | McLaury |
| 5,473,563 | A | 12/1995 | Suh et al. |
| 5,473,566 | A | 12/1995 | Rao |
| 5,473,577 | A | 12/1995 | Miyake et al. |
| 5,596,724 | A | 1/1997 | Mullins et al. |
| 5,602,780 | A | 2/1997 | Diem et al. |
| 5,363,342 | A | 6/1997 | Jeffries |
| 5,636,342 | A * | 6/1997 | Jeffries ............................ 714/48 |
| 5,671,178 | A | 9/1997 | Park et al. |
| 5,721,840 | A | 2/1998 | Soga |
| 5,740,379 | A | 4/1998 | Hartwig |
| 5,761,146 | A | 6/1998 | Yoo et al. |
| 5,771,199 | A | 6/1998 | Lee |
| 5,802,006 | A | 9/1998 | Ohta |
| 5,806,070 | A | 9/1998 | Norman et al. |
| 5,809,070 | A | 9/1998 | Krishnan et al. |
| 5,818,785 | A | 10/1998 | Ohshima |
| 5,828,899 | A | 10/1998 | Richard et al. |
| 5,835,935 | A | 11/1998 | Estakhri et al. |
| 5,859,809 | A | 1/1999 | Kim |
| 5,872,994 | A | 2/1999 | Akiyama et al. |
| 5,937,425 | A | 8/1999 | Ban |
| 5,941,974 | A | 8/1999 | Babin |
| 5,954,804 | A | 9/1999 | Farmwald |
| 5,959,930 | A | 9/1999 | Sakurai |
| 5,995,417 | A | 11/1999 | Chen et al. |
| 6,002,638 | A | 12/1999 | John |
| 6,009,479 | A | 12/1999 | Jeffries |
| 6,085,290 | A | 7/2000 | Smith et al. |
| 6,091,660 | A | 7/2000 | Sasaki et al. |
| 6,107,658 | A | 8/2000 | Itoh et al. |
| 6,144,576 | A | 11/2000 | Leddige et al. |
| 6,148,364 | A | 11/2000 | Srinivasan et al. |
| 6,178,135 | B1 | 1/2001 | Kang |
| 6,304,921 | B1 | 10/2001 | Rooke |
| 6,317,350 | B1 | 11/2001 | Pereira et al. |
| 6,317,352 | B1 | 11/2001 | Halbert et al. |
| 6,317,812 | B1 | 11/2001 | Lofgren et al. |
| 6,438,064 | B2 | 8/2002 | Ooishi |
| 6,442,098 | B1 | 8/2002 | Kengeri |
| 6,453,365 | B1 | 9/2002 | Habot |
| 6,535,948 | B1 | 3/2003 | Wheeler et al. |
| 6,567,904 | B1 | 5/2003 | Khandekar et al. |
| 6,584,303 | B1 | 6/2003 | Kingswood et al. |
| 6,594,183 | B1 | 7/2003 | Lofgren et al. |
| 6,601,199 | B1 | 7/2003 | Fukuda et al. |
| 6,611,466 | B2 | 8/2003 | Lee et al. |
| 6,658,509 | B1 | 12/2003 | Bonella et al. |
| 6,658,582 | B1 | 12/2003 | Han |
| 6,680,904 | B1 | 1/2004 | Kaplan et al. |
| 6,715,044 | B2 | 3/2004 | Lofgren et al. |
| 6,718,432 | B1 | 4/2004 | Srinivasan |
| 6,732,221 | B2 | 5/2004 | Ban |
| 6,741,486 | B2 * | 5/2004 | Sakui ............................ 365/51 |
| 6,754,807 | B1 | 6/2004 | Parthasarathy et al. |
| 6,763,426 | B1 | 7/2004 | James et al. |
| 6,807,103 | B2 | 10/2004 | Cavaleri et al. |
| 6,816,933 | B1 | 11/2004 | Andreas |
| 6,850,443 | B2 | 2/2005 | Lofgren et al. |
| 6,853,557 | B1 | 2/2005 | Haba et al. |
| 6,853,573 | B2 | 2/2005 | Kim et al. |
| 6,928,501 | B2 * | 8/2005 | Andreas et al. ............... 710/110 |
| 6,944,697 | B2 | 9/2005 | Andreas |
| 6,950,325 | B1 | 9/2005 | Chen |
| 6,967,874 | B2 | 11/2005 | Hosono |
| 6,996,644 | B2 | 2/2006 | Schoch et al. |
| 7,032,039 | B2 | 4/2006 | DeCaro |
| 7,043,630 | B1 | 5/2006 | Xia |
| 7,073,022 | B2 | 7/2006 | El-Batal et al. |
| 7,161,842 | B2 | 1/2007 | Park |
| 2002/0188781 | A1 | 12/2002 | Schoch et al. |
| 2003/0074505 | A1 | 4/2003 | Andreas et al. |
| 2003/0128702 | A1 | 7/2003 | Satoh et al. |
| 2003/0221061 | A1 | 11/2003 | El-Batal et al. |
| 2004/0001380 | A1 | 1/2004 | Becca et al. |
| 2004/0019736 | A1 | 1/2004 | Kim et al. |
| 2004/0024960 | A1 | 2/2004 | King et al. |
| 2004/0039854 | A1 | 2/2004 | Estakhri et al. |
| 2004/0148482 | A1 * | 7/2004 | Grundy et al. ............... 711/167 |
| 2004/0199721 | A1 | 10/2004 | Chen |
| 2004/0230738 | A1 | 11/2004 | Lim et al. |
| 2004/0256638 | A1 | 12/2004 | Perego et al. |
| 2005/0120136 | A1 | 6/2005 | Park et al. |
| 2005/0160218 | A1 | 7/2005 | See et al. |
| 2005/0213421 | A1 | 9/2005 | Polizzi et al. |
| 2006/0031593 | A1 | 2/2006 | Sinclair |

OTHER PUBLICATIONS

Craig L. King, Ezana Haile, Microchip Technology Inc., "Communicating with Daisy Chained MCP42XXX Digital Potentiometers", 2001, pp. 1-8.

PCT Patent Application No. PCT/CA2007/002173 International Search Report Dated Apr. 7, 2008.

PCT Patent Application No. PCT/CA2007/002171 International Search Report dated Mar. 17, 2008.

PCT Patent Application No. PCT/CA2007/002193 International Search Report Dated Apr. 7, 2008.

PCT Patent Application No. PCT/CA2007/002182 International Search Report dated Mar. 18, 2008.

PCT Patent Application No. PCT/CA2007/002147 Written Opinion dated Mar. 10, 2008.

Samsung Electronics Co. Ltd, "256M ×8 Bit / 128 M ×16 Bit / 512M ×8 Bit NAND Flash Memory", K9K4G08U1M, May 6, 2005, pp. 1-43.

Toshiba, "2GBIT (256M ×8 Bits) CMOS NAND E2PROM", TH58NVG1S3AFT05, May 19, 2003, pp. 1-32.

Amtel Corp., "High Speed Small Sectored SPI Flash Memory", pp. 1-22, 2006.

64 Megabit CMOS 3.0 Volt Flash Memory with 50MHz SPI, Spansion, 2006, pp. 1-22.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and ×2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics, "DDR2 Fully Buffered DIMM 240pin FBDIMMS based on 512Mb C-die" Rev. 1.3, Sep. 2006, pp. 1-32, Sep. 2006.

"HyperTransport TM I/O Link Specification", Revision 3.00, Document No. HTC20051222-0046-0008, Hypertransport Technology Consortium, pp. 1-428, Apr. 2006.

"8-megabit 2.5-volt Only or 2.7-volt Only DataFlash®," Technical Specification, Atmel, Rev. 2225H-DFLSH (2004).

Samsung Electronics, "K9XXG08UXM Preliminary Flash Memory," Technical Specification, Samsung Electronics.

"1024K12C™ CMOS Serial EEPROM," Technical Specification, Microchip Technology Inc., (2006).

"The I2C-Bus Specification," Version 2.1, Philips Semiconductors, Jan. 2000.

"16 Mbit LPC Serial Flash," Preliminary Specification, Silicon Storage Technology Inc., (2006).

"16 Mbit SPI Serial Flash," Preliminary Specification, Silicon Storage Technology Inc., (2005).

"2Mbit, Low Voltage, Serial Flash Memory with 40 Mhz SPI Bus Interface," Technical Specification, STMicroelectronics Group of Companies (2005).

"NAND Flash Applications Design Guide," Revision 1.0, Toshiba America Electronics Components, Inc., (Apr. 2003).

McVey, JM "Programmable Identification for I/O Device", IBM Technical Disclosure Bulletin, Aug. 1979.

\* cited by examiner

APPARATUS AND METHOD FOR PRODUCING DEVICE IDENTIFIERS FOR SERIALLY INTERCONNECTED DEVICES OF MIXED TYPE

CROSS REFERENCE TO RELATED APPLICATIONS

This application is a continuation-in-part of U.S. patent application Ser. No. No. 11/622,828 entitled "Apparatus and Method for Producing IDs for Interconnected Devices of Mixed Type" filed Jan. 12, 2007 with the benefit of priority from U.S. Provisional Application No. 60/870,892 entitled "IP Production for Serially Interconnected Devices of Varying Type" filed Dec. 20, 2006, the disclosures of which are expressly incorporated herein by reference in their entirety.

FIELD OF THE INVENTION

The present invention relates generally to memory systems. More particularly, the present invention relates to an apparatus and a method for producing device identifiers for a serial interconnection of devices of mixed type.

BACKGROUND OF THE INVENTION

Current consumer electronic equipment uses memory devices. For example, mobile electronic devices such as digital cameras, portable digital assistants, portable audio/video players and mobile terminals continue to require mass storage memories, preferably non-volatile memory with ever increasing capacities and speed capabilities. Non-volatile memory and hard disk drives are preferred since data is retained in the absence of power, thus extending battery life.

While existing memory devices operate at speeds sufficient for many current consumer electronic devices, such memory devices may not be adequate for use in future electronic devices and other devices where high data rates are desired. For example, a mobile multimedia device that records high definition moving pictures is likely to require a memory module with a greater programming throughput than one with current memory technology. While such a solution appears to be straightforward, there is a problem with signal quality at such high frequencies, which sets a practical limitation on the operating frequency of the memory. The memory communicates with other components using a set of parallel input/output (I/O) pins, the number of which depends on the desired configuration. The I/O pins receive command instructions and input data and provide output data. This is commonly known as a parallel interface. High speed operation may cause deleterious communication effects such as, for example, cross-talk, signal skew and signal attenuation, which can degrade signal quality.

In order to incorporate higher density and faster operation on the system boards, there are two design techniques: serial interconnection and multi-drop configurations. These design techniques may be used to overcome the density issue that determines the cost and operating efficiency of memory swapping between a hard disk and a memory system. However, multi-drop configurations have shortcomings relative to a serial interconnection of memory systems. For example, if the number of multi-drop memory systems increases, as a result of loading effect of each pin, delay time also increases so that the total performance of multi-drop is degraded by the multi-drop connection caused by the wire resistor-capacitor loading and the pin capacitance of the memory device. A serial link in a device such as a memory device may utilize a single pin input that receives all addresses, commands, and data serially. The serial link may provide a serial interconnection configuration to control command bits, address bits, and data bits effectively through the serial interconnection. By providing a serial interconnection configuration, a device identifier (ID) number is assigned to each of the connected devices.

SUMMARY OF THE INVENTION

In accordance with one aspect of the present invention, there is provided a system comprising: a serial interconnection configuration of N memory devices of mixed type, N being an integer greater than one, each of the devices having serial input and output connections, the serial input and output connections of one device being coupled to the serial output connection of a previous device and the serial input connection of a next device, respectively. Each of the devices includes: a determiner for determining a device type (DT) of the device to provide a determination result, and a device identifier producer for producing a device identifier (ID) in response to the determination result. The system also includes a controller for providing a serial input signal and a control signal to a first device of the serial interconnection configuration. The serial input signal contains information on an ID and a DT. The serial input signal and the control signal are propagated with or without being altered through the N devices. A propagated input signal is inputted to one device and outputted therefrom as a serial output signal. The N-th device provides the propagated serial output signal and the propagated control signal to the controller.

For example, the device further includes a device type provider for providing device type information (DTI) of the device as a reference DT. The determiner performs a device type determination of the device based on a received DT and the reference DT. In response to the determination result.

Advantageously, the ID producer includes a calculator for performing a calculation of the received ID with a pre-defined value (e.g., +1). If there is a device type match between the received DT and the referenced DT, in response to a match result, an incremented ID will be produced as a new ID. If there is no match, no new ID will be produced with the result that the ID production is skipped. From the N-th device, a serial output signal including an ID produced by a device that matches the DT.

For example, the controller includes a signal sender for sending the serial input signal and the control signals; and a signal receiver for receiving the serial output signal and the propagated control signal from the N-th device. The signal receiver may include a recognizer for recognizing an ID contained in the serial output signal in response to the propagated control signal provided by the N-th device. Thus, the recognizer recognizes the ID produced by a device that matches the DT. The signal receiver may further include a data calculator for calculating the number of the devices in response to the recognized ID. The data calculator can calculate the number of the devices in the serial interconnection configuration match the DT, in response to the ID received from the N-th device.

In accordance with another aspect, there is provided a method for assigning a device identifier for N memory devices of mixed type in a serial interconnection configuration, N being an integer greater than one, a first device having a serial input connection coupled to a serial output connection of a previous device, a second device having a serial input connection coupled to a serial output connection of the first device. The method includes: providing a serial input signal and a control signal to the first device of the serial interconnection configuration, the serial input signal containing information on a device identifier (ID) and a device type (DT), the serial input signal and the control signal being propagated with or without being altered through the N devices; determining the DT of each device from the DT contained in the serial input signal; and recognizing an ID in response to the propagated serial input and control signals from the N-th device.

For example, the step of recognizing includes: receiving the ID from the N-th device; and performing the recognition of the number of the devices from the received ID.

In accordance with a further aspect, there is provided a system comprising a plurality of memory devices of mixed type in a serial interconnection configuration, a first device having a serial input connection coupled to a serial output connection of a previous device, a second device having a serial input connection coupled to a serial output connection of the first device. At least one of the devices includes: a receiver for receiving a device identifier (ID) and a device type (DT) through the serial input connection of the device; a determiner for determining the DT of the device from the received DT or whether the DT of the device contains a pre-defined code corresponding to one including all device types; and an ID producer for producing an ID in response to the determination result.

In accordance with yet a further aspect, there is provided an apparatus for producing a device identifier at a first device coupled to a second device in a serial interconnection configuration, the first device having a serial input connection coupled to a serial output connection of a previous device in the serial interconnection configuration, the second device having a serial input connection coupled to a serial output connection of the first device, the devices having different types. The apparatus includes: a receiver for receiving a device identifier (ID) and a device type (DT) through the serial input connection of the device; a determiner for performing: first determination of whether the DT of the device contains a pre-defined code corresponding to one including all device types; and second determination of whether the DT of the device based on the received DT; and an ID producer for producing an ID in response to first and second determination results.

In accordance with yet a further aspect, there is provided a method for assigning a device identifier for a plurality of memory devices of mixed type in a serial interconnection configuration, a first device having a serial input connection coupled to a serial output connection of a previous device, a second device having a serial input connection coupled to a serial output connection of the first device, the method being adopted to at least one of the devices. The method includes: receiving a device identifier (ID) and a device type (DT) through the serial input connection of the first device; performing: first determination of whether the DT of the device contains a pre-defined code corresponding to one including all device types; and second determination of whether the DT of the device based on the received DT; and producing a device ID in response to first and second determination results.

For example, the step of performing comprises: performing the first determination whether the received DT of the device matches the pre-defined code; and performing the second determination whether the received DT matches a reference DT assigned to the device. The step of performing the first determination comprises: providing a pre-defined value as the pre-defined code that corresponds to any of the types of devices. The step of performing the second determination comprises: providing the reference DT programmably.

In accordance with yet a further aspect, there is provided a method for assigning a device identifier for a plurality of memory devices of mixed type in a serial interconnection configuration, a first device having a serial input connection coupled to a serial output connection of a previous device, a second device having a serial input connection coupled to a serial output connection of the first device. The method comprising: providing a device type (DT) to the devices; holding the provided DT at each of the devices; determining whether the DT matches a reference DT assigned to each of the devices; determining whether the DT of the device contains a pre-defined code corresponding to one including all device types; providing a device identifier (ID) to one of the device in the serial interconnection configuration, through the serial input connection of the that device; at the device wherein the ID is provided, conducting an ID assignment in response to a determination result at that device.

In accordance with an embodiment, there is provided a plurality of memory devices of mixed type (e.g., DRAMs, SRAMs, MRAMs and NAND-, NOR- and AND-type Flash memories) that are serially interconnected. Each device has device type information. A memory controller sends a specific device type (DT) and a device identifier (ID) to the serial interconnection. Each of the device determines whether the fed DT matches its DT. If there is a match, a new ID will be generated and transferred to another device. The ID is latched in an ID register of the device. If there is no match, neither ID generation nor ID registration is performed in the device. Thus, an ID generation skip function is provided. Such a device type match determination and ID generation or skip are performed in all devices of the serial interconnection. Sequential IDs are generated by the "matched" devices.

In accordance with another embodiment, a memory controller can recognize an ID received from the last device of the serial interconnection. The memory controller may send different device types separately and sequentially to the interconnected devices. With reference to each of the device types, sequential IDs are generated. If the memory controller sends a "don't care" code to the interconnected devices for the device type match search, sequential IDs are generated regardless of the device types and the total number of the interconnected devices is recognized.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached figures, wherein.

DETAILED DESCRIPTION

Figure 1A:
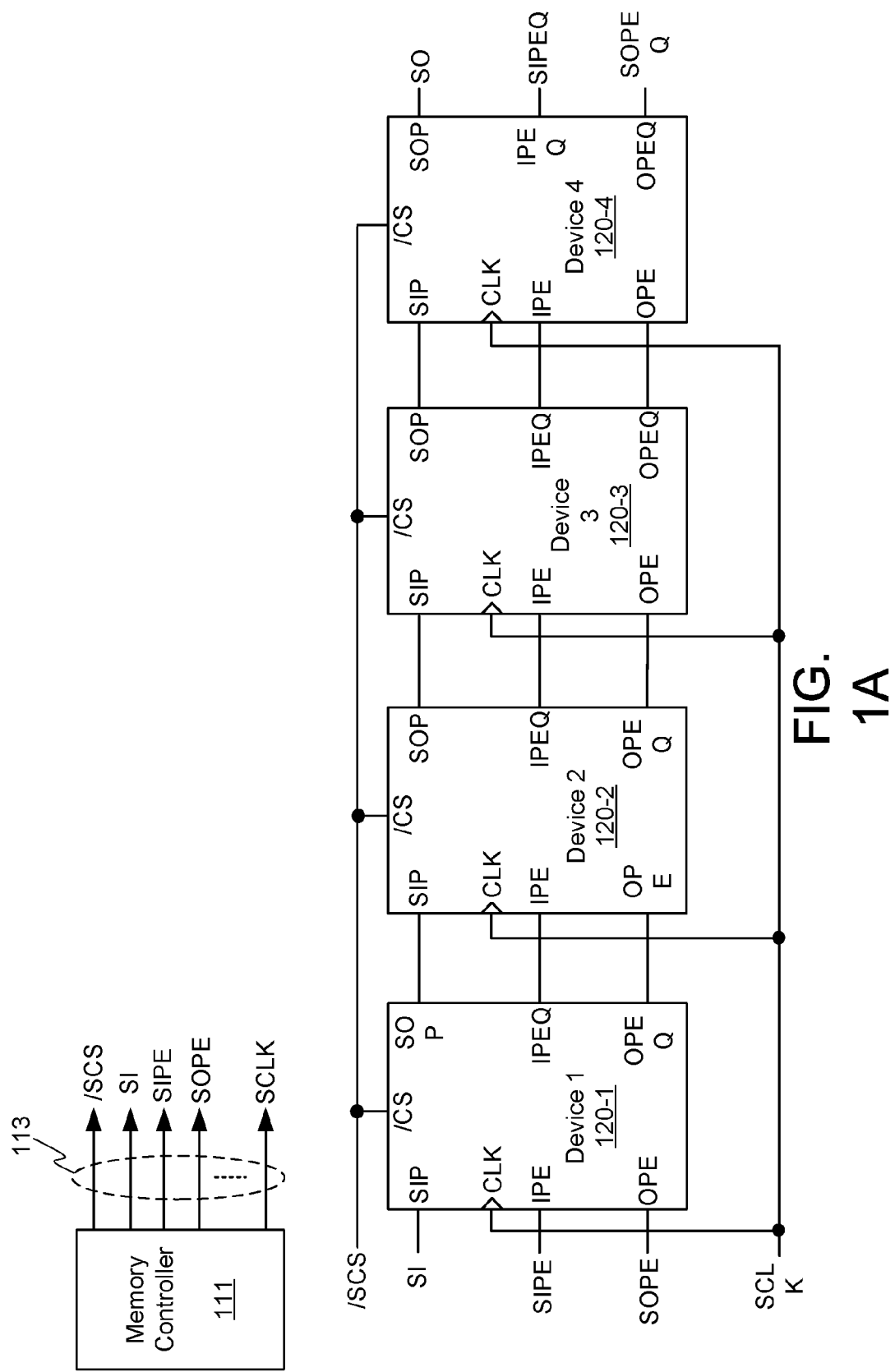
FIG. 1A is a block diagram illustrating memory devices employing a serial interconnection implementation to which embodiments of the present invention are applied.

In the following detailed description of embodiments of the present invention, reference is made to the accompanying drawings which form a part hereof, and in which is shown by way of illustration of specific embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Generally, the present invention provides an apparatus and a method for producing device identifiers for a serial Interconnection of devices.

Some memory subsystems employ multiple memory devices (e.g., Flash memory devices) with serial interfaces. Here, the command string may be fed to all of the devices even though the command may only be performed on one of the devices. To select the device on which the command is to be performed, the command string may contain a device identifier (ID) that identifies the memory device to which the command is directed. Each device receiving the command string compares the ID contained in the command string to an ID associated with the device. If the two match, the device assumes that the command is directed to itself and performs the command.

A problem with the above-described arrangement involves establishing an ID for each device. One technique that may be used to establish an ID for a device is to hardwire an internal unique ID into the device. One drawback with this approach, however, is that if large numbers of devices are used, the size of the ID may have to be quite long in order to ensure that each device contains a unique ID. Managing a large-sized device ID may add significant complexity to the device, which in turn may increase the cost of producing the device. In addition, reclaiming device IDs that are associated with devices that are no longer in use may further add to the complexity of this scheme.

Another approach to assigning IDs to devices involves externally hardwiring an ID for each device. Here, the ID may be specified by wiring various pins on the device to certain states to establish an ID for the device. The device reads the wired state of the pins and establishes its ID from the read state. One drawback with this approach, however, is that external wiring is needed to assign the ID for each device. This may add to the complexity of, e.g., printed circuit boards (PCBs) that hold the memory devices. Another drawback with this approach is that it may require pins to be dedicated for the assignment of the ID. This may consume precious resources that may be otherwise better used. In addition, dedicating pins for the assignment of the ID may require a greater footprint for the device than if pins were not used to assign the ID.

At least some embodiments of the present invention address at least some of these shortcomings. At least some example embodiments automatically establish an ID for a device, for example, in a serial interconnection arrangement, in a manner that does not require special internal or external hardwiring of the ID. According to one aspect of the techniques described herein, an input signal is transmitted through a serial interconnection to a first device in an arrangement including multiple devices (e.g., a serial interconnection configuration) using inputs that are also used by the first device to input other information to the device (e.g., data, commands, control signals). A generator generates a device ID in response to the input signal. A transferor then transfers an output signal associated with the ID to a second memory device through a serial output of the first device. The serial output may also be used by the first device to output other information (e.g., signals, data) to other devices in the arrangement.

In an embodiment of the techniques described herein, a write ID operation is initiated at a device in a serial interconnection arrangement to cause the device to establish an ID. A first device receives a first value by acquiring the state of one or more inputs of the first device. The first device then establishes an ID from the first value, which may include placing the first value in storage (e.g., a device ID register) associated with the device. The first device generates a second value from the acquired state of the inputs. The first device outputs the second value from the first device via outputs of the first device to a second device in the serial interconnection. The second device inputs the value output by the first device and repeats this process to establish an ID.

Embodiments of the present invention will now be described in conjunction with a MISL (multiple independent serial links). A MISL product is an item in a memory (e.g., Flash memory) area that enhances the operation performance without changes to the core structure. It is an innovation of interface and data processing of memories. Due to the restriction of memory cell structure and limited performance of the cell, the enhancement of memory (e.g., Flash) performance has been a key issue to be resolved in the memory industry. Most products including Flash memory core have parallel ports that latch simultaneously all address bits, all command bits, and all data bits, respectively. A serial link utilizes a single pin input for receiving all address, command, and data serially. Details of MISL are described in U.S. patent application Ser. No. 11/324,023 filed Dec. 30, 2005; U.S. Provisional Patent Application No. 60/787,710 entitled "Serial interconnection of Memory Devices" filed Mar. 28, 2006; and U.S. Provisional Patent Application No. 60/802,645 entitled "Serial interconnection of Memory Devices" filed May 23, 2006, the contents of which are entirely incorporated herein by reference.

FIG. 1A shows an exemplary memory system including a plurality of single port devices configured in a serial interconnection arrangement having inputs and outputs for various signals, together with a memory controller. In this example, the system includes four memory devices 1, 2, 3 and 4 (120-1, 120-2, 120-3 and 120-4). Each of the interconnected devices 120-1-120-4 has the same structure. A memory controller 111 provides a group of signals 113 containing chip select /SCS, serial input SI, input port enable SIPE, output port enable SOPE, clock SCLK, and other control and data information that are provided to the devices.

Figure 1B:
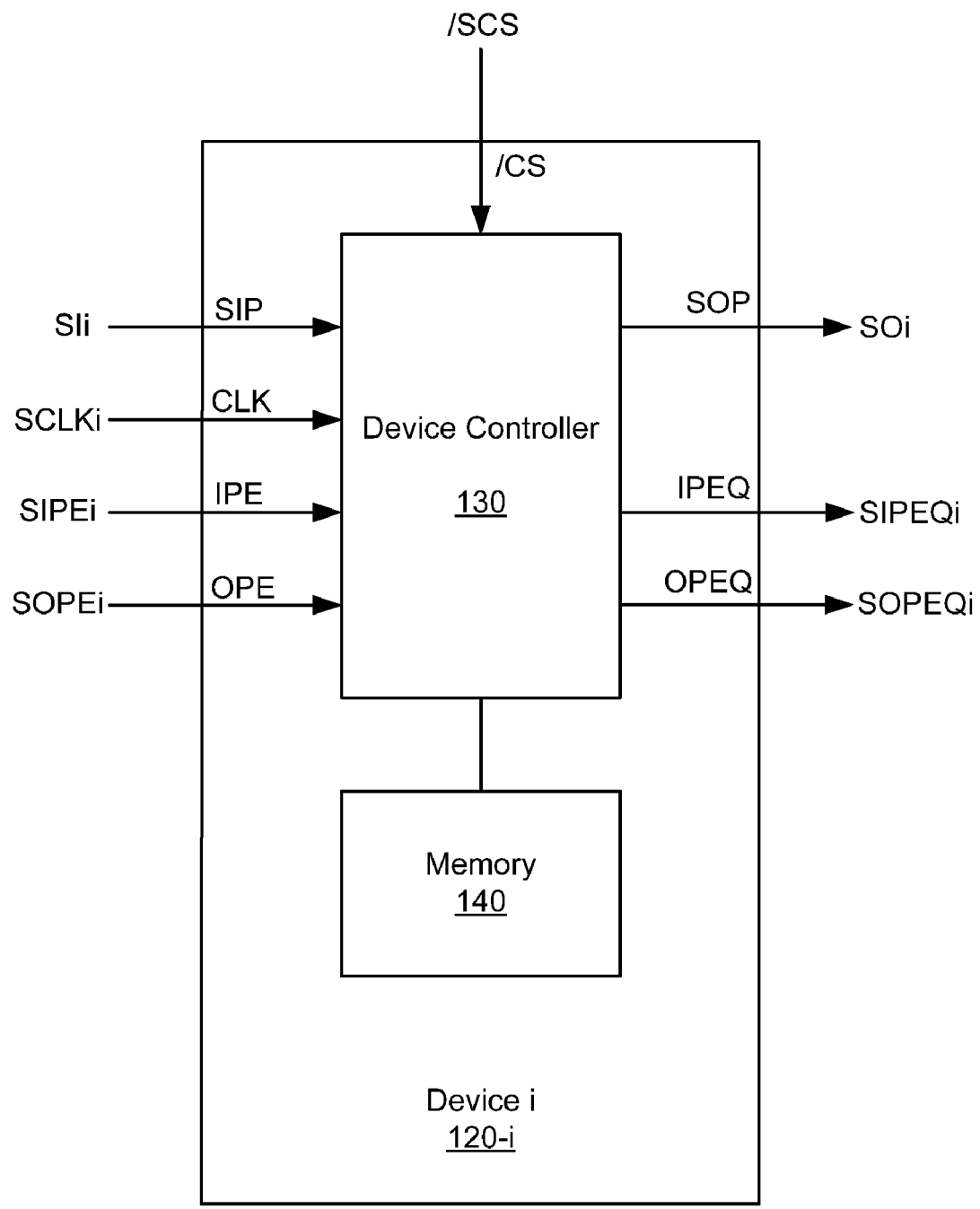
FIG. 1B is a block diagram illustrating one of the devices shown in FIG. 1A.

FIG. 1B shows a device 120-i representing any one of the devices 120-1-120-4 shown in FIG. 1A. The device 120-i includes a device controller 130 and a memory 140 including, for example, random access memories or Flash memories. For example, the random access memories are dynamic random access memories (DRAMs), static random access memories (SRAMs), magnetoresistive random access memories (MRAMs) and the Flash memories are NAND-type, NOR-type, AND-type, and other types of Flash memories. The device 120-i has a serial input port (SIP) connection, a serial output port (SOP) connection, a chip select input (/CS), and a clock input (CLK). The SIP connection is used to transfer information (e.g., command, address and data information) into the device 120-i. The SOP connection is used to transfer information from the device 120-i. The clock input CLK receives a clock signal SCLK. The chip select input /CS receives a chip select signal /SCS, which enables operations at all devices simultaneously. The device controller 130 performs various control and process functions with access to the memory 140 in response to the input signals (e.g., SI, SIPE, SOPE, SCLK), and provides serial output data to a next device 120(i+1).

Referring to FIGS. 1A and 1B, the SIP and the SOP are connected between devices in the serial interconnection configuration such that the SOP of a previous device 120(i−1) in the serial interconnection is coupled to the SIP of the device 120-i. For example, the SOP of device 1, 120-1, is coupled to the SIP of device 2, 120-2. The clock input CLK of each of four devices 120-1-120-4 is fed with the clock signal SCLK from the memory controller 111. The clock signal SCLK is distributed to all devices via a common link. As will be described further below, the clock signal SCLK is, for example, used to latch information input to the device 120-i at various registers contained therein. The /CS is a conventional chip select input for selecting the device. The /CS is coupled to a common link which enables the chip select signal /SCS to be asserted to all of the devices 120-1-120-4 concurrently and consequently selects all of the devices.

In addition, the device 120-i has an input port enable input IPE, an output port enable input OPE, an input port enable output IPEQ and an output port enable output OPEQ. The IPE is used to input the input port enable signal SIPEi to the device 120-$i$. The signal SIPEi is used by the device to enable the SIP such that when the IPE is asserted, information is serially input to the device 120-$i$ via the SIP. Likewise, the OPE is used to input the output port enable signal SOPEi to the device 120-$i$. The signal SOPEi is used by the device to enable the SOP such that when the OPE is asserted, information is serially output from the device 120-$i$ via the SOP. The IPEQ and the OPEQ outputs are outputs that output the signals SIPEQi and SOPEQi, respectively, from the device 120-$i$. The /CS and the CLK inputs are coupled to separate links which distribute the chip select signal /SCS and the clock signal SCLK, respectively, to four devices 120-1-120-4, as described above.

The SIP and the SOP are coupled from the previous device 120($i$−1) to the next device 120($i$+1) in the serial interconnection arrangement, as described above. Moreover, the IPEQ and the OPEQ of the previous device 120($i$−1) are coupled to the IPE and the OPE, respectively, of the present device 120-$i$ in the serial interconnection. This arrangement allows the signals SIPE and SOPE to be transferred from one device to the next (e.g., device 1, 120-1, to device 2, 120-2) in the serial interconnection configuration.

Figure 2A:
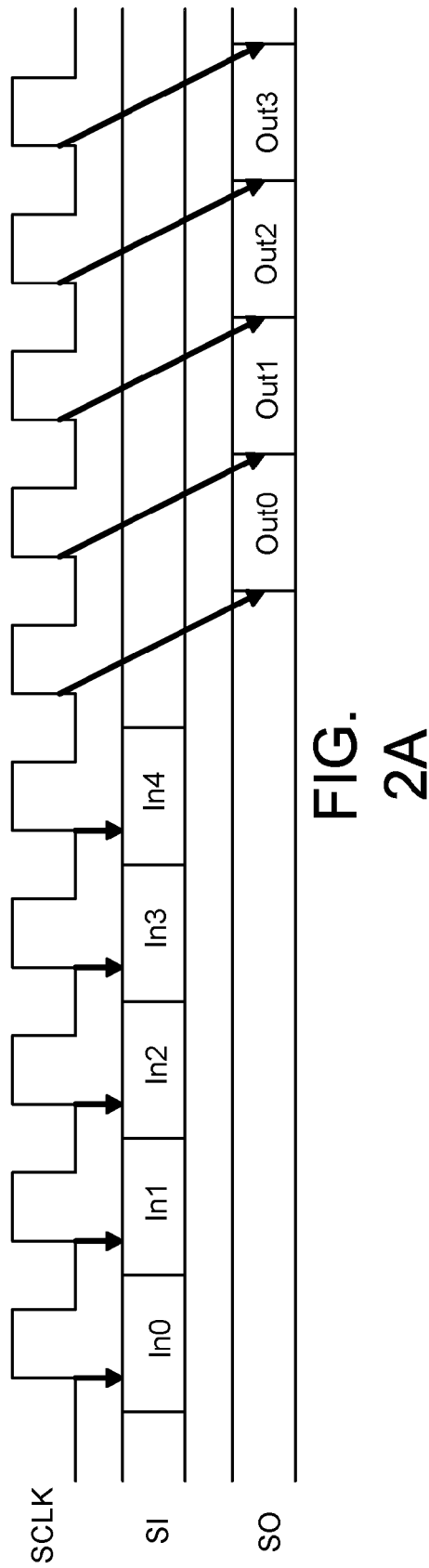
FIG. 2A is a timing diagram of single data rate operation of memory devices.
Figure 2B:
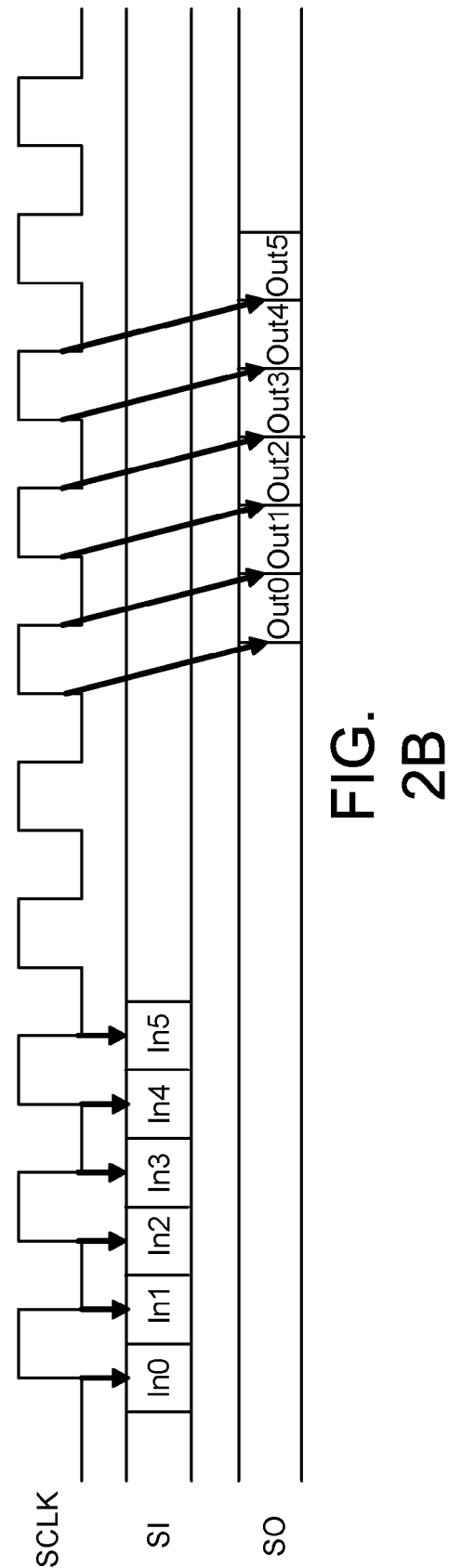
FIG. 2B is a timing diagram of double data rate operation of memory devices.

Information transmitted to the devices 120-1-120-4 can be latched at different times of the clock signal SCLK fed to the CLK. For example, in a single data rate (SDR) implementation, information input to the device 120-$i$ at the SIP can be latched at either the rising or falling edge of the clock signal SCLK. Alternatively, in a double data rate (DDR) implementation, both the rising and falling edges of the clock signal SCLK can be used to latch information input at the SIP. FIG. 2A shows a relative timing sequence for an SDR operation of memory devices. FIG. 2B shows a relative timing sequence for a DDR operation of memory devices. Each of FIGS. 2A and 2B shows operations in one port. In each of the SDR and DDR operations, the chip select signal is commonly connected to enable all devices at the same time, so that input data of the first device is propagated to the last device with or without being altered.

Figure 3A:
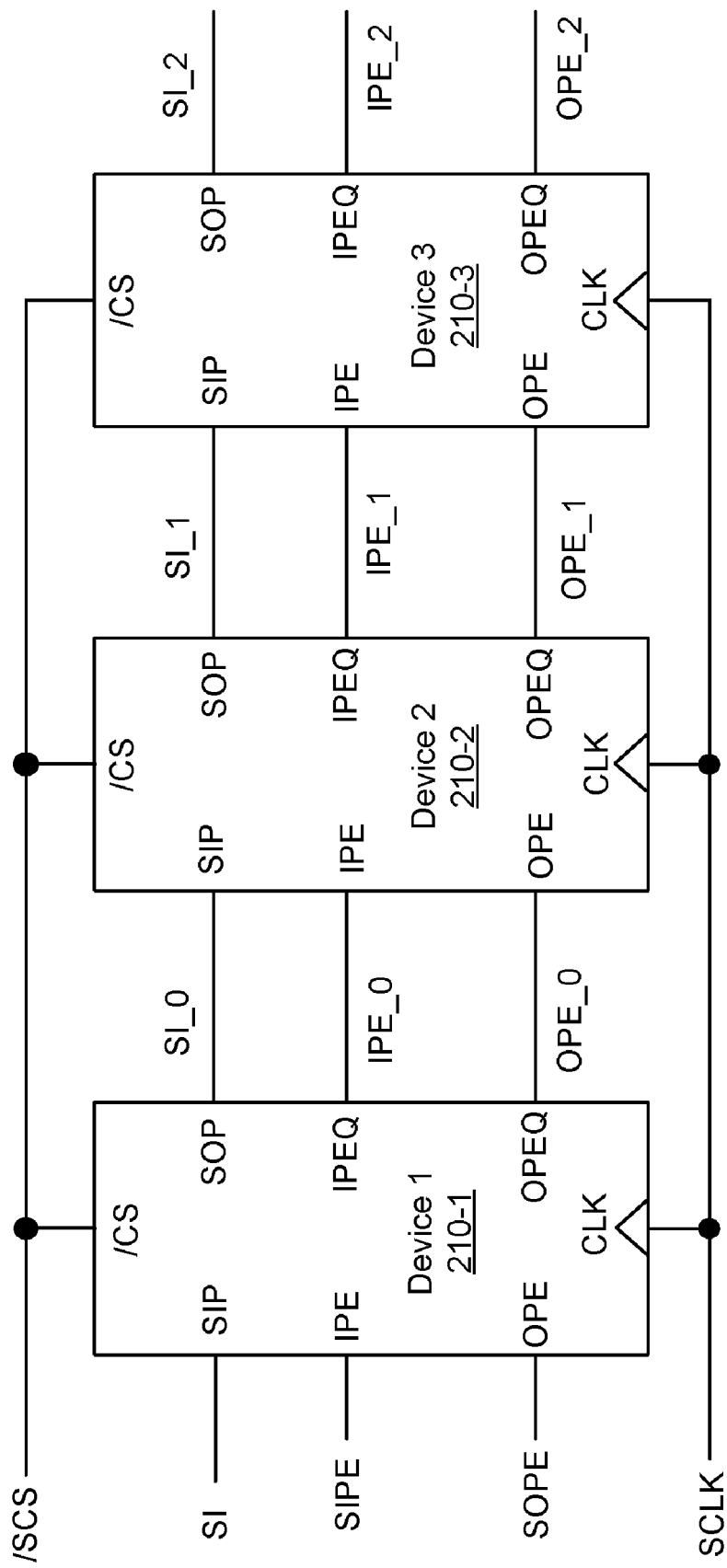
FIG. 3A is a block diagram illustrating a serial interconnection of three memory devices.
Figure 3B:
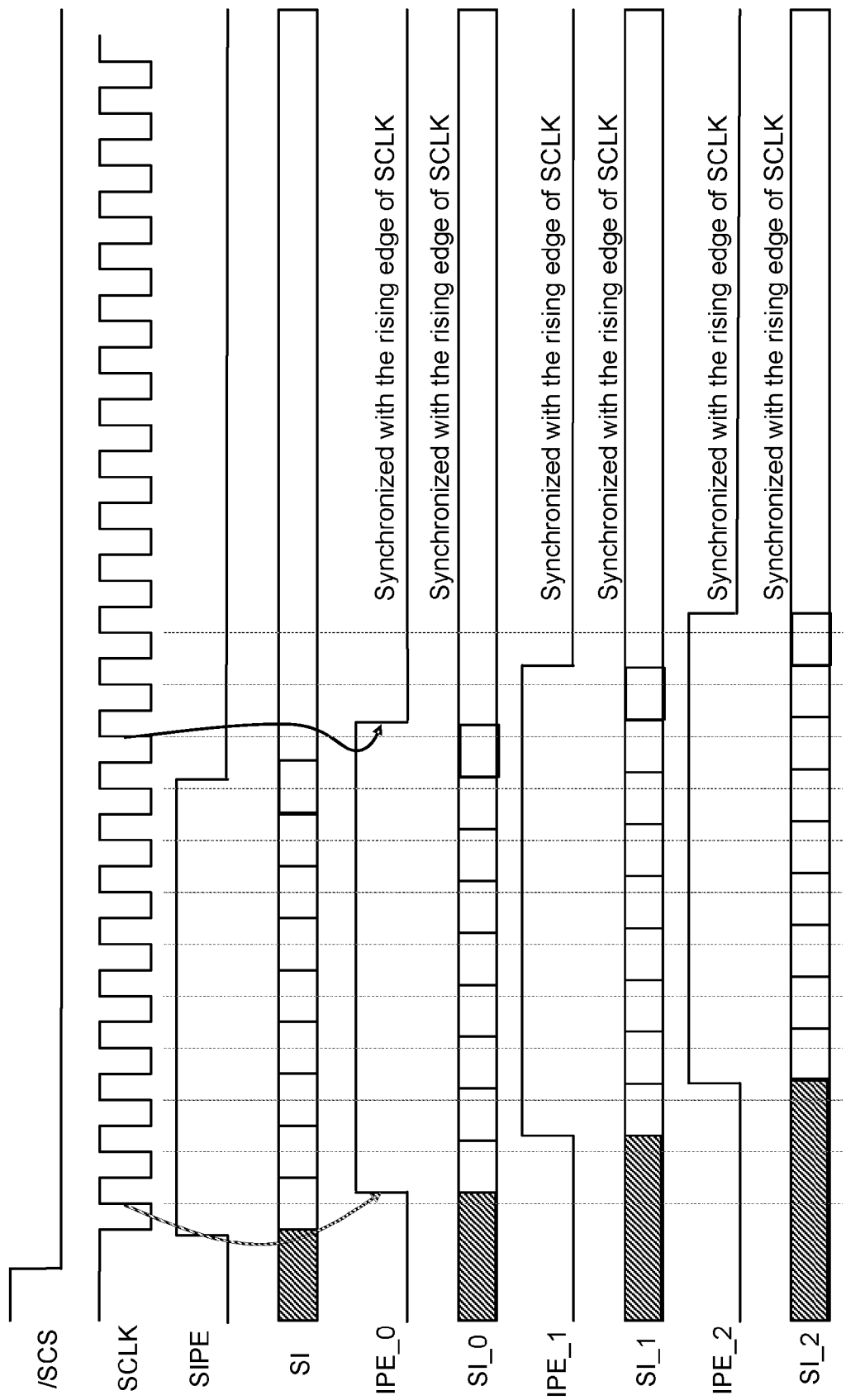
FIG. 3B is a timing diagram illustrating communication between devices shown in FIG. 3A.

FIG. 3A shows three devices 210-1-210-3 configured in a serial interconnection arrangement. FIG. 3B shows signals transferred between the devices 210-1-210-3 shown in FIG. 3A. Referring to FIGS. 3A and 3B, the chip select signal /SCS is first asserted to select the devices. Information is transmitted to device 1, 210-1, in the serial interconnection by asserting the IPE and clocking data into device 210-1 on successive rising edges of the clock signal SCLK. The input port enable signal SIPE is propagated through device 1, 210-1, to device 2, 210-2, in less than a cycle, as shown by the signal IPE_0. Similarly, the output port enable signal SOPE is propagated through device 1 to device 2. The propagation time interval may be varied depending on the system requirements, e.g., a half cycle time interval or a time interval based on a proportion of cycles. The propagation enables information to be clocked from the SOP of device 1, 210-1, to the SIP of device 2, 210-2, at one cycle after the information is clocked into device 1, 210-1. This process is repeated for successive devices in the serial interconnection configuration. For example, information is inputted to device 3, 210-3, in the serial interconnection at the third rising edge of the clock signal SCLK from the latch point of the data at device 1. The control signals SIPE and SOPE are synchronized with the rising edge of the clock signal SCLK in order to ensure a proper setup time for these signals at the next device in the serial interconnection.

Figure 4A:
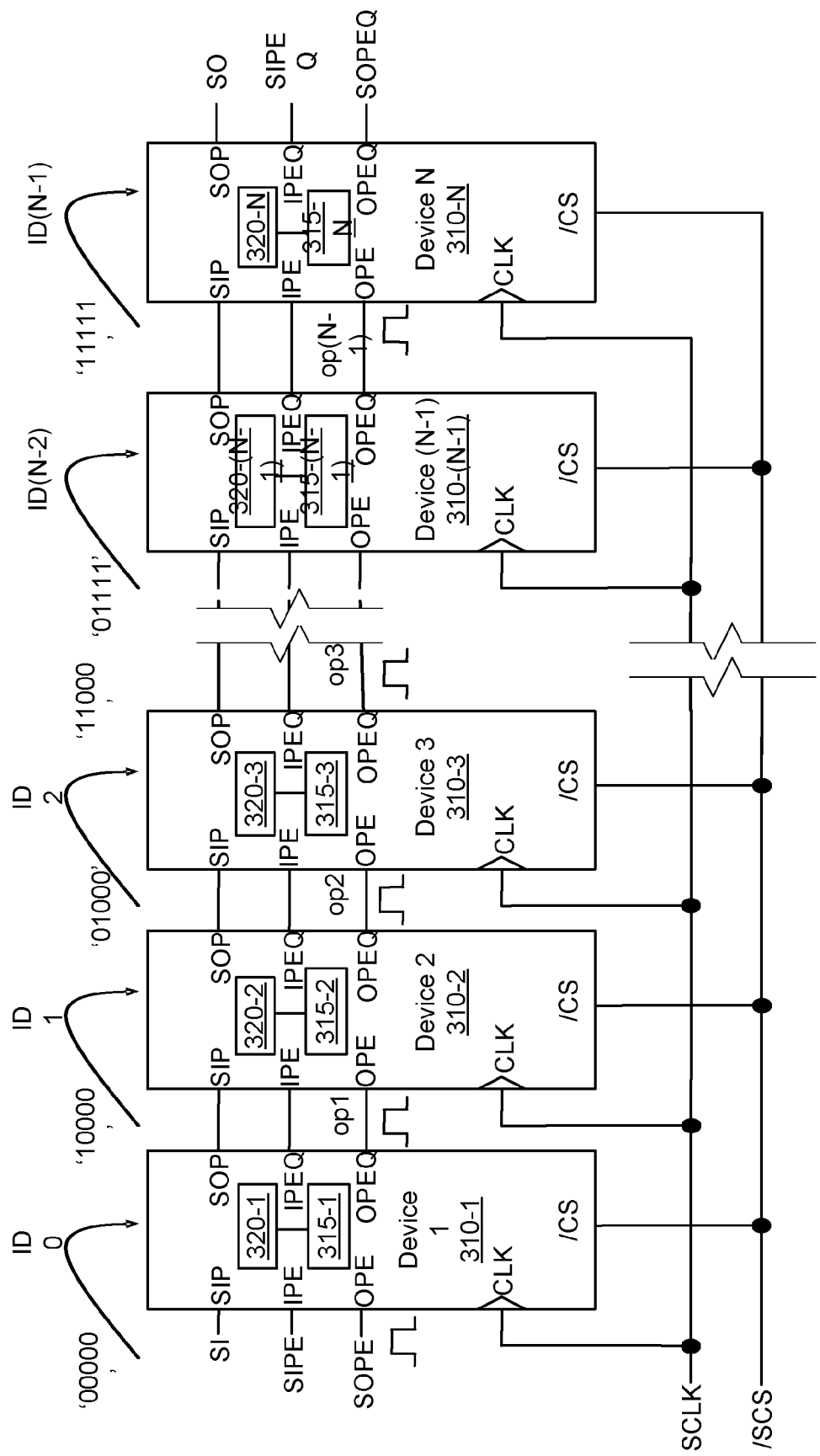
FIG. 4A is a block diagram illustrating a plurality of devices in a serial interconnection operating to establish a device identifier (ID) at each device.

FIG. 4A shows a plurality of devices in a serial interconnection configuration. Referring to FIG. 4A, N memory devices 310-1-310-N are connected in a single link arrangement and serially interconnected. N devices 310-1-310-N include device controllers 320-1-320-N and memories 315-1-315-N, respectively. A device 310-$i$ representing any one of the devices 310-1-310-N is shown in FIG. 4B.

Figure 4B:
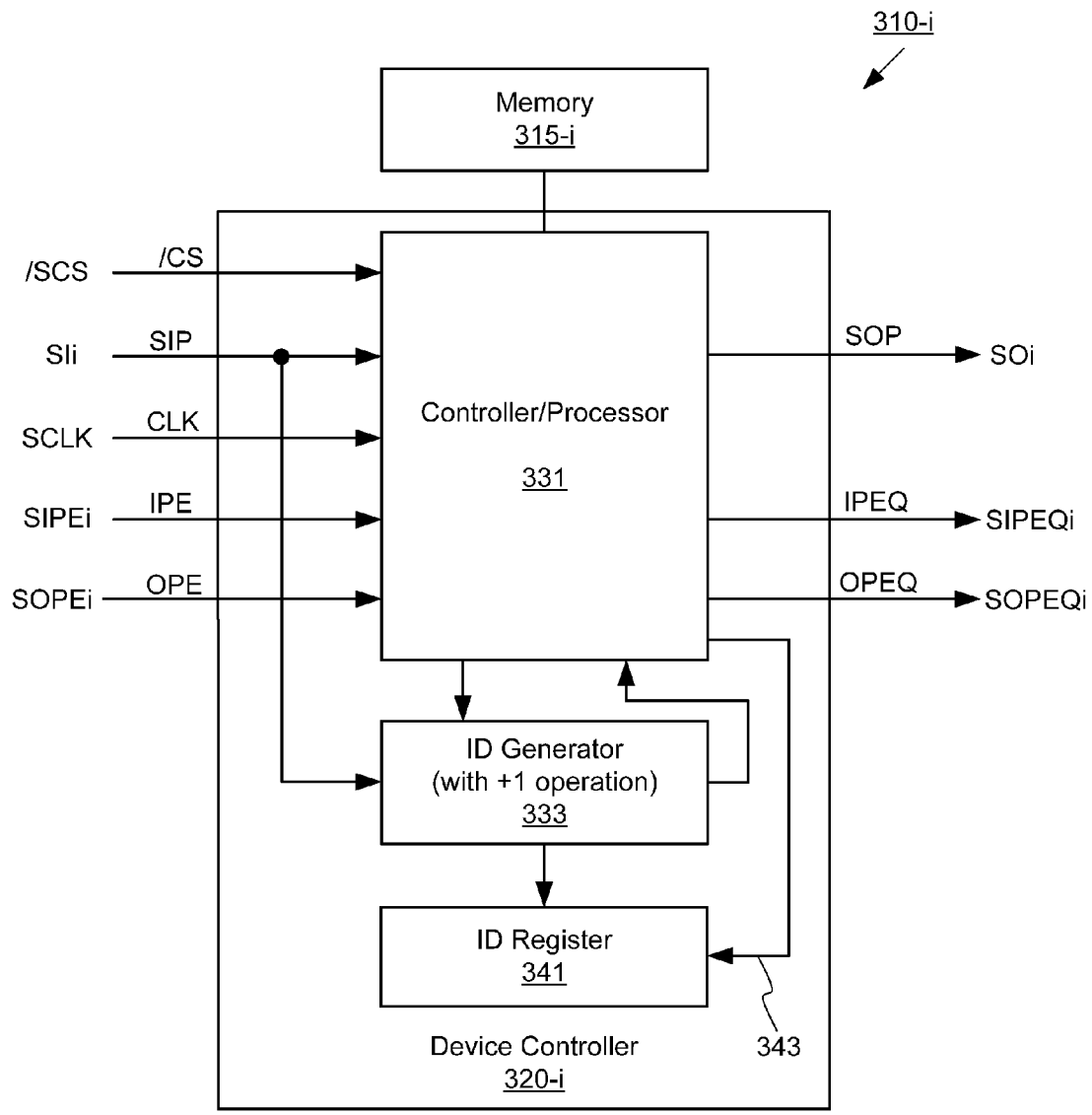
FIG. 4B is a block diagram illustrating one of the devices shown in FIG. 4A.

Referring to FIGS. 4A and 4B, a device controller 320-$i$ of the device 310-$i$ is connected to a corresponding memory 315-$i$. The device controller 320-$i$ includes a controller/processor 331, an ID generator 333 and an ID register 341. The serial input SIi to the SIP of the device 310-$i$ contains commands, a device identifier (ID), IDii, and other signal data. The controller/processor 331 receives the serial input SIi, the input port enable signal SIPEi, the output port enable signal SOPEi and performs control and data processing functions. The ID generator 333 is controlled by the controller/processor 331 and establishes an ID, ID($i$+1), for a next device 310($i$+1). In response to an ID write enable signal 343 provided by the controller/processor 331, the ID register 341 latches or registers the received ID, IDii, for the present device 310-$i$. The registered ID is stored until powered-off.

Figure 4C:
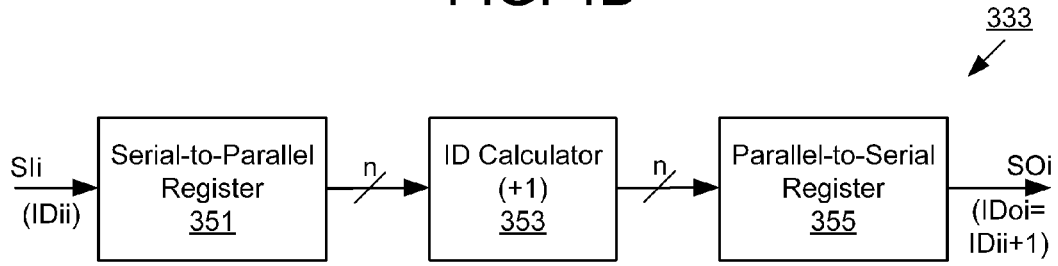
FIG. 4C is a block diagram illustrating an ID generator shown in FIG. 4B.

FIG. 4C shows an example of the ID generator 333 shown in FIG. 4B. Referring to FIG. 4C, the serial input SIi is provided to a serial-to-parallel register 351 of n-bits. The register 351 outputs n-bit IDii to an ID calculator 353 which in turn performs adding (+1) operation. An output signal of the calculator 353 contains a new ID of n-bits, IDii+1, which is provided to a parallel-to-serial register 355. The register 355 provides a serial bit ID, IDi+1, for the next device 310($i$+1).

Figure 4D:
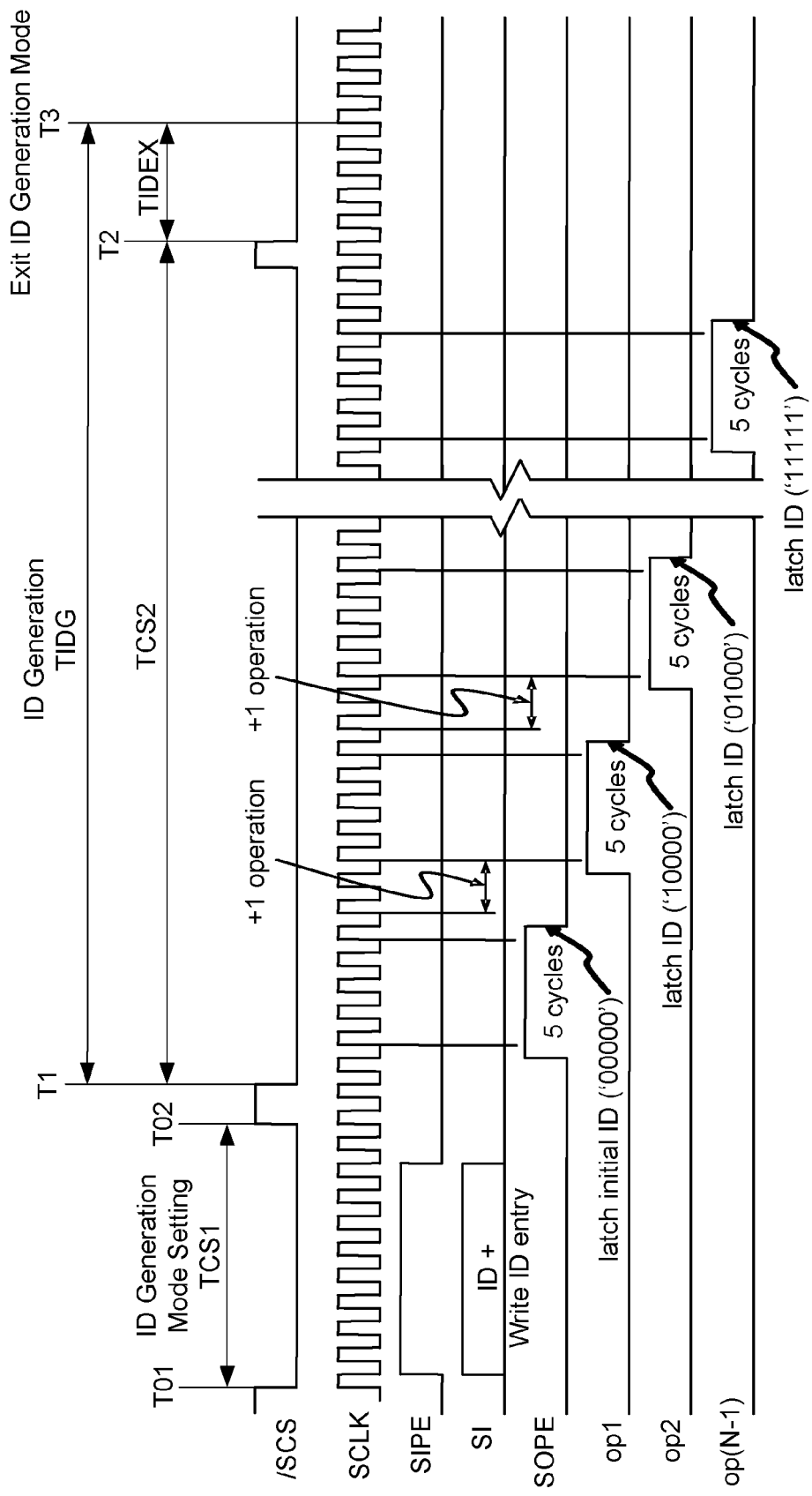
FIG. 4D is a timing diagram of signals transferred between the devices shown in FIG. 4A to establish each ID.

FIG. 4D shows signals transferred between the devices shown in FIG. 4A. This exemplary operation generates IDs in a serial interconnection of a plurality of devices. In the example serial interconnection shown in FIGS. 4A-4D, device logic at the IPE includes a function to catch a serial input stream based on the one-byte unit so that the OPE is chosen to latch a serial ID input stream after the /SCS signal is "low" again. In FIG. 4D, an ID generation mode setting time period TCS1 between times T01 and T02 is a time interval equivalent to pre-defined clock cycles corresponding to the ID bit length+eight cycles (command bit length)+a considerable number of serially interconnected devices. The commands include an "ID generation" command. The SI contains the ID (initial ID ('00000')) and a "write ID entry" command as an input stream that are caught by the IPE during the time period TCS1. TCS1 includes bit cycles of a total number of ID bits, e.g., five cycles. The ID bits are established by the size of an internal ID register. For example, if any device has a 12 bit-ID register, the OPE will hold the "high" state during 12 cycles. This means that for example, 4096 devices are connected physically with a serial interconnection arrangement without any pin limitation like the above mentioned implementation which makes use of existing pins to send the ID number parallelly and asynchronously. After the completion of the ID generation mode setting process, the ID generation operation starts at time T1 and ends with an expiration of time period TIDG. With an expiration of one chip select cycle TCS2 at time T2, the /SCS signal is toggled and with an expiration of time period TIDEX from time T2, the ID generation ends at time T3. The time period TIDEX between times T2 and T3 is pre-defined by any number of clock cycles depending upon the system (e.g., five clock cycles or five rising edges of the clock pulse after time T2).

Referring to FIGS. 4A-4D, the serial input SI contains information on the ID and the "write ID entry". For a signal transfer between the OPE and the OPEQ or op1 and op2, in a non-overlap section of time of more than two cycles should occur to avoid an operation contention caused by an ID increment and data transferring to an adjacent (or a next) device. After the OPE is asserted at each of device 310-1-310N, latched ID input data is stored in an ID register (e.g., the serial-to-parallel register 351 in FIG. 4C) of the device and an increment operation with this input is performed before asserting the OPEQ (e.g., by the ID calculator 353 shown in FIG. 4C). A function of the signal at the OPE is to determine the number of ID bits from 1 bit to the maximum number of defined bits of the ID register into each memory device. Because of this function, the signal corresponding to the ID should be transferred to the next device in order beginning with the least significant bit (LSB) and ending with the most significant bit (MSB). The IDs are shown in Table 1.

TABLE 1

| ID Number | ID Binary Code (LSB → MSB) |
| --- | --- |
| ID0 (=Initial ID) | 0000 |
| ID1 | 1000 |
| ID2 | 0100 |
| ID3 | 1100 |
| — | — |
| — | — |
| — | — |
| ID(N − 2) | 01111 |
| ID(N − 1) | 11111 |

In this example, N is 32. In some embodiments, N can be any other integer.

The ID stored in the ID register is according to the sequence and ID number itself. For example, if the ID register is 10-bits in length and the OPE has a 5-cycle "high" state, then five bits are included in the ID generation and a signal corresponding to the 5-bit result is transferred to the next device. The remaining bits are ignored and "zero" values are kept in the ID registers. In the example shown in FIG. 4A, each of the devices 310-1-310-N is not categorized per device type and memories.

The ID generator 333 generates a sequence of ID numbers with consecutive integers from low to high. The resulting ID assignment is shown in Table 2.

TABLE 2

| Device | Assigned ID Number | ID Code |
| --- | --- | --- |
| 310-1 | ID0 | 00000 |
| 310-2 | ID1 | 10000 |
| 310-3 | ID2 | 01000 |
| — | — | — |
| — | — | — |
| 310-(N − 1) | ID(N − 2) | 01111 |
| 310-N | ID(N − 1) | 11111 |

Alternatively, the sequence of ID numbers could be any other numeral sequence, provided that the adder 333 is replaced with an alternative operator that enables the sequence. For example, the ID calculator 353 could be replaced with a subtractor for performing "−1 operation" of the ID, thereby enabling a sequence of consecutive integers from high to low.

Figure 5A:
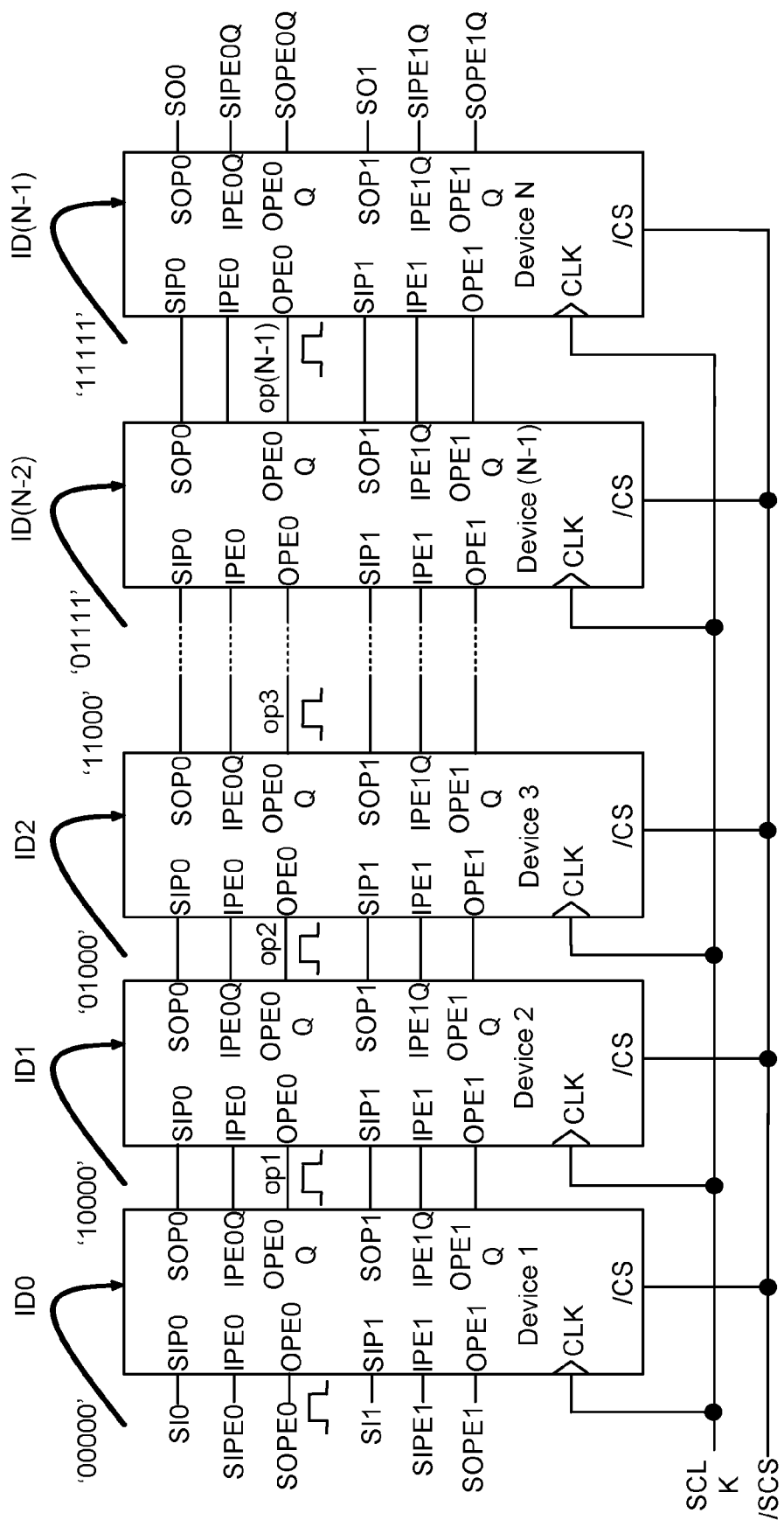
FIG. 5A is a block diagram illustrating a plurality of devices in a serial interconnection operating to establish an ID in dual links.
Figure 5B:
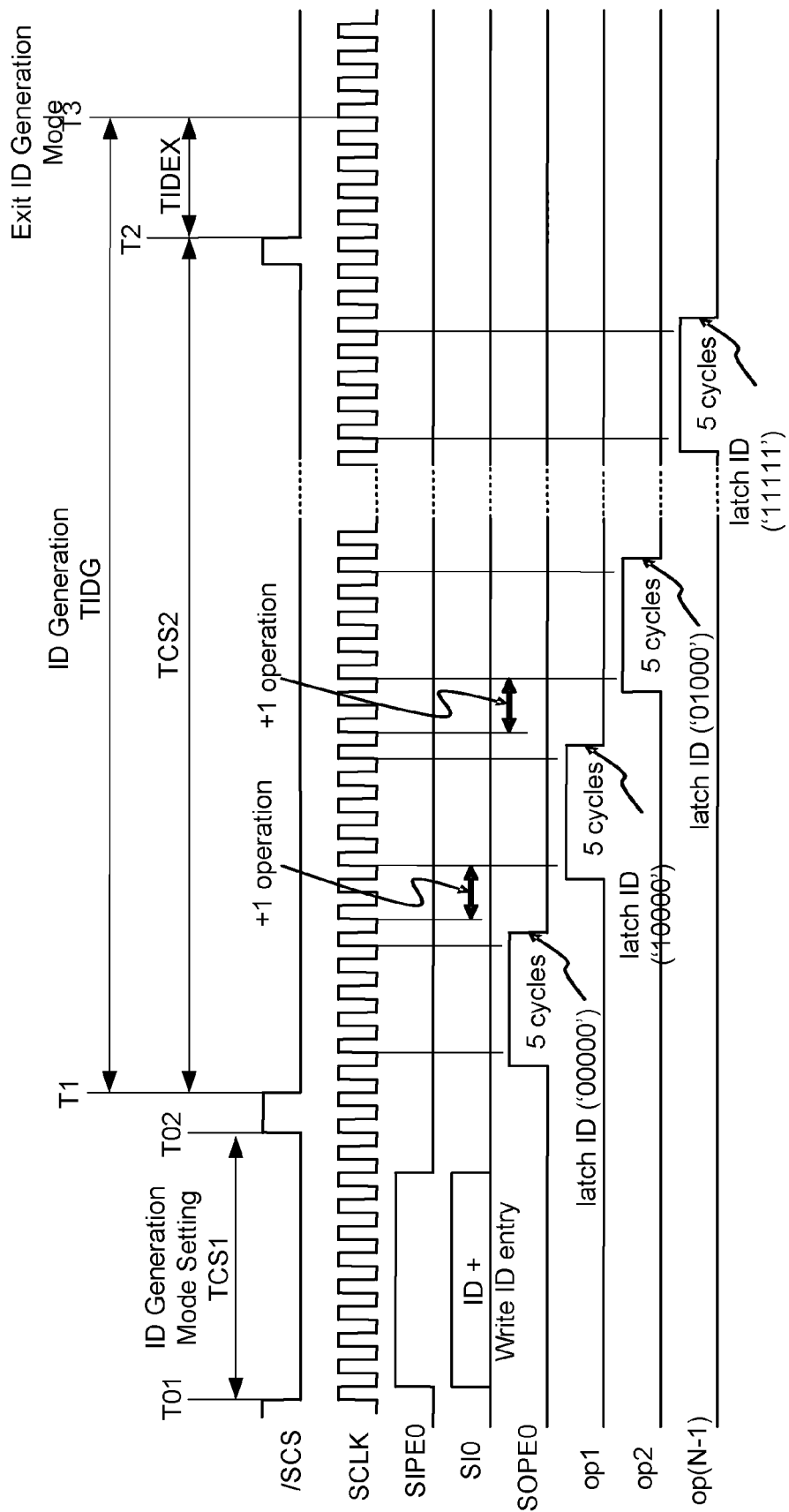
FIG. 5B is a timing diagram of signals transferred between the devices shown in FIG. 5A to establish each ID.

FIG. 5A shows a plurality of devices in a serial interconnection configuration operating to establish an ID at each device employing an example of ID generation logic for dual links. FIG. 5B shows a timing diagram of signals transferred between the devices shown in FIG. 5A to establish IDs. The connection of the memory devices is different from that of FIG. 4A. FIG. 5A shows an example describing how to generate IDs with dual links of a MISL device of a serial interconnection configuration. Any serial input pin and one control pin can have the same functionality as depicted in FIG. 5A.

Figure 6A:
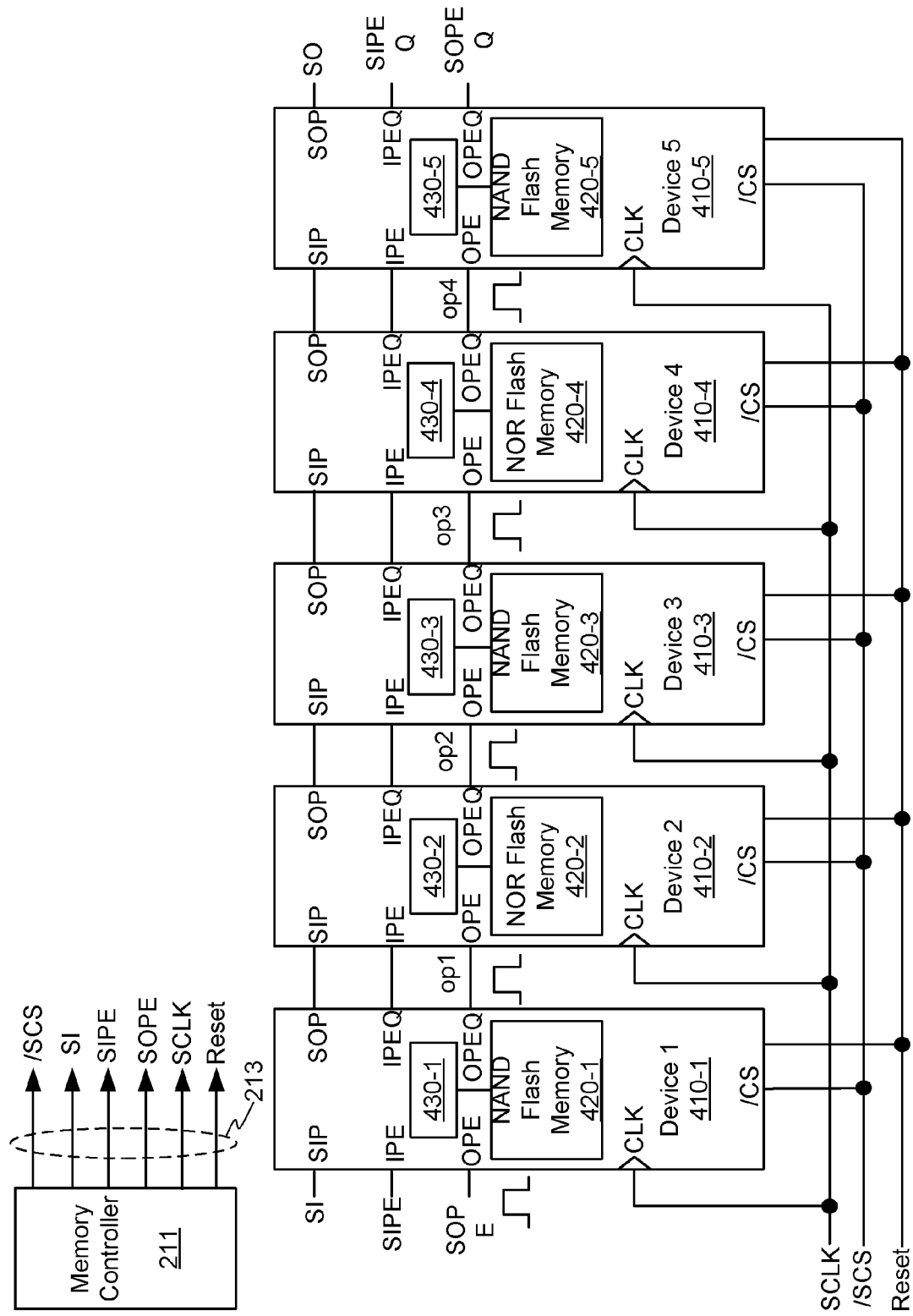
FIG. 6A is a block diagram illustrating a plurality of devices of mixed type in a serial interconnection, in which embodiments of the present invention are implemented.

FIG. 6A shows a plurality of memory devices of mixed type configured in a serial interconnection arrangement. In the example shown in FIG. 6A, five devices 1-5 (410-1-410-5) are interconnected and they include memories 420-1-420-5 therein. Each of the memories 420-1, 420-3 and 420-5 is a NAND Flash memory. Each of the memories 420-2 and 420-4 is a NOR Flash memory. For example, a system implementing such an arrangement of different types or a mixed-device serial interconnection may require that only devices of a certain type (e.g., NAND Flash devices) be assigned IDs. Alternatively, the system may require that all devices be assigned IDs, but that all devices of the same type are assigned IDs in a consecutive sequence. In order to meet such requirements in a system implementing ID generation as described above, five devices 410-1-410-5 are provided with device controllers 430-1-430-5, respectively. One of the functions performed by the device controller is to assign a device ID based on the device type. A memory controller 211 provides a group of signals 213 containing a chip select /SCS, a serial input SI, an input port enable SIPE, an output port enable SOPE, a clock SCLK, and other control and data information that are provided to the devices.

Figure 6B:
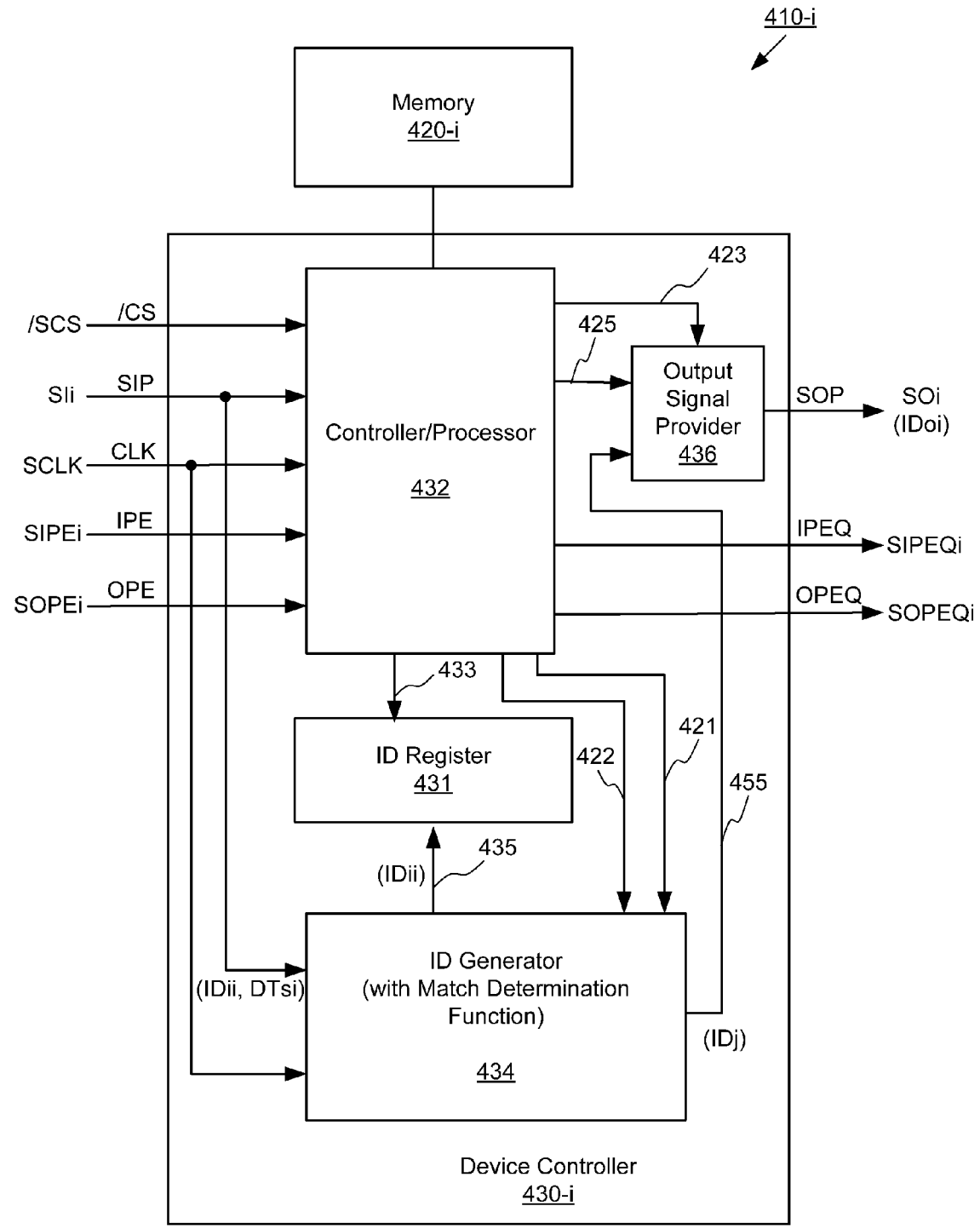
FIG. 6B is a block diagram illustrating one of the devices shown in FIG. 6A.
Figure 6C:
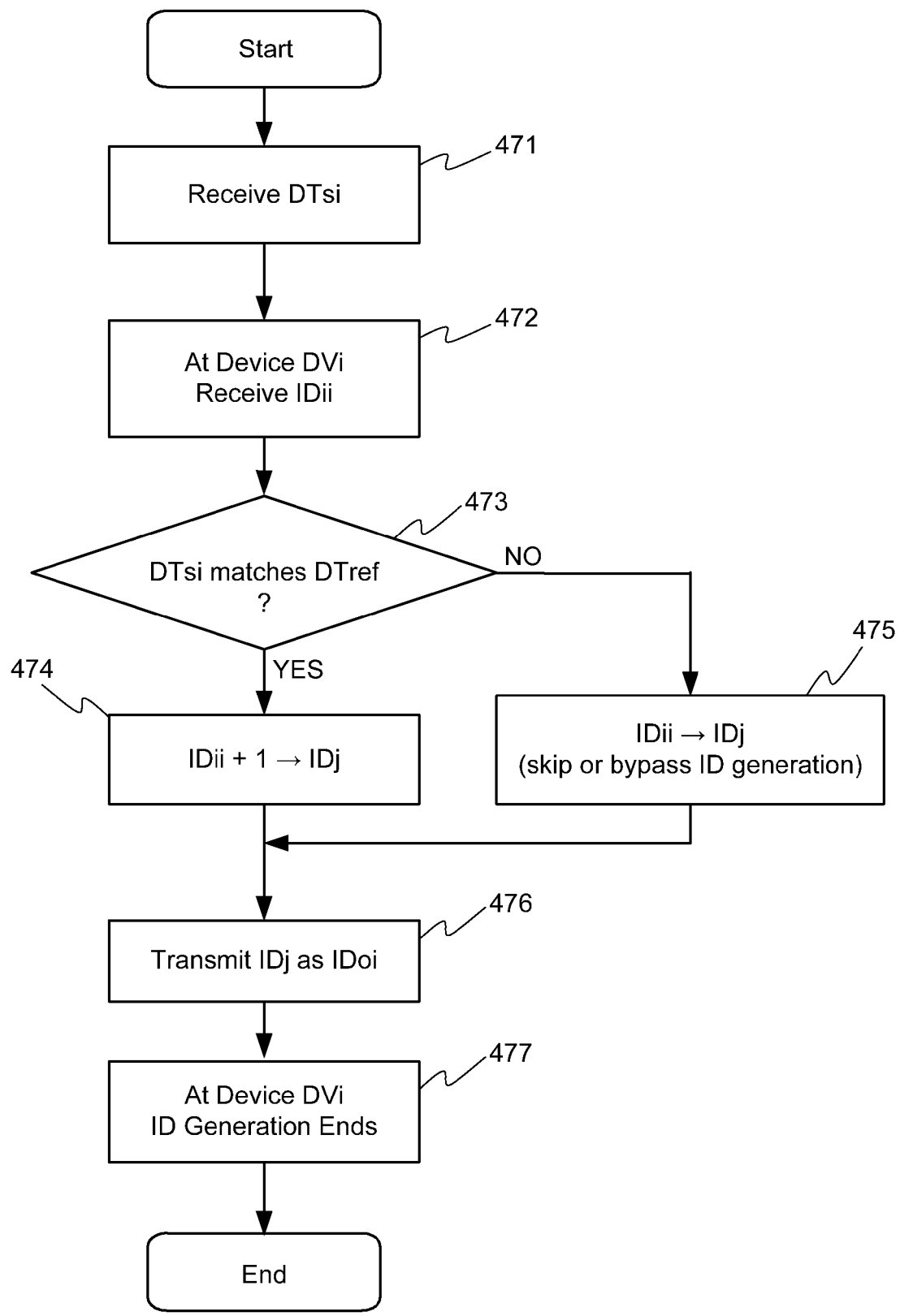
FIG. 6C is a flow chart of an ID generation method performed by a device controller shown in FIG. 6B.

FIG. 6B shows a device 410-*i* which represents any one of the devices 410-1-410-5. The device 410-*i* includes a memory 420-*i* and a device controller 430-*i* connected thereto. The device controller 430-*i* includes a controller/processor 432, an ID generator 434, an ID register 431 and an output signal provider 436. The serial input SIi to the SIP of the device 410-*i* contains commands, a device identifier IDii and other signal data. The controller/processor 432 receives the SIi, the SIPEi and the SOPEi and performs control and data processing functions. The controller/processor 432 provides an ID generation control signal 421 to the ID generator 434 that determines whether a received device type matches a predefined device type. The received device type is a device type (DT), DTsi, received through the serial input SI. The predefined device type is a reference DT, DTref, fed by storage means (not shown). The ID generator 434 produces an ID, IDj, based on the received ID, IDii, to establish an ID for another device, in response to a determination result. The established IDj contained in a serial output ID signal 455 from the ID generator 434 is transmitted through the output signal provider 436, in response to an ID generation enable signal 423. The ID generation by the ID generator 434 ends in response to an ID generation mode exit signal 422 provided by the controller/processor 432. The ID generation method performed by the device is shown in FIG. 6C. When the ID generation is not performed (e.g., a normal mode operation), data processed by the controller/processor 432 and contained in a processed data signal 425 is transmitted through the output signal provider 436.

The controller/processor 432 also provides an ID write enable signal 433 derived from the output port enable signal SOPEi. In response to the ID write enable signal 433 and the determination result from the ID generator 434, the ID register 431 latches or registers the received IDii contained in an ID signal 435 from the ID generator 434, as an ID for the present device 410-*i*. The registered ID is held until powered-off. The ID registration by the ID register 431 occurs only when the received DT, DTsi, matches the reference DT, DTref. In a case of no matching between DTsi and DTref, no ID registration occurs and the ID register 431 holds a reset value (e.g., "zero" state).

Referring to FIGS. 6B and 6C, the devices receives device type DTsi (step 471). Thereafter, the ID generator 434 of the present device 410-*i*, DVi, receives the ID, IDii, from the previous device, DV(i−1). Also, the device, DVi, receives information on the device type DTsi (step 472). Then, the received DTsi is compared to the reference device type DTref provided by storage means (hereinafter described) (step 473). If the DTsi matches the DTref (YES at step 473), the IDii will be incremented or altered by one to produce a new IDj (step 474). If there is no match (NO at step 473), the received IDii will be maintained as a new IDj (step 475). Thus, at step 475, the ID generation is skipped or bypassed. After step 474 or 475, the new IDj is fed by the ID generator 434 to the output signal provider 436 which in turn provides the new IDj as an output ID, IDoi, to the next device (DV(i+1)) (step 476) and the ID generation is completed at the device DVi (step 477).

Figure 6D:
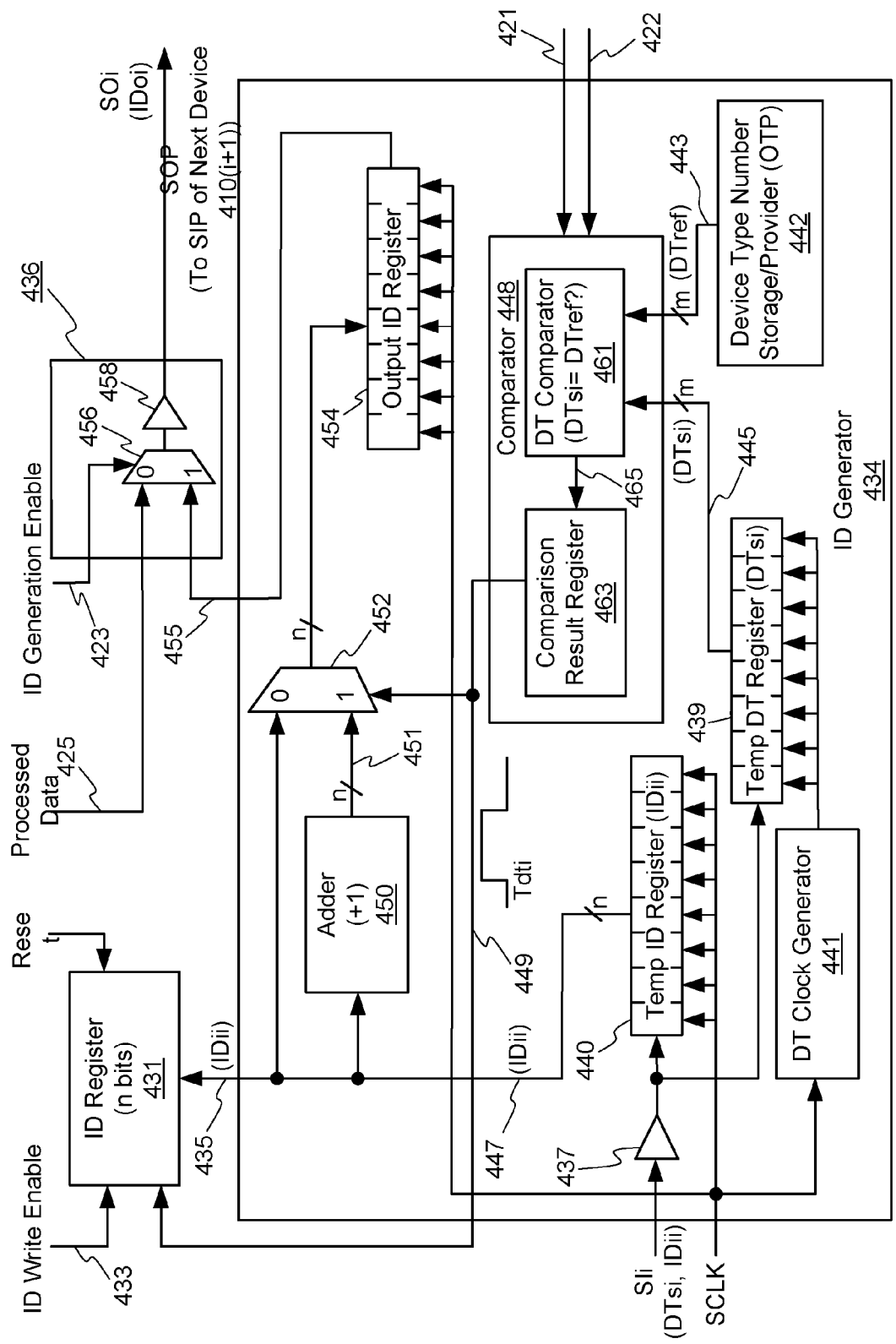
FIG. 6D is a block diagram illustrating an example of the ID generator shown in FIG. 6B.

FIG. 6D shows details of the ID generator 434 and the output signal provider 436 shown in FIG. 6B. Referring to FIGS. 6A-6D, the ID generator 434 includes a device type number storage/provider 442 of a one-time-programmable (OTP) element configured by a non-volatile memory. The OTP element stores a device type number as a reference device type (DTref) that is programmed to the device prior to the ID generation. Table 3 shows device type number assignment and the definition of an example device type in serialized byte code.

TABLE 3

| Device Type | HEX | Bit 7 | Bit 6 | Bit 5 | Bit 4 | Bit 3 | Bit 2 | Bit 1 | Bit 0 |
|---|---|---|---|---|---|---|---|---|---|
| NAND Flash (DTnd) | 00h | 0 | 0 | 0 | 0 | 0 | 0 | 0 | 0 |
| NOR Flash (DTnr) | 01h | 0 | 0 | 0 | 0 | 0 | 0 | 0 | 1 |
| DRAM (DTrm) | 02h | 0 | 0 | 0 | 0 | 0 | 0 | 1 | 0 |
| SRAM (DTsm) | 03h | 0 | 0 | 0 | 0 | 0 | 0 | 1 | 1 |
| — | — | — | — | — | — | — | — | — | — |
| — | — | — | — | — | — | — | — | — | — |
| — | — | — | — | — | — | — | — | — | — |
| MRAM (DTmm) | FFh | 1 | 1 | 1 | 1 | 1 | 1 | 1 | 1 |

The ID generator 434 also includes a serial input buffer 437 for receiving the serial input SIi through the SIP of the device and the SIi is fed to a temporary DT register 439 and a temporary ID register 440. The received SIi in the ID generation mode setting operation includes a value corresponding to a device type (DT), DTsi, which is a number of m-bits (e.g., eight bits). The received SIi in the ID generation operation includes a value corresponding to a device ID, IDii, which is a number of n-bits (e.g., eight bits). The clock signal SCLK is fed to the temporary ID register 440 and a device type (DT) clock generator 441. The DT clock generator 441, in response to the clock signal SCLK, internally generates a DT register clock signal. Each of the temporary ID register 440 and the temporary DT register 439 is a serial-to-parallel register that registers the input serial data therein in response to the input clocks. In the ID generation mode setting operation, the m-bit DTsi contained in the SI is serially shifted into the temporary DT register 439 in response to the DT register clock signal and held therein. In the ID generation mode, the n-bit IDii contained in the SI is serially shifted into the temporary ID register 440 in response to the clock signal SCLK and held therein.

The m-bit DTsi and the n-bit IDii separately held in the registers 439 and 440 are outputted in parallel as an m-bit signal 445 and an n-bit signal 447, respectively. The n-bit signal 447 is fed to a selector 452 and an adder 450 that provides a calculation signal 451 having a +1 operation value. The m-bit signal 445 is fed to a comparator 448 that also receives the m-bit DT number, DTref, contained in a DT signal 443 from the DT number storage/provider 442. The comparator 448 includes an m-bit DT comparator 461 and a comparison result register 463. In response to the ID generation control signal 421 at determination time Tdti, the DT comparator 461 compares the DTsi to the DTref to provide a comparison result signal 465 to the comparison result register 463. Thus, the DT match determination result is held in the comparison result register 463 that provides a DT match signal 449. If the DTsi and the DTref are identical, the DT match signal 449 will become "high," indicating a match between the two numbers of the device types DTsi, DTref. Otherwise, the DT match signal 449 will become "low," indicating that the received DTsi specifies a type of device that is different from that of the present device (410-*i*). The comparator 448 outputs the "high" DT match signal having a pulse width Tm, when a device type match occurs. A storing time period Tm is selected as the +1 operation is completed and the addition result is transferred to an output ID register 454 that is a parallel-to-serial register. The DT match signal 449 transits to "low" in response to the ID generation mode exit signal 422 from the controller/processor 432. Thus, the Tm ends as the ID generation mode exits.

The adder 450 adds "1" to the received IDii, thereby producing the calculation signal 451 containing an ID, IDii+1, for another device in a sequence of IDs in the serial interconnection. The added ID is the received IDii incremented or altered by one. The adder 450 provides an appropriate function for ID generation when the selected sequence of ID numbers is consecutive integers from low to high. Alternatively, the sequence of ID numbers could be any other numeral sequence, provided that the adder 450 is replaced with an alternative operator that enables the sequence. For example, the adder 450 could be replaced with a subtractor that subtracts "1" from the ID, IDii, thereby enabling a sequence of consecutive integers from high to low. This will be discussed later with reference to FIG. 13A.

The selector 452 selects one of the two inputs (effectively "added ID, IDii+1" and "non-added ID, IDii") according to the DT match signal 449. If the DT match signal 449 is "high" (corresponding to a match between the DTsi and the DTref), then the selector 452 selects input "1", which receives the signal 451 of "added IDii+1" from the adder 450. If the DT match signal 449 is "low" (corresponding to a difference between the DTsi and the DTref), then the selector 452 selects input "0", which receives the signal 447 of "non-added IDii" from the serial-to-parallel register 440. The selected output signal of n-bits is fed to the parallel-to-serial register 454 that is enabled to register the selected n-bit ID data therein immediately before the expiration of the time period Tm, in response to an enable signal (not shown). The parallel-to-serial register 454 outputs the registered data in a serial manner as the serial output ID signal 455, in response to the clock signal SCLK. The serial output ID signal 455 is fed to a selector 456 of the output signal provider 436. The selector 456 also receives the processed data signal 425 provided by the controller/processor 432 accessing the memory 420 (NAND or NOR Flash memory) of that device 410-*i*. In response to the ID generation enable signal 423 derived from the generation command by the controller/processor, the selector 456 selects one of the serial output ID signal 455 and the processed data signal 425 when the ID generation enable signal 423 is "high" (an ID generation mode) and "low" (the normal mode), respectively. A selected signal from the selector 456 is outputted through a serial output buffer 458 to the next device (410-(i+1)) in the serial interconnection.

It is noted that the aforementioned selector 452 is shown for selecting a single bit of IDii or a single bit of IDii+1. Accordingly, there are n duplicate selectors to select the n-bit signal 451 or 447 and output the selected n-bit signal, in response to the DT match signal 449.

The ID generator 434 provides the ID signal 435 containing the n-bit ID, IDii, to the ID register 431. The ID signal 435 is the signal 447 of "non-added IDii" from the serial-to-parallel register 440. In response to the ID write enable signal 433 from the device controller 430-i, the ID register 431 registers or latches the received ID, IDii, for the present device 410-i. The registered ID is held until powered-off. The ID register 431 is initially reset to the zero state and thus, if no ID latch occurs, the ID register 431 will hold the zero state.

With reference to FIG. 6A, for example, the above described ID generation process is completed by device 1's controller 430-1 at device 410-1 that is a NAND Flash memory device. The device controller 430-1 outputs the resulting device ID to device 2, 410-2, that is a NOR Flash memory device. Device 2's controller 430-2, located at device 410-2, performs the same operation as device 1's controller 430-1, transferring the resulting device ID to device 410-3. This process is repeated for all devices 410-1-410-5 in the serial interconnection, until the device ID has passed through all devices.

Figure 7A:
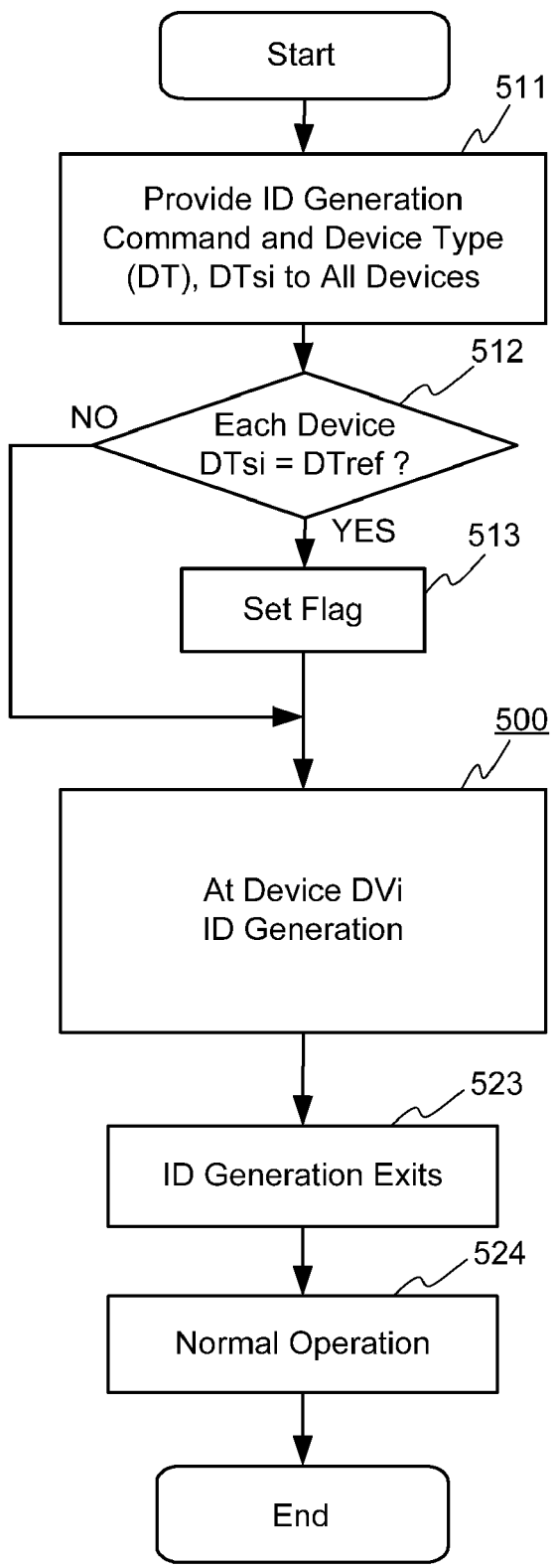
FIG. 7A is a flow chart of an ID generation method with a skip or bypass function.
Figure 7B:
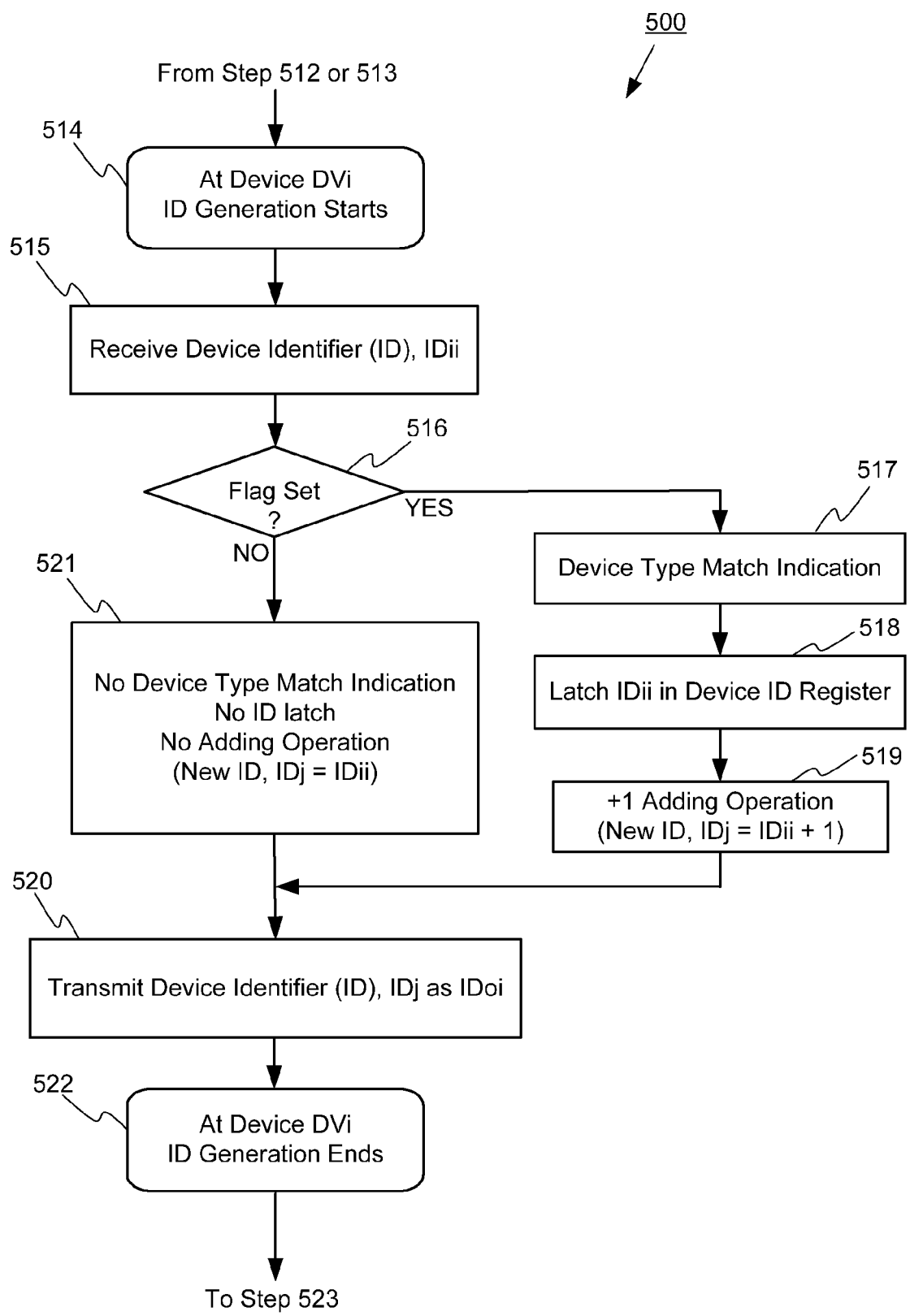
FIG. 7B is a flow chart illustrating part of the method shown in FIG. 7A.

FIG. 7A shows a more detailed process for device ID generation with an additional function of skip or bypass. FIG. 7B shows part (step 500) of the ID generation method shown in FIG. 7A. Referring to FIGS. 6A, 6D, 7A and 7B, before the ID generation process, the ID generation command and a device type DT, DTsi, are provided by the memory controller 211 to all devices in the serial interconnection, so that all devices are ready for ID generation (step 511). In step 511, at each device, the DT clock generator 441 of the ID generator 434 generates the DT register clocks in response to the clock signal SCLK and the received DTsi is shifted into the temporary DT register 439. Thus, the device type DTsi is held in the temporary DT registers 439 of all devices. At each of the devices, the DT comparator 461 of the comparator 448 compares the held DTsi to the reference DT, DTref, corresponding to the device type (step 512) and if the values or numbers match between the DTsi and the DTref, a flag will be set (step 513). If no matches between the DTsi and the DTref, no flag will be set. The flag set at step 513 is performed by registering a one-bit comparison result of the signal 465 in the comparison result register 463. Thereafter, the i-th device DVi starts the ID generation process (step 514). The device DVi (e.g., device 2) receives, from the previous device DV(i−1) (e.g., device 1), a device ID, IDii, and the received ID is held in the temporary ID register 440 (step 515). Then, it is determined whether the flag is set or not (step 516). If the flag is set (at step 513), i.e., a match between the DTsi and the DTref, the DT match signal 449 will be "high" (step 517). This signal indicates to the device to store or latch the received device ID, IDii (step 518), thereby assigning or establishing the device ID for the present device, DVi. These operations are performed during the ID generation mode setting process. This will be later described with reference to FIG. 8B.

After step 518, the ID number or value is then altered by a "+1" operation (step 519), resulting in a new device ID, IDj.

The new device ID, IDj, is converted to a serial signal (step 520) for transmission to the next device DV(i+1) (e.g., device 3) in the serial interconnection. As a result, the next device DV(i+1) receives the ID number, IDii. As the device DV(i+1) already received and held the device type DTsi in its DT register, the same ID generation process starts.

If the values of the DTsi and the DTref do not match (a negative determination at step 512), then no flag is set and no DT determination result is registered, so that the DT match signal 449 is "low". This signal indicates to the device not to store the received device ID number, IDii, with no adding operation (step 521), and to transfer the device ID number to the next device in the serial interconnection (step 520). Upon completion of step 520, the ID generation process at the device DVi ends (step 522). The process shown in FIG. 7B can be repeated at each device in the serial interconnection performing operations of steps 514-522. After the ID generation process ends at all devices, the ID generation mode operation ends, as the ID generation mode exit signal 422 is fed to the ID generator 434 (step 523). Thereafter, the system performs the function of data process in the normal mode (step 524).

Alternatively, steps 518 and 519 can be reversed, wherein the "new" device ID number (resulting from the "+1" operation) is stored at the ID register of the present device (device DVi). As a result, the device ID established for the device is the resulting "new" device ID number instead of the received device ID number. Accordingly, a memory controller may be configured to address the memory devices in the serial interconnection according to the device IDs established at each device. This will be discussed later with reference to FIG. 13B.

When each device in the serial interconnection has completed the process, all devices with a matching DT number have established an ID (step 518), and all other devices have refrained from establishing an ID (step 521). To establish IDs for these other devices, the process can be repeated for all devices, wherein the device type DTsi is replaced with a value matching the device type number of some or all of the other devices. For example, a first process, with DTsind matching a NAND Flash device, could be completed at all devices, thereby establishing an ID at each NAND Flash device in the serial interconnection. Afterwards, a second process, with DTsinr matching a NOR Flash device, could be completed at all devices, thereby establishing an ID at each NOR Flash device in the serial interconnection. The process may be further repeated for other device types (e.g., DRAM, SRAM) in the serial interconnection. As a result, each device in the serial interconnection can be uniquely identified in subsequent commands by specifying the ID and device type DT of that device.

In a case where the stored reference device type DTref of the DT number storage/provider 442 is chosen for the NAND Flash memory, the device type DT is "00h" (see Table 3 above). In the process shown in FIGS. 7A and 7B, (at step 516), devices 1, 3 and 5 (410-1, 410-3 and 410-5) determine that the DTsi "match" the stored DTref and thus, at step 519, the +1 operation is performed for generating the next ID. In devices 2 and 4 (410-2 and 410-4) that are NOR Flash memories, the DT ("01h") do not match the chosen stored DT (the negative determination at step 516) and thus, no +1 operation is performed (step 521). At "non-match" devices, no ID registration (i.e., no ID latch) is performed and thus, the reset "zero state" is maintained in the ID registers. The resulting latched IDs and generated IDs are shown in Table 4.

TABLE 4

| Device | Device Type | DT Number or Value | Latched or Registered ID | Generated or Bypassed ID |
|---|---|---|---|---|
| 410-1 | NAND Flash | 00h | 000 | 100 |
| 410-2 | NOR Flash | 01h | 000 | 100 |
| 410-3 | NAND Flash | 00h | 100 | 010 |
| 410-4 | NOR Flash | 01h | 000 | 010 |
| 410-5 | NAND Flash | 00h | 010 | 110 |

In a case where the stored DT of the DT number storage/provider 442 is chosen for the NOR Flash memory, the DT is "01h" (see Table 3 above). In the process shown in FIGS. 7A and 7B, (at step 516), devices 2 and 4 (410-2 and 410-4) determine that the DTsi "match" the stored DTref and thus, the +1 operation (step 519) is performed for generating the next ID. In devices 1, 3 and 5 (410-1, 410-3 and 410-5) that are NAND Flash memories, the DTsi ("00h") does not match the chosen stored DTref (the negative determination at step 516) and thus, no +1 operation is performed (step 521). The resulting latched IDs and generated IDs are shown in Table 5.

TABLE 5

| Device | Device Type | DT Number or Value | Latched or Registered ID | Generated or Bypassed ID |
|---|---|---|---|---|
| 410-1 | NAND Flash | 00h | 000 | 000 |
| 410-2 | NOR Flash | 01h | 000 | 100 |
| 410-3 | NAND Flash | 00h | 000 | 100 |
| 410-4 | NOR Flash | 01h | 100 | 010 |
| 410-5 | NAND Flash | 00h | 000 | 010 |

Figure 8A:
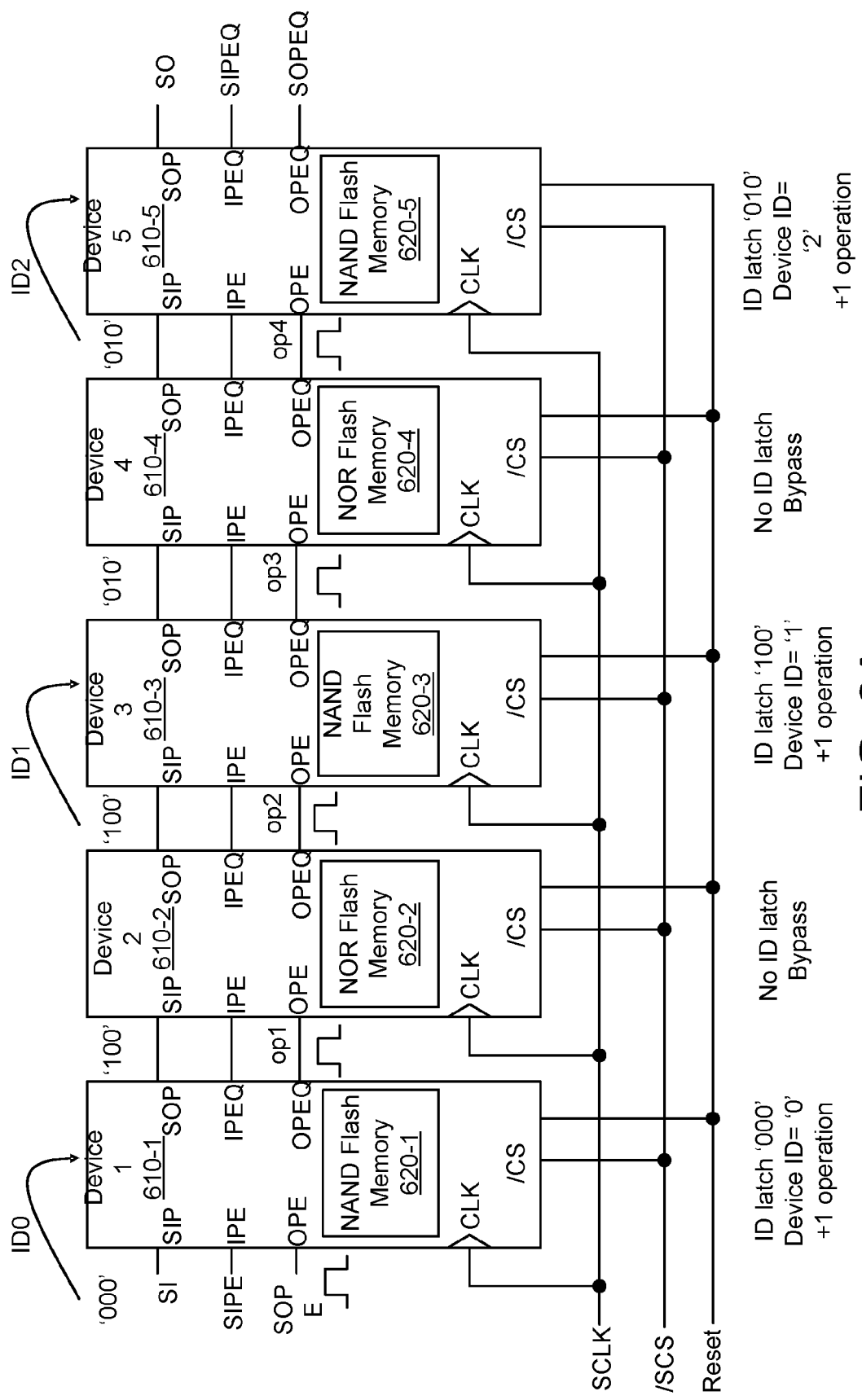
FIG. 8A is a block diagram illustrating a plurality of devices of mixed types in a serial interconnection, in which the ID generation of NAND memory devices is performed.

FIG. 8A shows a plurality of devices of mixed types in a serial interconnection, in which the ID generation of NAND memory devices is performed. The configuration of the serially interconnected devices shown in FIG. 8A is similar to one of FIG. 6A. Referring to FIG. 8A, devices 1, 3 and 5 (610-1, 610-3 and 610-5) are memory devices including NAND Flash memories 620-1, 620-3 and 620-5, respectively. Devices 2 and 4 (610-2 and 610-4) are memory devices including NOR Flash memories 620-2 and 620-4, respectively. Each of five devices 610-1-610-5 includes the same device controller as that of FIG. 6B. The device controller has the same ID generator as that of FIG. 6D.

Figure 8B:
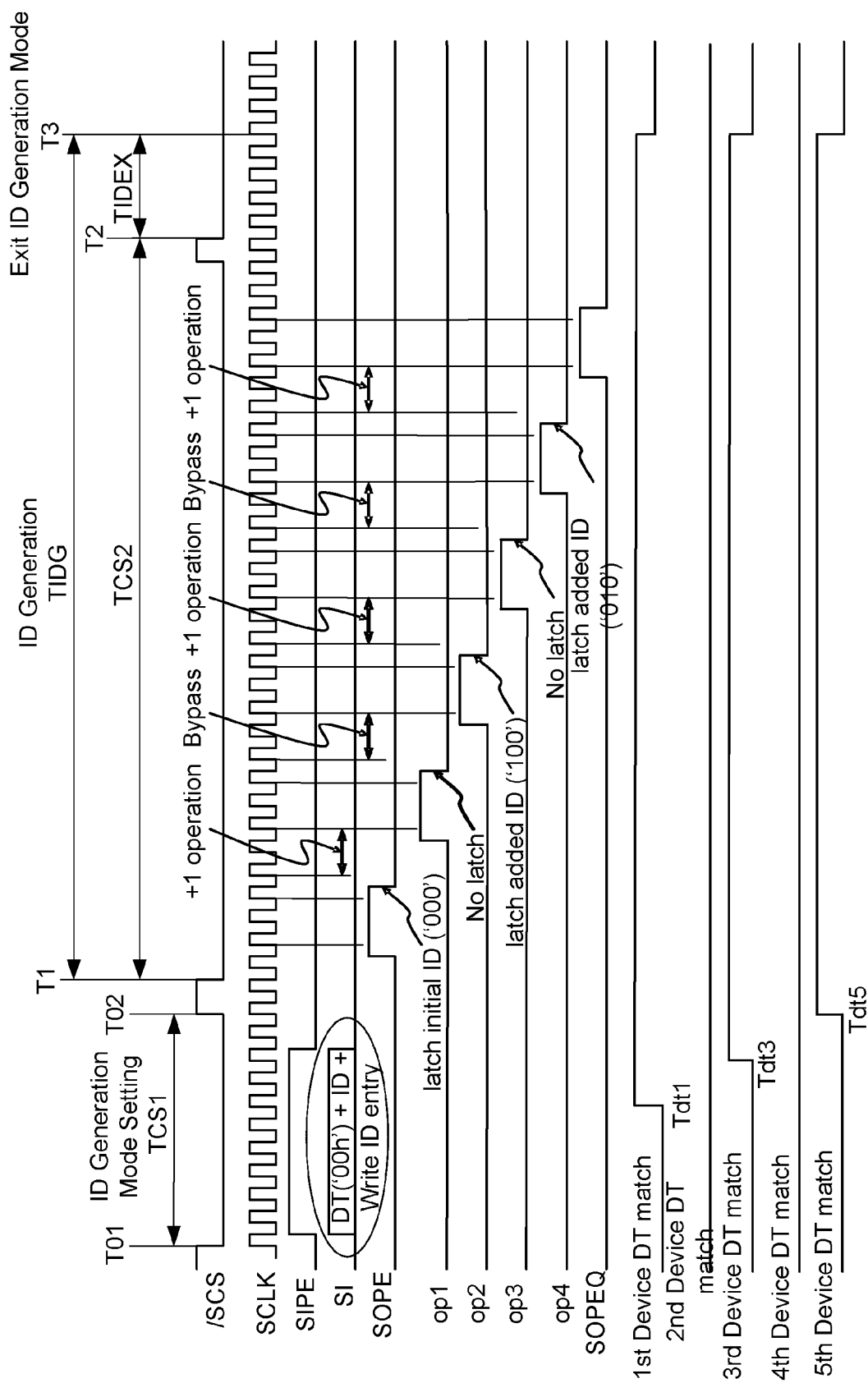
FIG. 8B is a timing diagram of the ID generation in the serial interconnection shown in FIG. 8A.

FIG. 8B shows signal timings for the ID generation of NAND memory devices shown in FIG. 8A.

Referring to FIGS. 6A, 6D, 8A and 8B, the ID generator 434 of the device controller 430-i performs an ID generation and a skip function. The operation of the serially interconnected devices of FIG. 8A is the same as one of the cases where the stored DT of the DT number storage/provider 442 is chosen for the NAND Flash memory. The resulting device ID/device type assignment is shown in Table 4 above. The device type match signals 449 in devices 1, 3 and 5 (610-1, 610-3 and 610-5) (NAND Flash devices) become "high" at determination times Tdt1, Tdt3 and Tdt5, respectively. However, the DT match signals in devices 2 and 4 do not become "high".

The SI contains the device type DT (DTsi), the device identifier ID (the initial ID ('000')) and a "write ID entry" command. In this example, the DT is DTnd for the NAND Flash memory and its DT number or code is '00h', as shown in Table 3. During the ID generation mode setting time period TCS1, by the "write ID entry" command, the IPE catches the input streams which consists of the command bits, the DT bits, the ID bits (initial '000'). Thereafter, during the TCS2 timing period, the OPE catches the input stream, which consists of the same cycles as a total number of the ID bits, e.g., three cycles. The ID bits are established by the size of an internal ID register. After the completion of the processes during the ID generation mode setting time period TCS1, the ID generation operation starts at time T1 and ends with an expiration of the time period TIDG. With an expiration of one chip select cycle TCS2, TIDEX (e.g., five cycles or five rising edges of the clock pulse) after time T2, the ID generation operation period TIDG expires at time T3. Devices 1, 3 and 5 provide the "high" device type match signals at determination times Tdt1, Tdt3 and Tdt5, respectively. Devices 2 and 4 do not, however, provide "high" match signal. In response the "high" DT match signals 449, devices 1, 3 and 5 write or latch the IDs '000', '100' and '010' in the ID registers 431 and generate new IDs with the +1 operation.

Figure 9A:
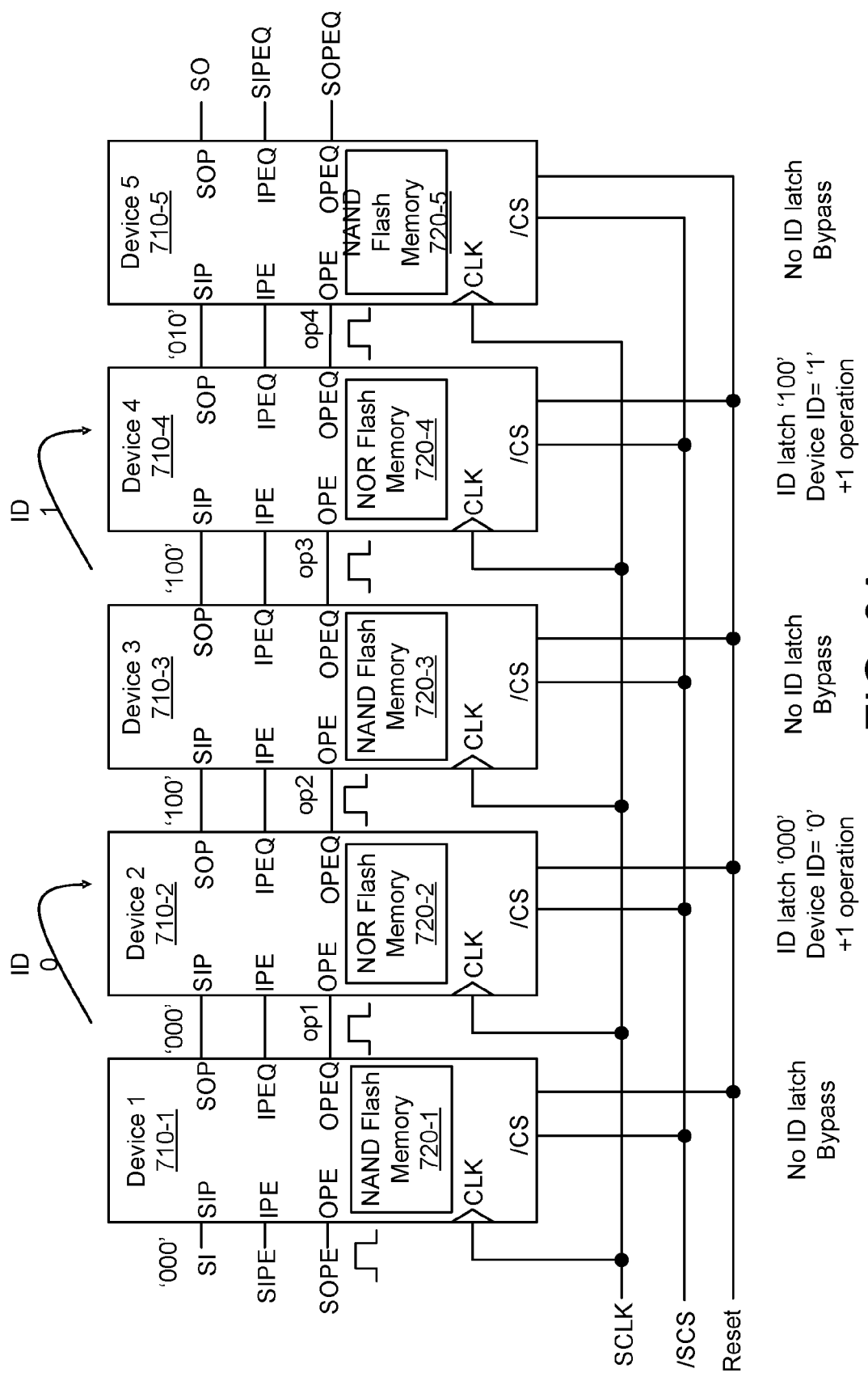
FIG. 9A is a block diagram illustrating a plurality of devices of mixed type in a serial interconnection, in which the ID generation of NOR memory devices is performed.
Figure 9B:
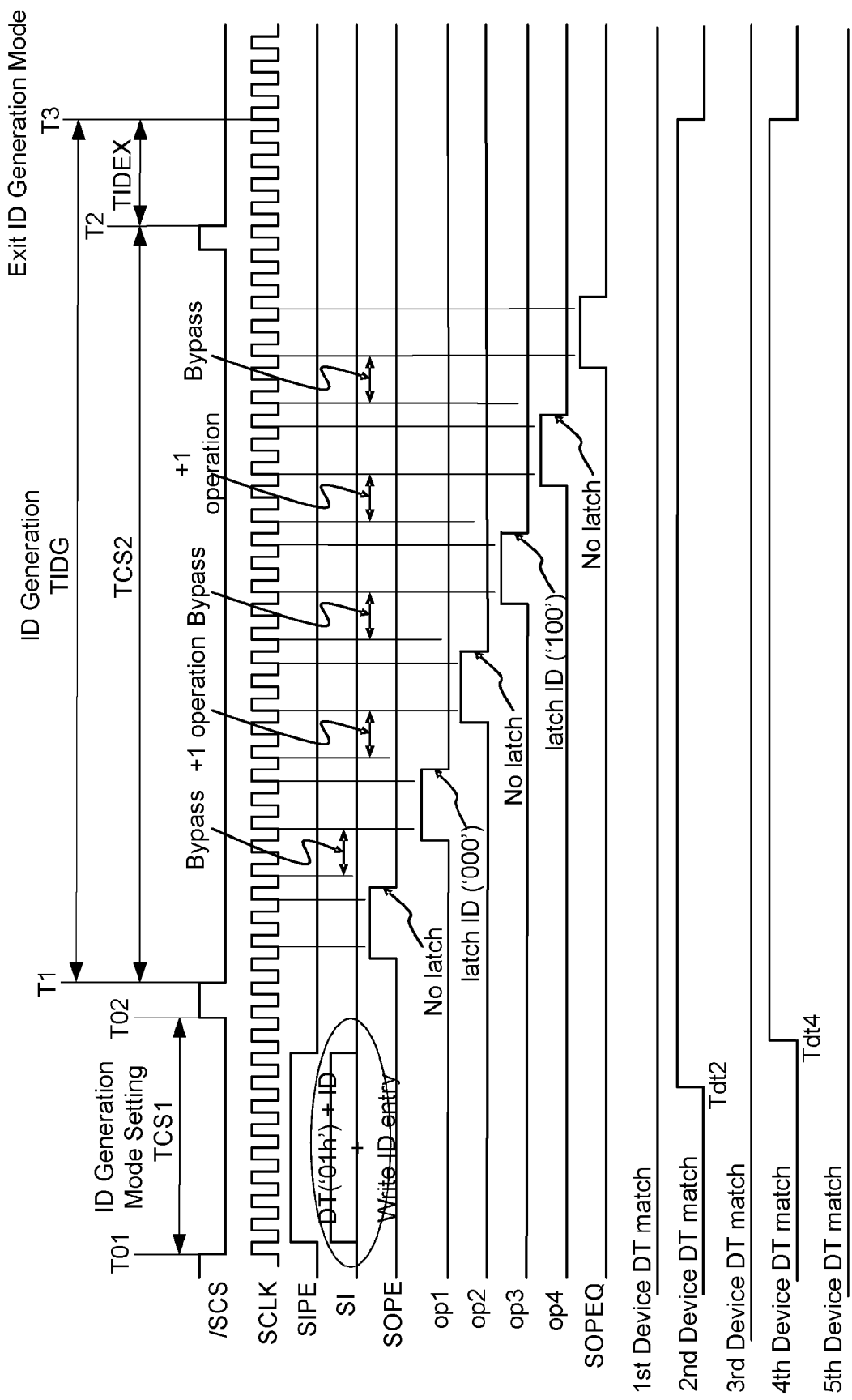
FIG. 9B is a timing diagram of the ID generation in the serial interconnection shown in FIG. 9A.

FIG. 9A shows a plurality of devices of mixed type in a serial interconnection, in which the ID generation of NOR memory devices is performed. FIG. 9B shows signal timings for the ID generation of the NOR memory devices in the mixed-device serial interconnection shown in FIG. 9A. The configuration of the serially interconnected mixed-type devices shown in FIG. 9A is similar to that of FIG. 8A.

Referring to FIGS. 9A and 9B, devices 1, 3 and 5 (710-1, 710-3 and 710-5) are memory devices including NAND Flash memories 720-1, 720-3, and 720-5. Devices 2 and 4 (710-2 and 710-4) are memory devices including NOR Flash memories 720-2 and 720-4. Each of five devices 710-1-710-5 includes a device controller (not shown) that is similar to the device controller 430 shown in FIG. 6D that provides an ID generation and a skip function. The operation of the serially interconnected devices of FIG. 9A is the same as the case where the stored DT of the DT number storage/provider 442 (see FIG. 6D) is chosen for the NOR Flash memory, DTnr, the number or code of which is '01h', as shown in Table 3. The resulting device ID/device type assignment is shown in Table 5 above. The device type match signals (e.g., the DT match signal 449 shown in FIG. 6D) in devices 2 and 4 (710-2 and 710-4) (NOR Flash devices) become "high" at determination times Tdt2 and Tdt4, respectively, as shown in FIG. 9B. In response to the "high" device type match signals, devices 2 and 4 latch the IDs '000' and '100' and generate new IDs with +1 operation. However, the DT match signals in devices 1, 3 and 5 do not become "high".

Figure 10:
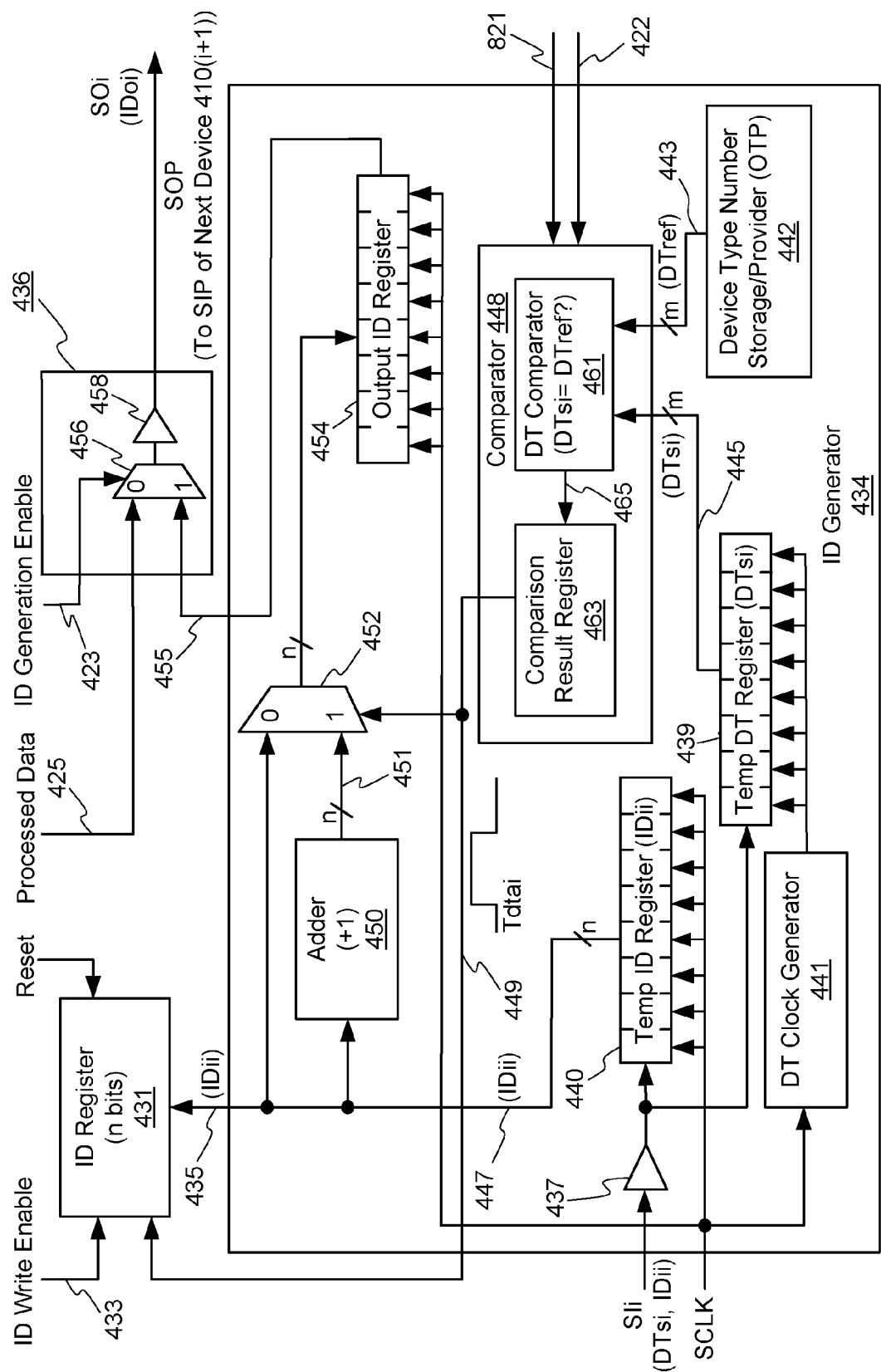
FIG. 10 is a block diagram illustrating another example of the ID generator.

FIG. 10 shows another example of the ID generator. The ID generator shown in FIG. 10 is similar to that of FIG. 6D. A difference is that an ID generation control signal 821, instead of the ID generation control signal 421, is fed to the comparator 448. The ID generation control signal 821 is provided in response to the output port enable signal OPE, so that the DT comparator 461 of the comparator 448 is activated at time Tdtai, after the OPE is enabled, to perform the device type comparison function.

Figure 11:
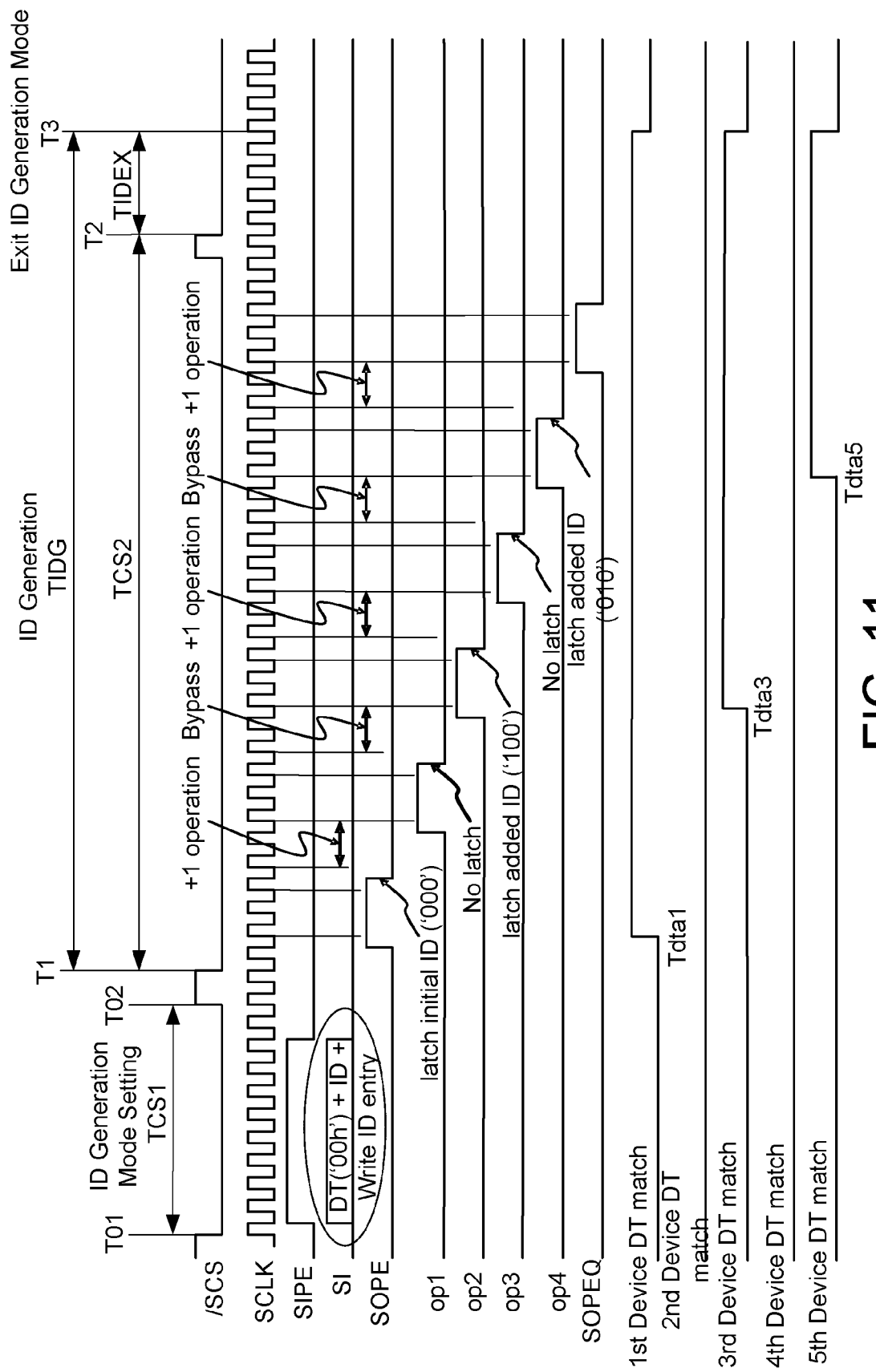
FIG. 11 is a timing diagram of the ID generation in the serial interconnection to where the ID generator shown in FIG. 10 is applied.
Figure 12A:
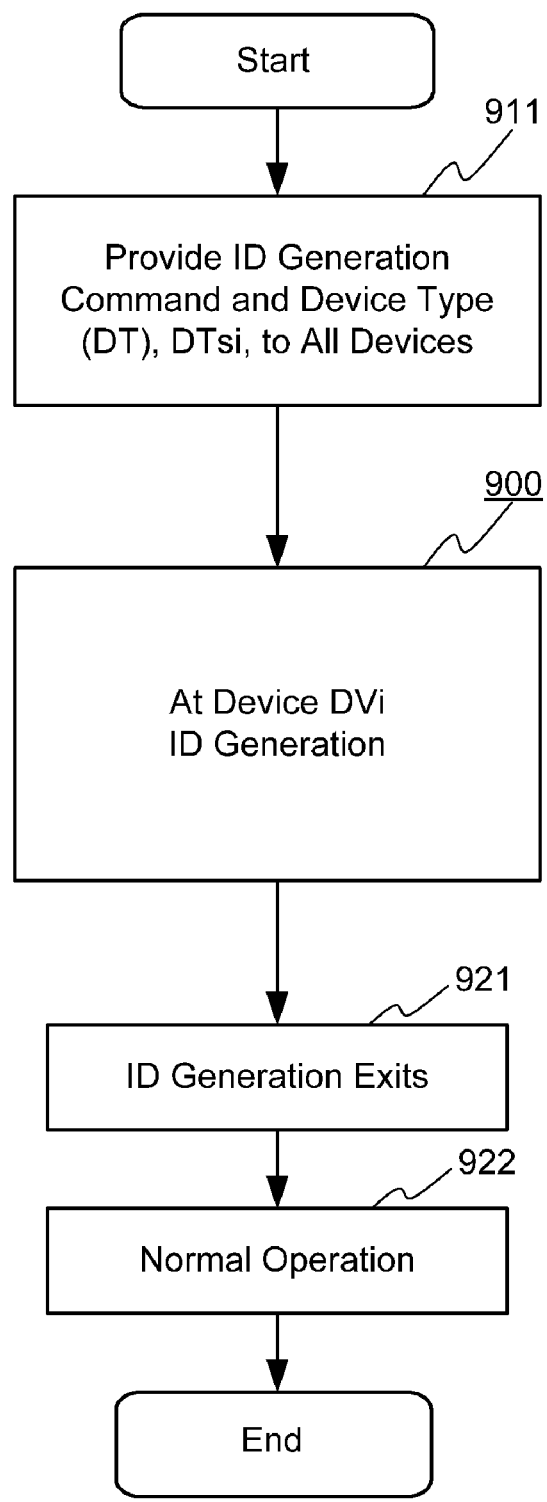
FIG. 12A is a flowchart illustrating an ID generation method performed by the ID generator shown in FIG. 10.
Figure 12B:
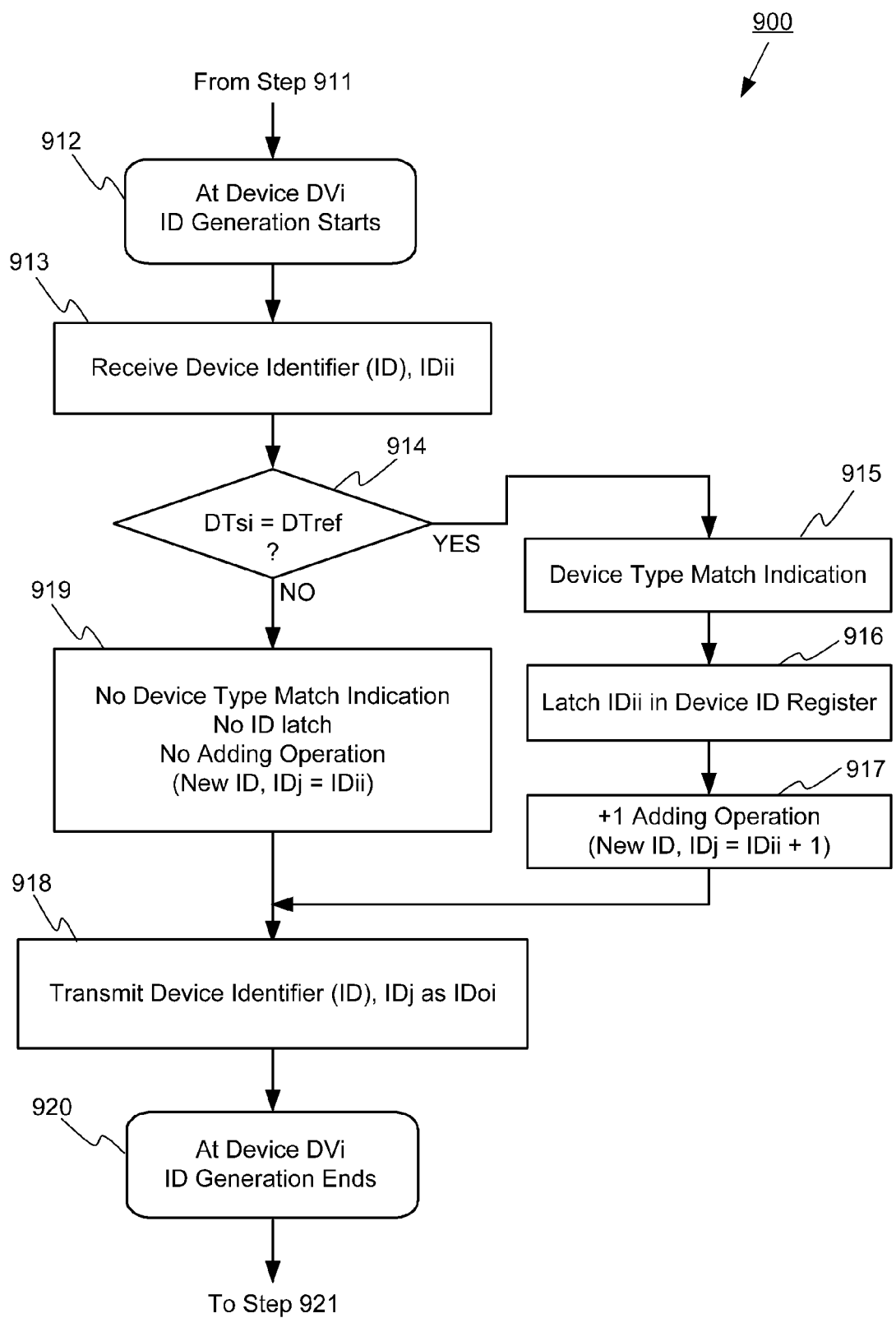
FIG. 12B is a flowchart illustrating part of the ID generation shown in FIG. 12A.

FIG. 11 shows the signals for the ID generation in the serial interconnection arrangement to where the ID generator shown in FIG. 10 is applied. FIG. 12A shows an ID generation method performed by the ID generator shown in FIG. 10. FIG. 12B shows part (step 900) of the ID generation method of FIG. 12A.

Referring to FIGS. 10, 11, 12A and 12B, before the ID generation process, the ID generation command and a device type DT, DTsi, are provided by a memory controller (not shown) to all devices in the serial interconnection, so that all devices are ready for the ID generation (step 911). In step 911, at each device, the device type DTsi is held in the temporary DT register 439 in response to the DT register clocks from the DT clock generator 441. Thereafter, the i-th device DVi (e.g., device 2) starts the ID generation process (step 912). The device DVi receives, from a previous device DV(i−1) (e.g., device 1), a device ID, IDii, and the received ID is held in the temporary ID register 440 (step 913) of the device DVi. In response to the ID generation control signal 821, the DT comparator 461 compares the previously received DTsi held in the temporary DT register 439 to the reference DT, DTref, which corresponds to the device type of that device (step 914). In the case of a match between the DTsi and the DTref, the comparison result of "match" is registered in the comparison result register 463 and the DT match signal is "high" (step 915). The ID register 431 latches the received device ID, IDii (step 916), thereby establishing the device ID for the present device DVi. After step 916, the ID number is altered by a "+1" operation (step 917), resulting in a new device ID, IDj. The new device ID, IDj, is converted to a serial signal for transmission to a next device DV(i+1) (e.g., device 3) in the serial interconnection (step 918). As a result, the next device DV(i+1) receives the ID number, IDii. As the device DV(i+1) already received and held the device type DTsi in its DT register, the same ID generation process is performed.

If there is no match between the DTsi and the DTref (a negative determination at step 914), the DT match signal will be "low". At the result, the present device DVi device does not store the received device ID number, IDii, with no adding operation (step 919). The non-altered IDii, as a new IDj, is transferred to the next device (step 918). Upon completion of step 918, the ID generation process at the device DVi ends (step 920). The process shown in FIG. 12B can be repeated at each device in the serial interconnection. After the ID generation process ends at all devices, the ID generation mode operation ends, as the ID generation mode exit signal 422 is fed to the ID generator 434 (step 921). Thereafter, the system performs the function of data process in the normal operation mode (step 922).

Figure 13A:
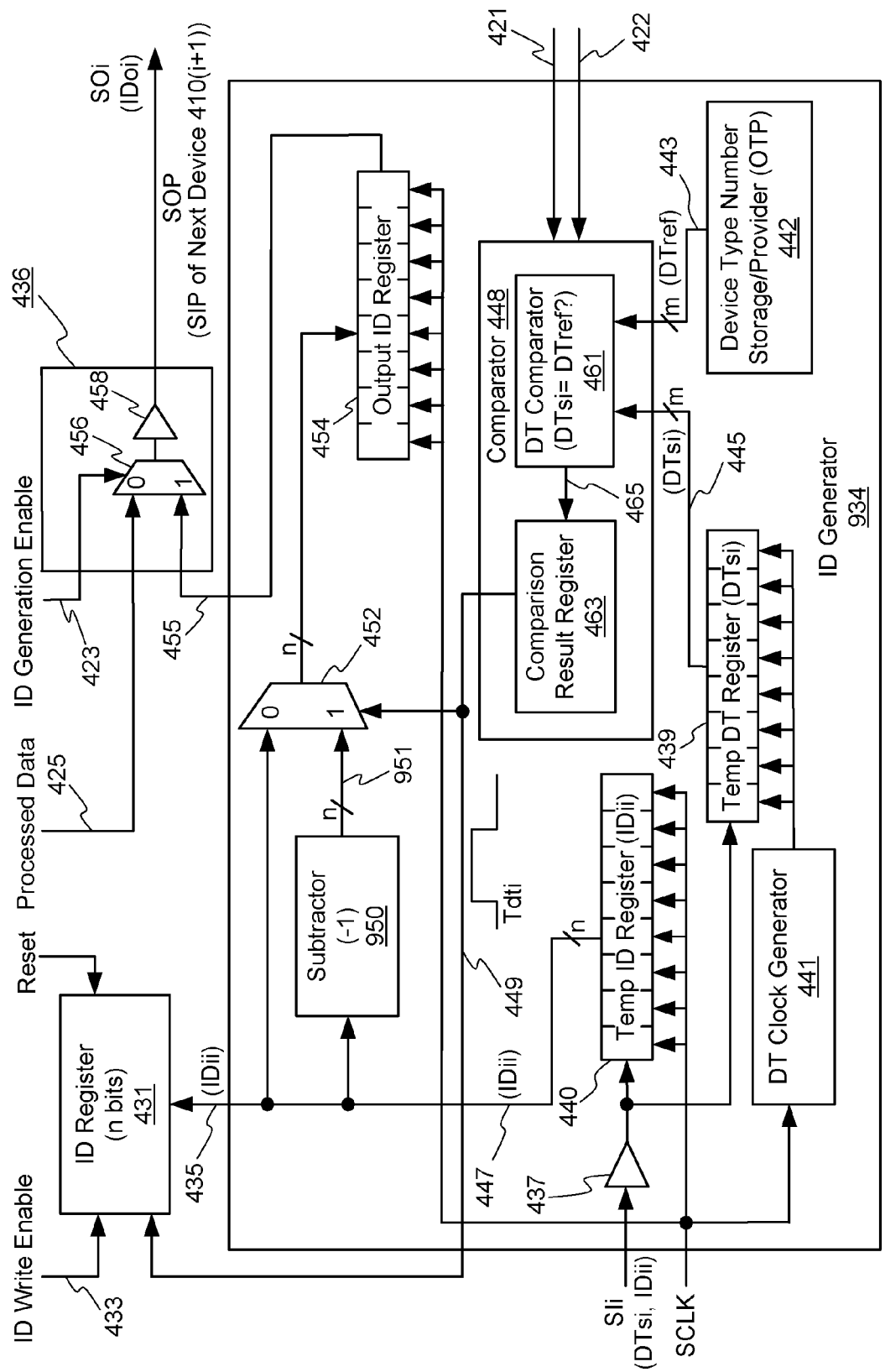
FIG. 13A is a block diagram illustrating another example of the ID generator including a subtractor.

FIG. 13A shows another example of the ID generator. An ID generator 934 shown in FIG. 13A is similar to that of FIG. 6D. A difference is that the ID generator 934 has a subtractor 950, instead of the adder 450 of FIG. 6D. The subtractor 950 performs the subtraction of one from the received ID, IDii, to provide a calculated signal 951 containing a subtracted ID to the selector 452. With such a subtraction, consecutive IDs from high to low are established.

Figure 13B:
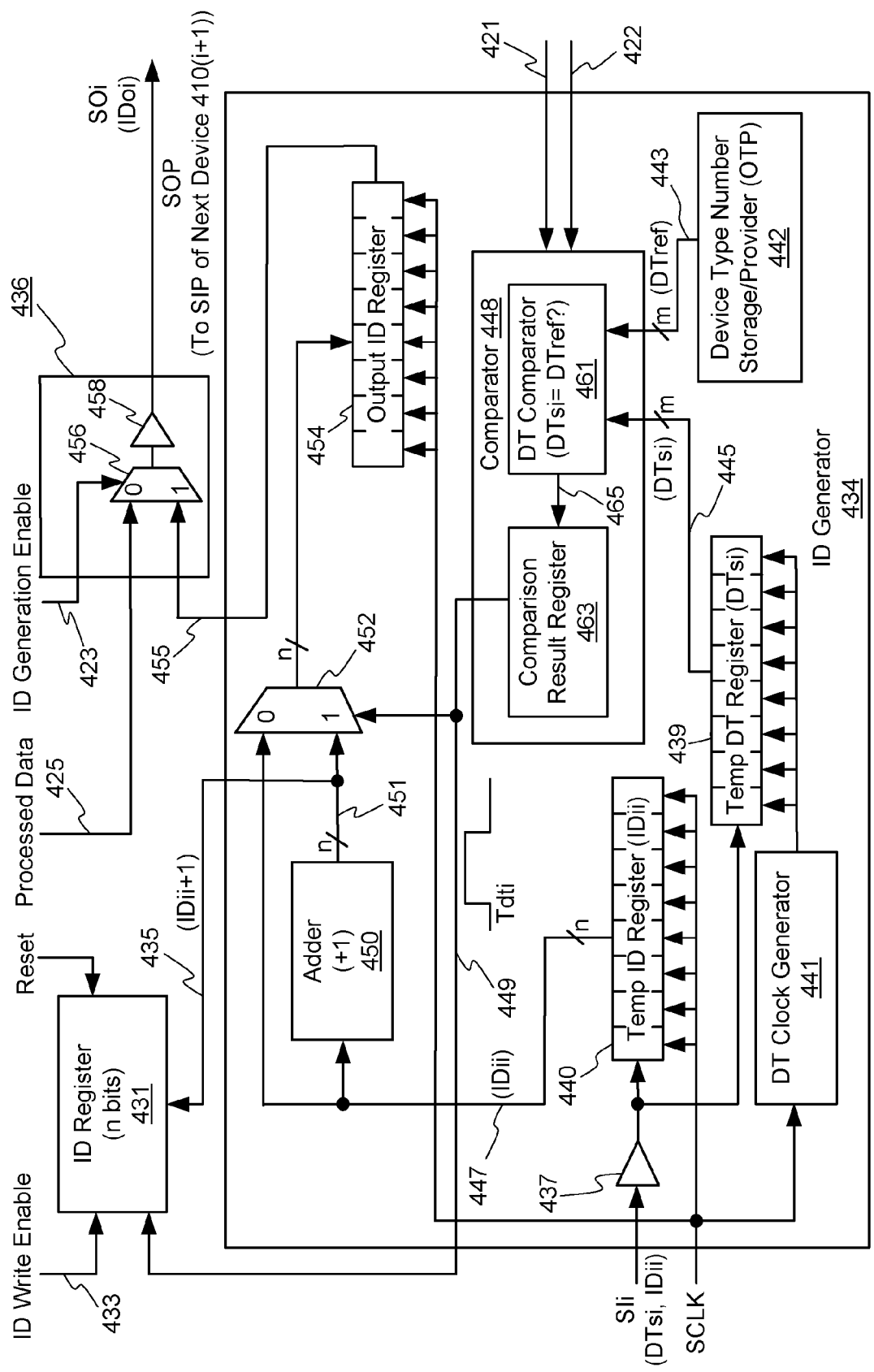
FIG. 13B is a block diagram illustrating another example of the ID generator.

FIG. 13B shows another example of the ID generator. The ID generator is almost identical to one shown in FIG. 6D. A difference is that in the ID generator 434 of FIG. 13B, the added ID (IDii+1) by the adder 450 is provided to the ID register 431. Thus, the ID registered (or assigned) in a device is the ID generated by that device and the generated ID is transferred to a next device.

Figure 14:
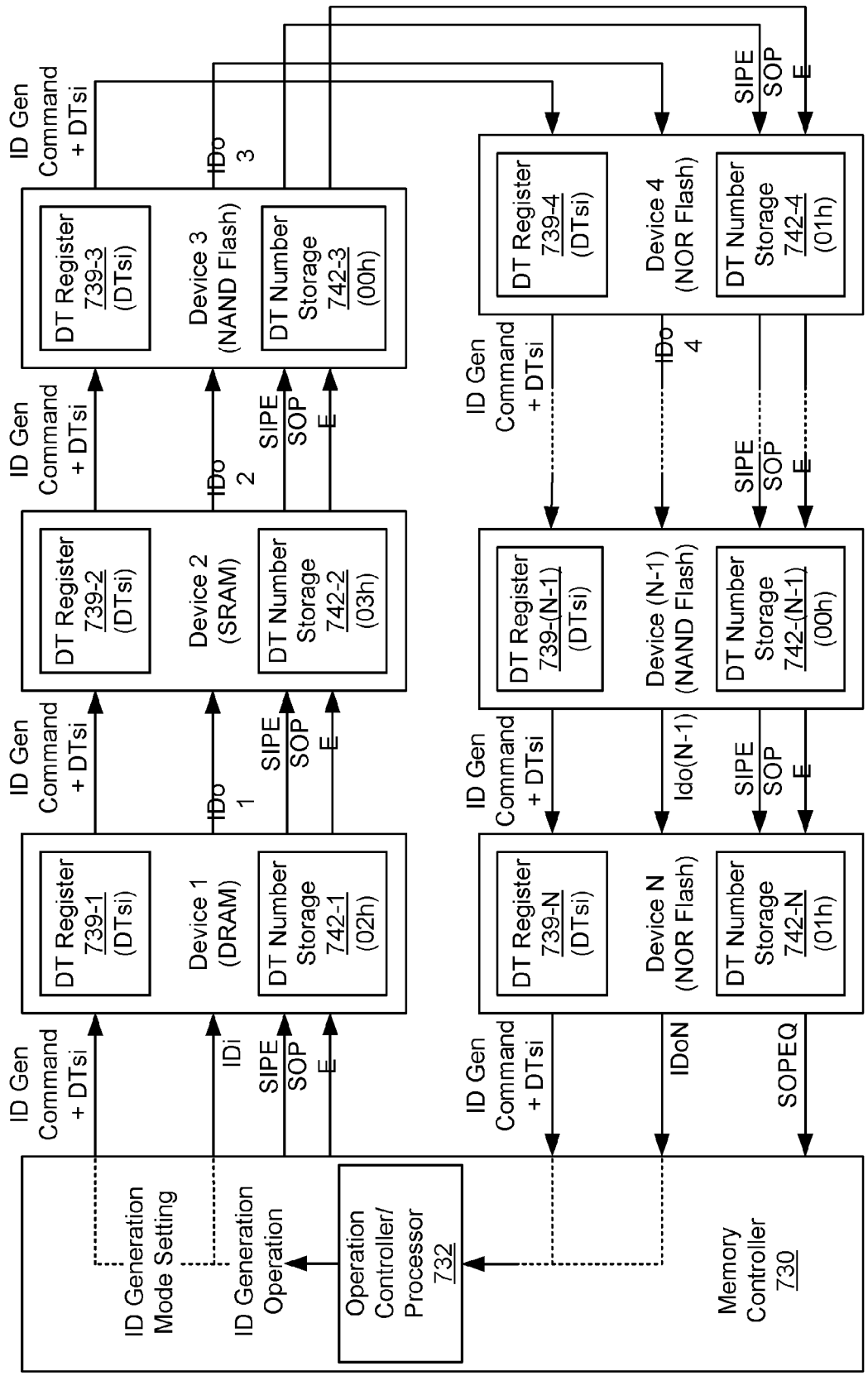
FIG. 14 is a block diagram illustrating a system including a memory controller and a plurality of memory devices of mixed type in a serial interconnection operating to establish IDs.

FIG. 14 shows a plurality of devices in a serial interconnection configuration operating to establish IDs. Referring to FIG. 14, devices 1-N are serially interconnected. In this example, devices 1 and N of the serial interconnection configuration are connected to a memory controller 730 having an operation controller/processor 732. The interconnected devices include different types of memory devices: DRAMs, SRAMs, NAND Flash memories and NOR Flash memories. A pre-defined device type (DT) number or information assigned as shown in Table 3 above is associated with each of the devices. The DT numbers are programmably stored in DT number storages 742-1-742-N included in devices 1-N, respectively. Also, devices 1-N have temporary DT registers 739-1-739-N, respectively. An ID number generation can start with distinct number assignment. In the example shown in FIG. 14, the device type (DTsi) and the device identifiers (IDi, IDo1-IDoN) are separately transmitted and are shown by separate routes. However, the DTsi and the IDs are transmitted through the SI link. The operation controller/processor 732 controls the transmission of the DT and the ID separately as the serial input SI.

Figure 15:
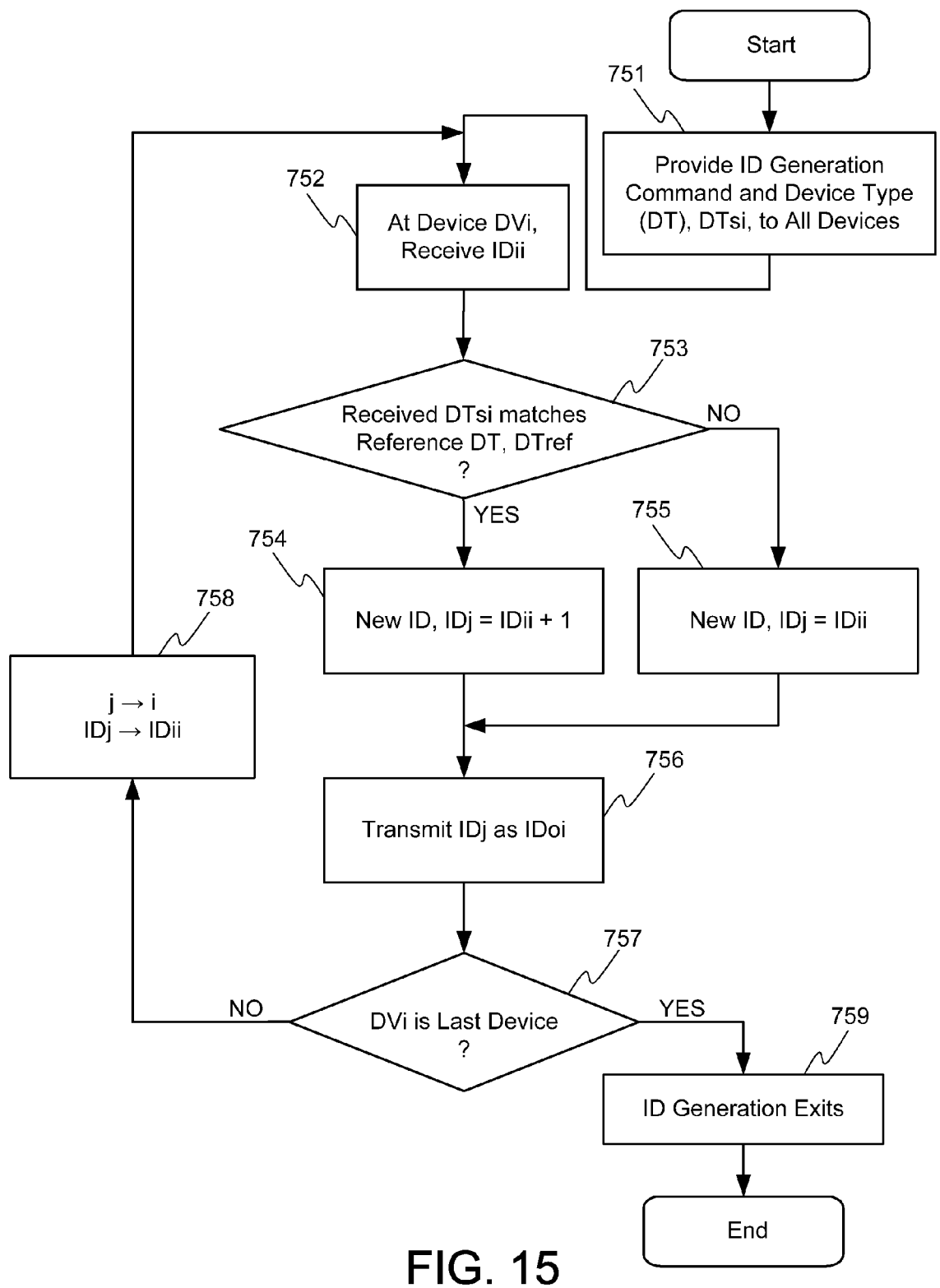
FIG. 15 is a flow chart of an ID generation method applied to the system shown in FIG. 14.
Figure 16:
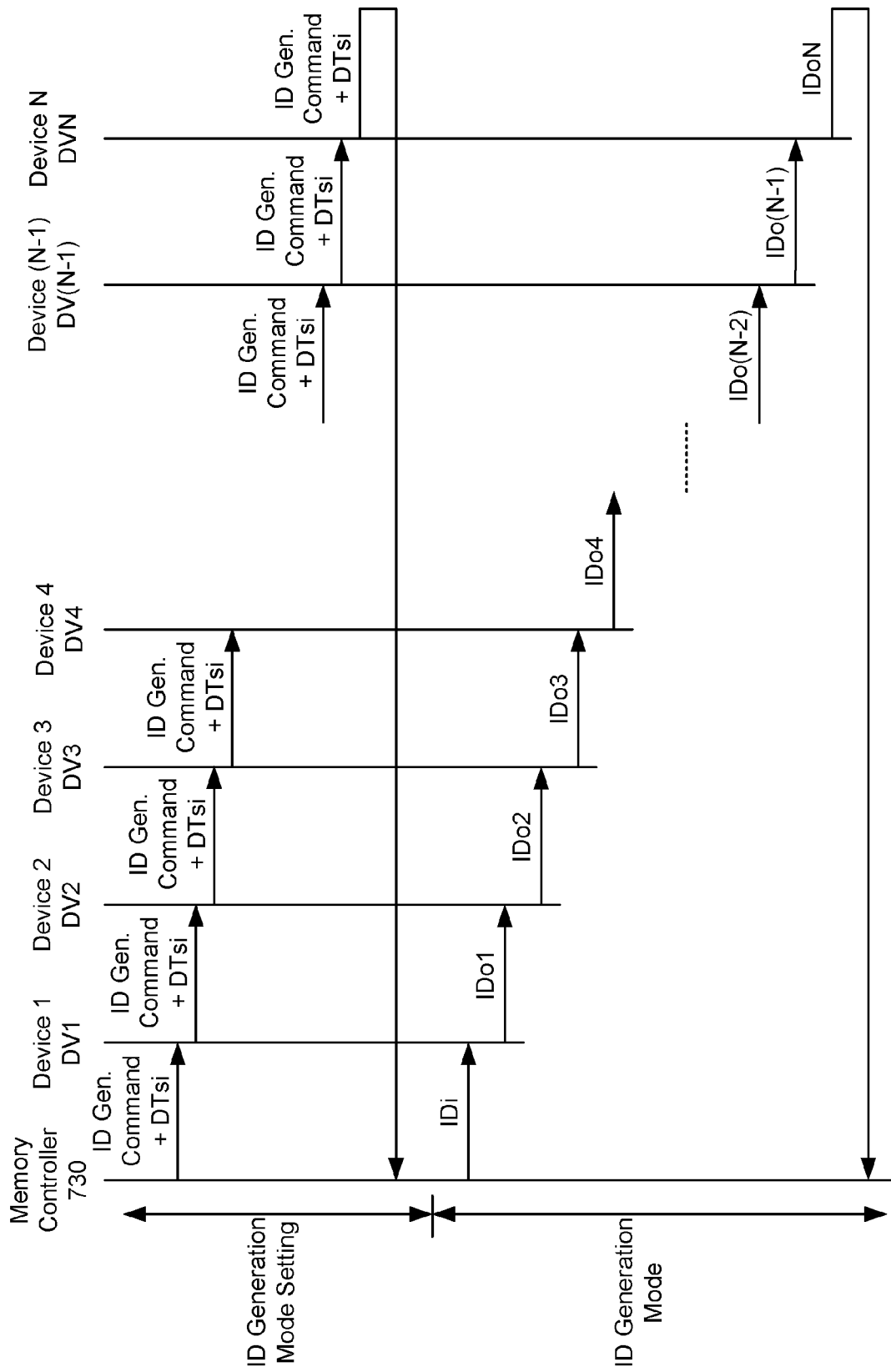
FIG. 16 is a schematic diagram illustrating a protocol conducted in the device shown in FIG. 14.

FIG. 15 shows a method of ID generation applied to the serially interconnected devices of FIG. 14. FIG. 16 shows a protocol conducted in the serially interconnected devices shown in FIG. 14.

Referring to FIGS. 14-16, first the ID generation mode setting operations are performed and thereafter, the ID generation operations are performed. The ID generation command and the device type (DT), DTsi, are provided by the operation controller/processor 732 of the memory controller 730 and serially transferred through device 1 to device N. Thus, the ID generation command and the device type DTsi are provided to all devices (step 751). The DTsi is held in the DT registers 739-1-739-N. Thereafter, the memory controller 730 activates devices 1-N for the ID generation. Thus, the operation controller/processor 732 sends the initial ID, IDi, as the SI format for the ID generation.

The ID generator of a device DVi receives the ID, IDii (step 752). Then, the DTsi previously held in the temporary DT register is compared to a reference device type DTref (step 753). If the DTsi matches the DTref, the received ID will be incremented to produce a new ID, IDj (step 754). If there is no match at step 753, the received ID, IDii, will be maintained as a new IDj (step 755). Thus, at step 755, the ID generation is skipped or bypassed. After step 754 or 755, the new IDj is outputted by the ID generator of the device DVi to a next device DV(i+1). If the present device DVi is not the last device of the serial interconnection configuration (NO at step 757), the next device DV(i+1) becomes a device DVi and the device ID, IDii, is received thereby (step 758). At the next device, the ID is received as the IDii and the ID generation is repeated. If the present device DVi is the last device (i.e., device N of the serial interconnection configuration) (YES at step 757), the ID generation and skip operations end (step 759).

In the ID generation mode, device 1 receives the initial ID, IDi, and device 1 outputs IDo1. Next device 2 receives IDo1 and outputs IDo2. Similarly, each of the other devices receives ID from the previous device and outputs ID that is provided to the next device.

Figure 17:
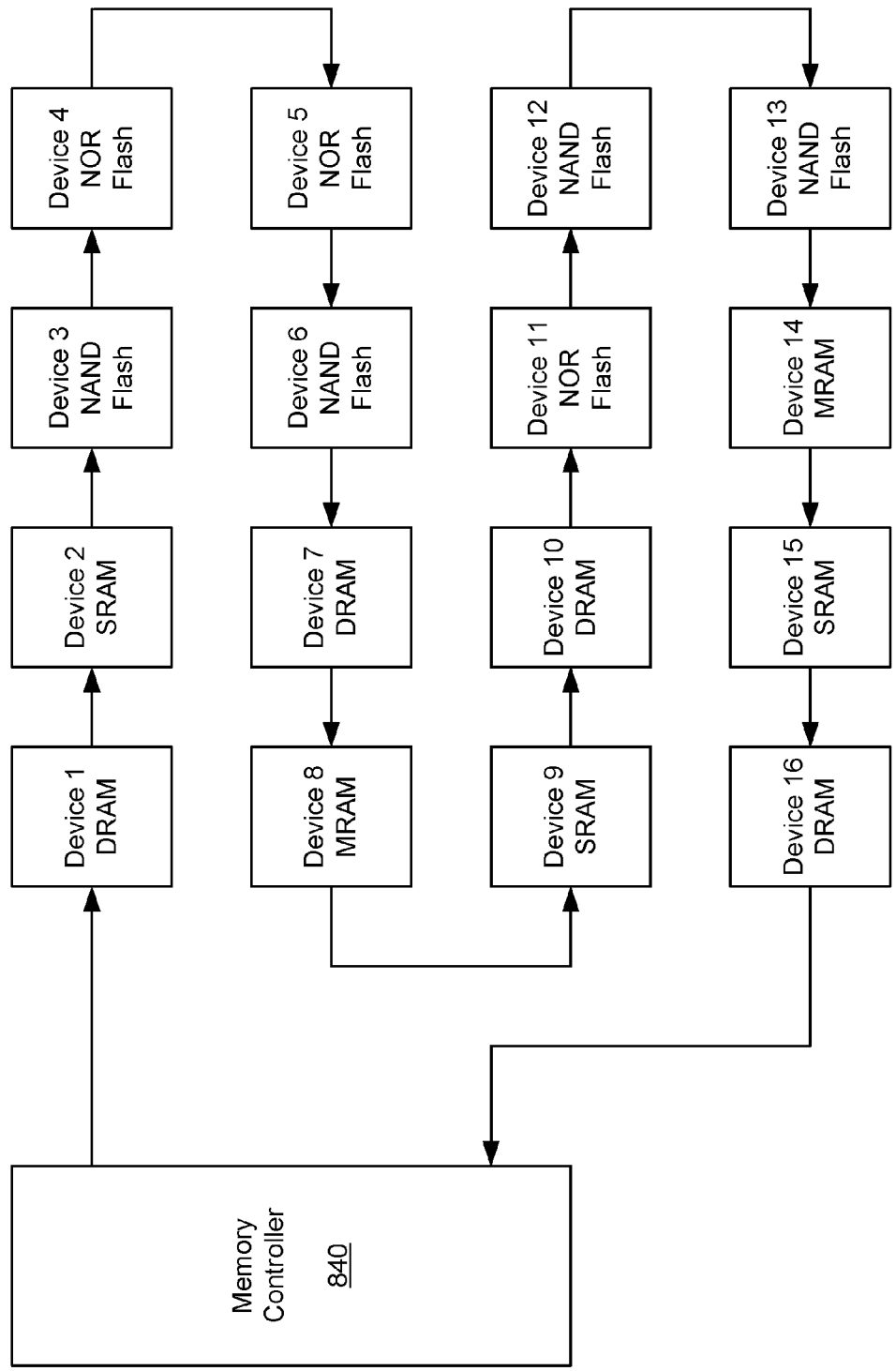
FIG. 17 is a block diagram illustrating a system including a memory controller and a plurality of memory devices of mixed type in a serial interconnection.

FIG. 17 shows a plurality of different type (mixed) devices in a serial interconnection configuration. In this example, devices 1, 7, 10 and 16 include DRAMs; devices 2, 9 and 15 include SRAMs; devices 3, 6, 12 and 13 include NAND Flash memories; devices 4, 5 and 11 include NOR Flash memories; and devices 8 and 14 include MRAMs. Devices 1 and 16 are connected to a memory controller 840.

Figure 18A:
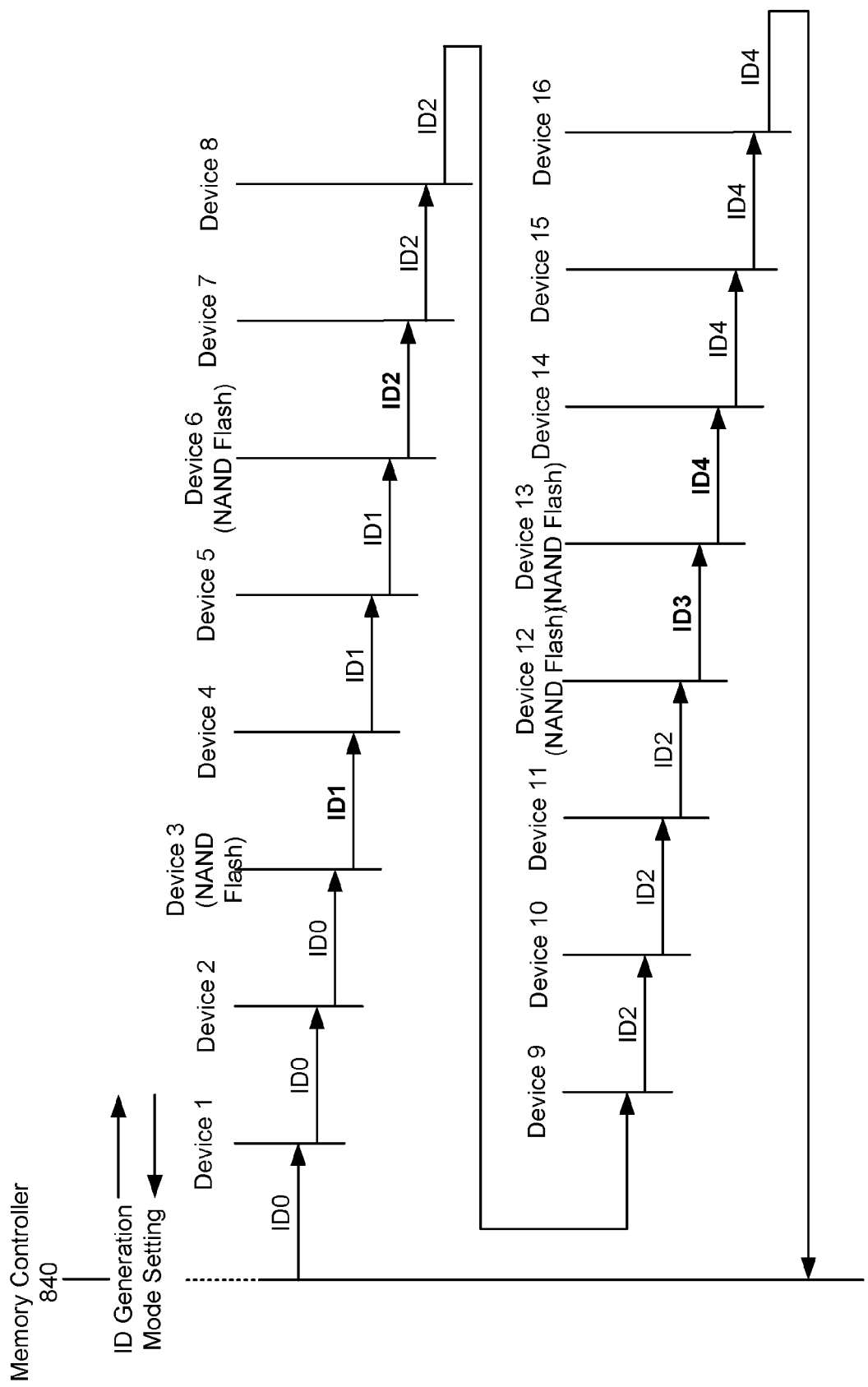
FIG. 18A is a schematic diagram illustrating a protocol conducted in the devices shown in FIG. 17, wherein NAND Flash memories generate IDs.
Figure 18B:
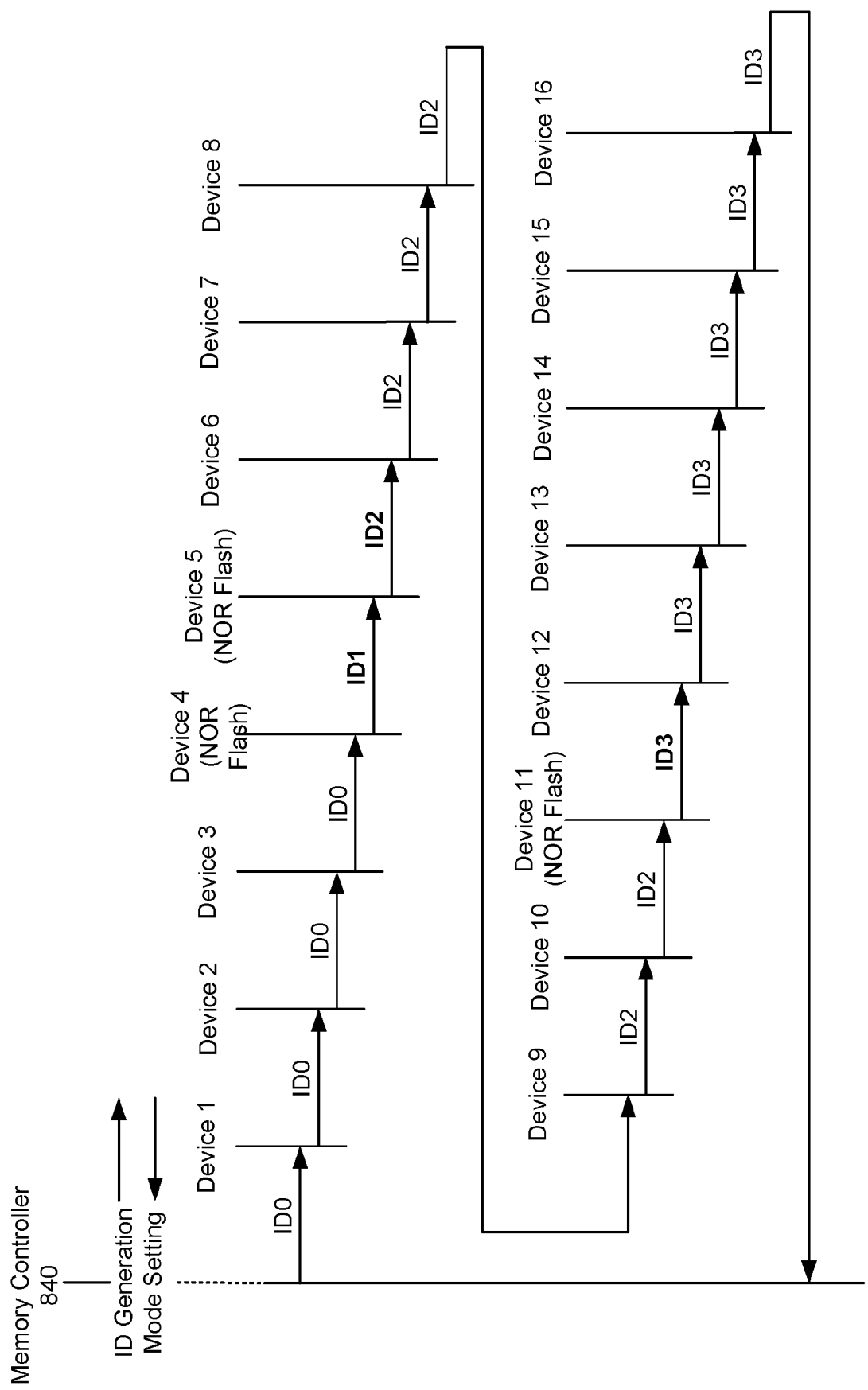
FIG. 18B is a schematic diagram illustrating a protocol conducted in the devices shown in FIG. 17, wherein NOR Flash memories generate IDs.
Figure 18C:
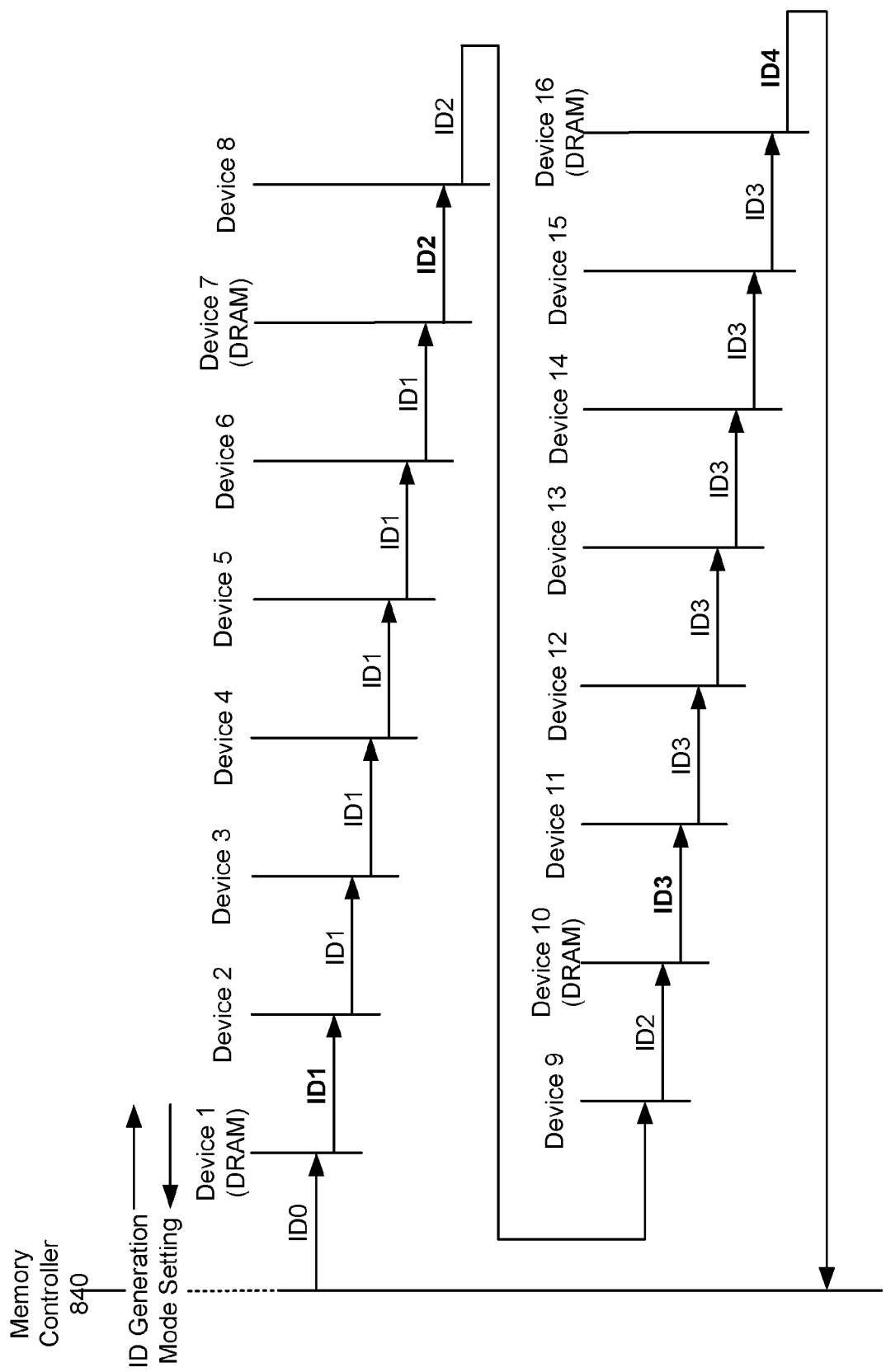
FIG. 18C is a schematic diagram illustrating a protocol conducted in the devices shown in FIG. 17, wherein random access memories (DRAMs) generate IDs.
Figure 18D:
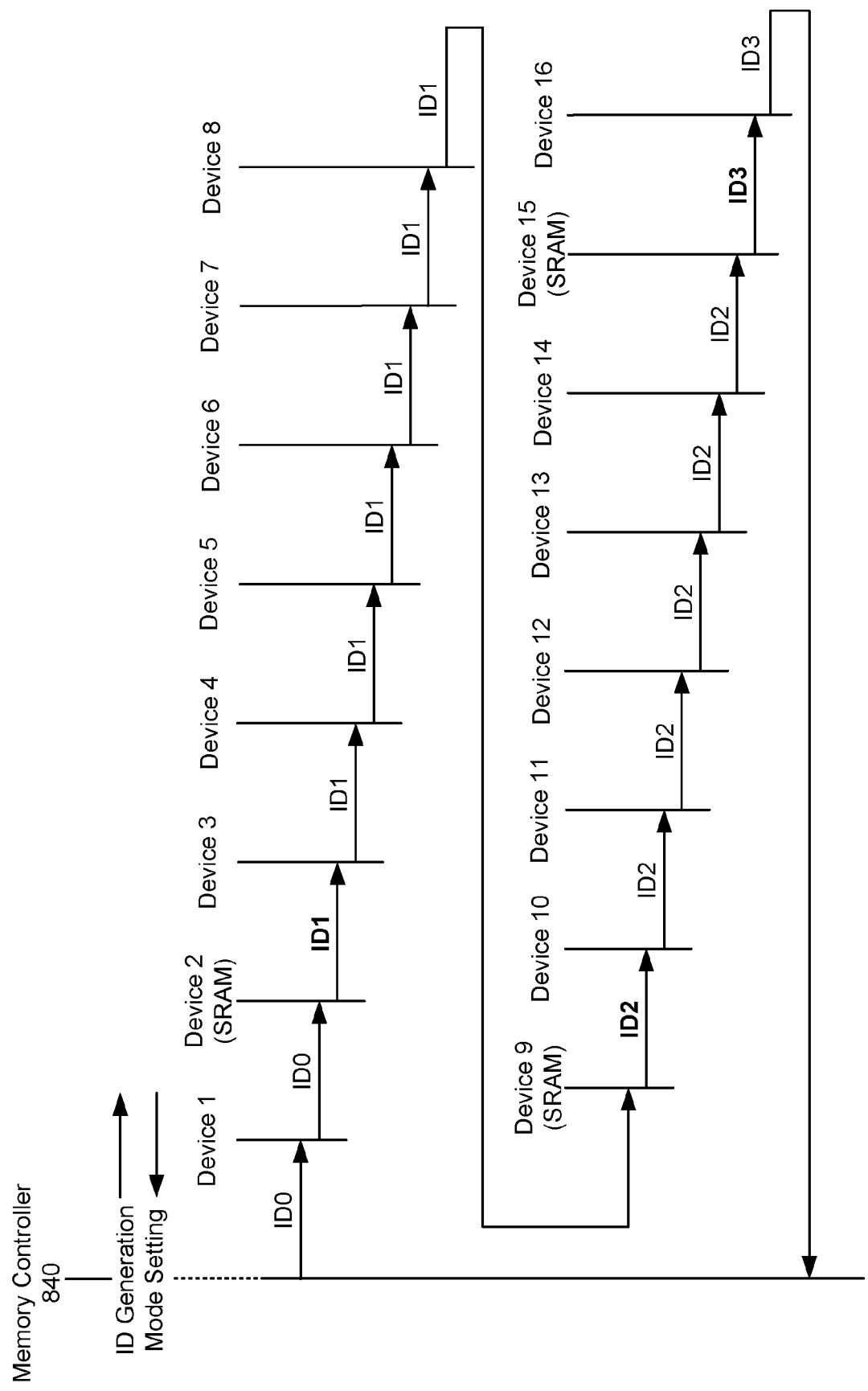
FIG. 18D is a schematic diagram illustrating a protocol conducted in the devices shown in FIG. 17, wherein static random access memories (SRAMs) generate IDs.
Figure 18E:
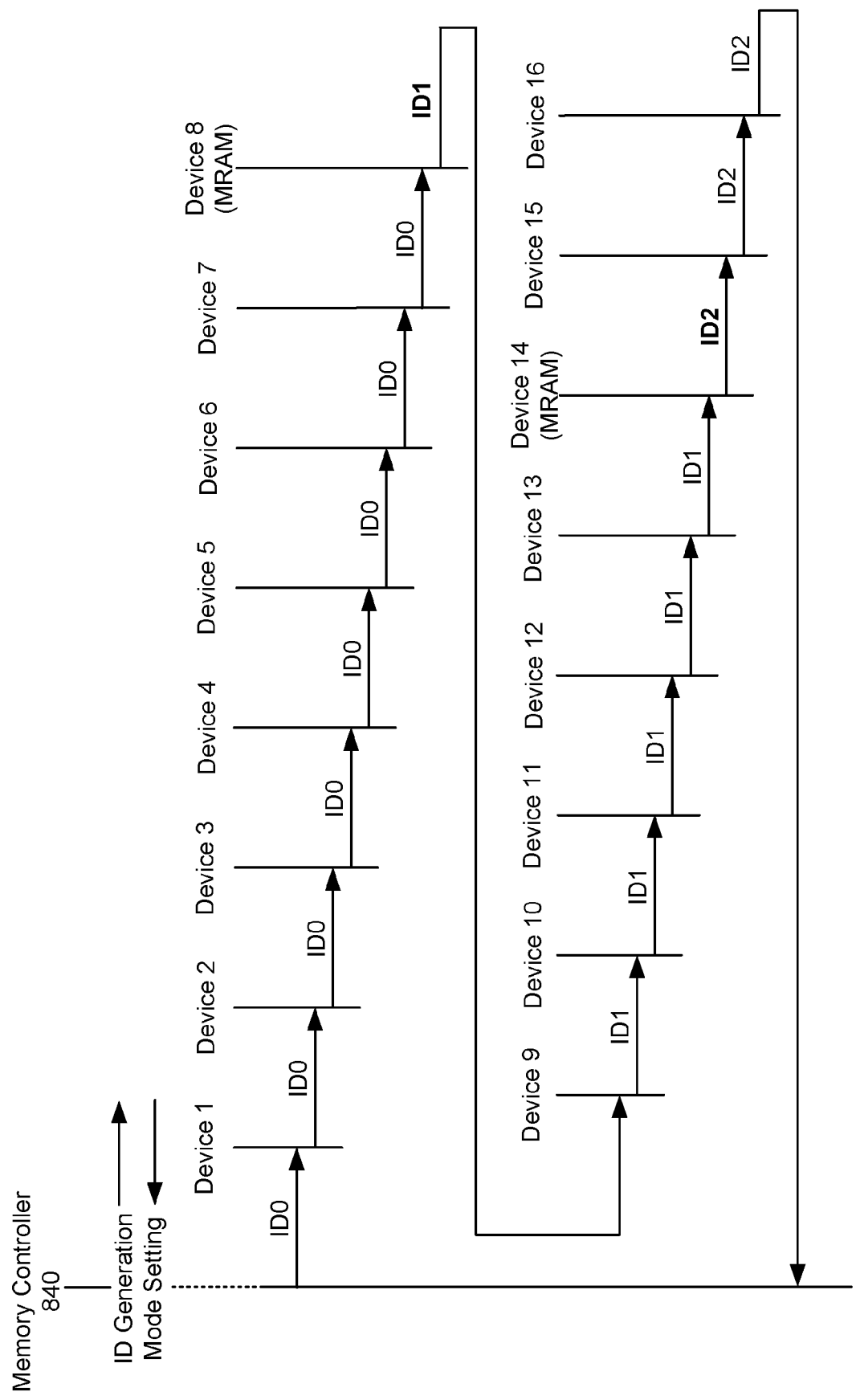
FIG. 18E is a schematic diagram illustrating a protocol conducted in the devices shown in FIG. 17, wherein magnetoresistive random access memories (MRAMs) generate IDs.

Referring to FIG. 17, in a case (1) where the memory controller 840 provides a device type DTnd of a NAND Flash memory as DTsi with an initial ID, only devices 3, 6, 12 and 13 perform the ID generation and the other devices skip or bypass ID generation, as shown in FIG. 18A. In a case (2) where the device type DTsi is a device type DTnr of a NOR Flash memory, only devices 4, 5 and 11 perform the ID generation and the other devices skip ID generation, as shown in FIG. 18B. In a case (3) where the device type DTsi is a device type DTdm of a DRAM, only devices 1, 7, 10 and 16 perform the ID generation and the other devices skip ID generation, as shown in FIG. 18C. In a case (4) where the device type DTsi is a device type DTsm of an SRAM, only devices 2, 9 and 15 perform the ID generation and the other devices skip ID generation, as shown in FIG. 18D. In a case (5) where the device type DTsi is a device type DTmm of an MRAM, only devices 8 and 14 perform the ID generation and the other devices skip ID generation, as shown in FIG. 18E.

Table 6 summarizes the input device identifier IDi and the generated device identifier IDo of each of the devices, in the cases of device types of (1) NAND Flash memory (DTnd), (2) NOR Flash memory (DTnr), (3) DRAM (DTdm), (4) SRAM (DTsm) and (5) MRAM (DTmm).

TABLE 6

| | | Provided Device Type DTsi and Input and Output IDs | | | | | | | | |
|---|---|---|---|---|---|---|---|---|---|---|
| | Device | (1) | | (2) | | (3) | | (4) | | (5) |
| No | Device | DTnd | | DTnr | | DTdm | | DTsm | | DTmm |
| DV# | Type | IDi | IDo | IDi | IDo | IDi | IDo | IDi | IDo | IDi | IDo |
| 1 | DRAM | 0 | 0 | 0 | 0 | 0 | 1 | 0 | 0 | 0 | 0 |
| 2 | SRAM | 0 | 0 | 0 | 0 | 1 | 1 | 0 | 1 | 0 | 0 |
| 3 | NAND Flash | 0 | 1 | 0 | 0 | 1 | 1 | 1 | 1 | 0 | 0 |
| 4 | NOR Flash | 1 | 1 | 0 | 1 | 1 | 1 | 1 | 1 | 0 | 0 |
| 5 | NOR Flash | 1 | 1 | 1 | 2 | 1 | 1 | 1 | 1 | 0 | 0 |
| 6 | NAND Flash | 1 | 2 | 2 | 2 | 1 | 1 | 1 | 1 | 0 | 0 |
| 7 | DRAM | 2 | 2 | 2 | 2 | 1 | 1 | 1 | 1 | 0 | 0 |
| 8 | MRAM | 2 | 2 | 2 | 2 | 1 | 1 | 1 | 1 | 0 | 1 |
| 9 | SRAM | 2 | 2 | 2 | 2 | 1 | 1 | 1 | 2 | 1 | 1 |
| 10 | DRAM | 2 | 2 | 2 | 2 | 1 | 2 | 2 | 2 | 1 | 1 |
| 11 | NOR Flash | 2 | 2 | 2 | 3 | 2 | 2 | 2 | 2 | 1 | 1 |
| 12 | NAND Flash | 2 | 3 | 3 | 3 | 2 | 2 | 2 | 2 | 1 | 1 |
| 13 | NAND Flash | 3 | 4 | 3 | 3 | 2 | 2 | 2 | 2 | 1 | 1 |
| 14 | MRAM | 4 | 4 | 3 | 3 | 2 | 3 | 2 | 2 | 1 | 2 |
| 15 | SRAM | 4 | 4 | 3 | 3 | 3 | 3 | 2 | 3 | 2 | 2 |
| 16 | DRAM | 4 | 4 | 3 | 3 | 3 | 4 | 3 | 3 | 2 | 2 |

When the DTsi matches the DT of the specific device, the ID generation based on the +1 operation is performed and the pre-calculated ID is latched (or registered) as the ID in the ID register of that device. In Table 6 above, the IDs generated by the specific devices are indicated in bold.

Figure 19A:
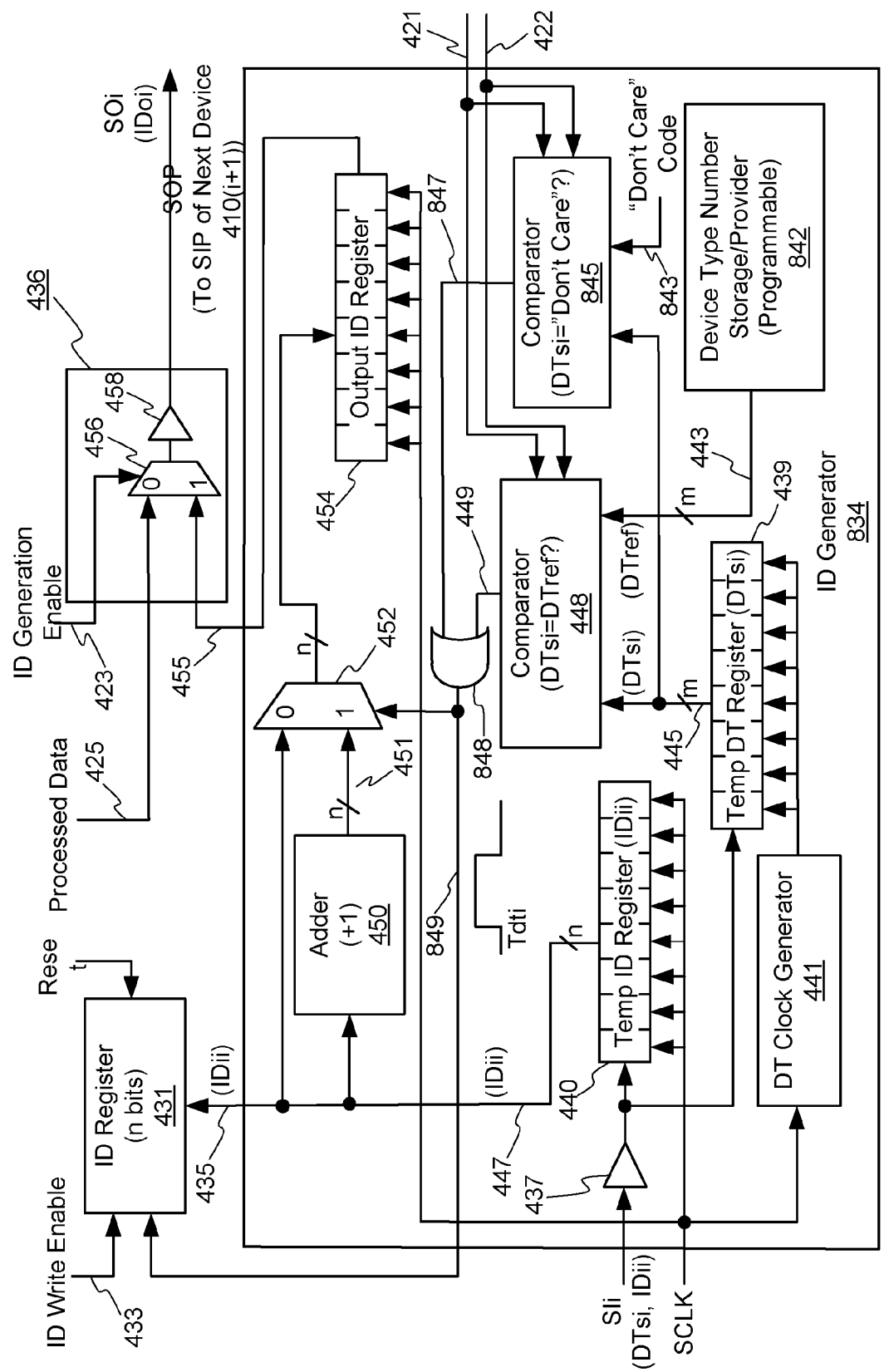
FIG. 19A illustrates another example of the ID generator that is applied to the memory devices serially interconnected as shown in FIG. 17.

FIG. 19A shows another example of the ID generator that is applied to the memory devices serially interconnected as shown in FIG. 17.

Figure 19B:
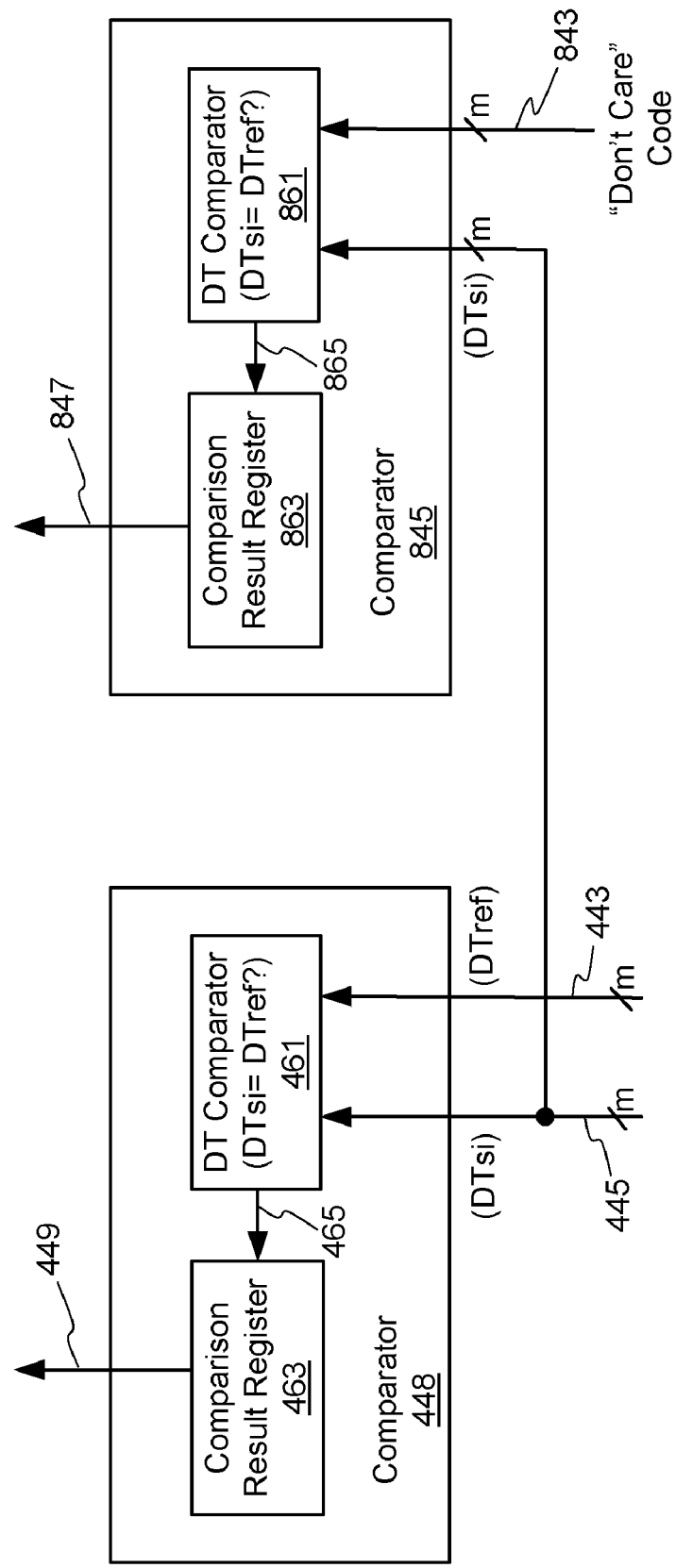
FIG. 19B is a block diagram illustrating comparators shown in FIG. 19A.

Referring to FIG. 19A, an ID generator 834 includes similar circuitry to that of FIG. 6D and further includes an additional comparator 845 and an OR gate 848. In this example, the same or corresponding circuit elements and components to those of FIG. 6D are referenced by the same numerals. The two comparators 448 and 845 and the OR gate 848 perform the functions of the device type match determination and the ID selection control. A device type number storage/provider 842 is a one-time-programmable (OTP) memory or a programmable memory that can store a device type number or value as a device type reference (DTref) programmed to the device prior to performing the ID generation function. The ID generation control signal 421 and the ID generation mode exit signal 422 are provided to both of the comparators 448 and 845, so that the determination time Tdti and its active period Tm are defined by the two signals 421 and 422. A more detailed circuit of the comparators 448 and 845 is shown in FIG. 19B. The comparator 845 includes a DT comparator 861 and a comparison result register 863 that receives a comparison result signal 865 from the DT comparator 861. The ID generation performed by the ID generator 834 is shown in FIG. 20.

Figure 20:
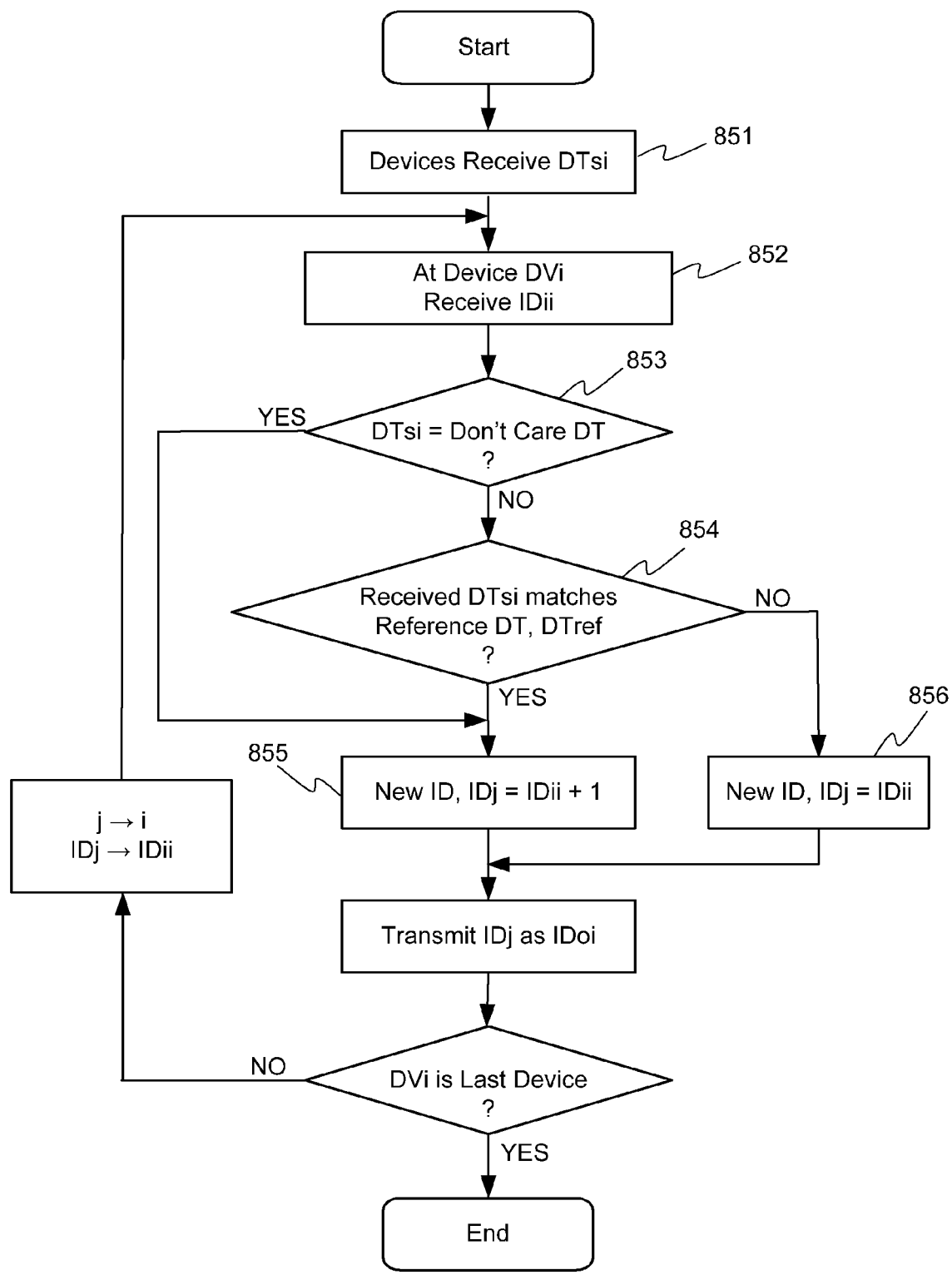
FIG. 20 is a flow chart illustrating an ID generation method applied to the device shown in FIG. 17.

FIG. 20 shows a flow chart illustrating an ID generation method applied to the device shown in FIG. 17.

Referring to FIGS. 16, 17, 19A, 19B and 20, if the memory controller 840 sends a device type (DT), DTsi, and the devices receive it (step 851). If the DTsi is a "don't care", all devices shall perform the ID generation as shown in FIG. 16. The "don't care" information bits are specifically assigned. A device DVi receives an ID, IDii and the ID generation process starts (step 852). It is determined whether the received DT is the "don't care" or not (step 853). In a case where the DTsi is the "don't care", a device type determination step 854 is not performed and always a new ID, IDj, is generated for a next device DV(i+1) (step 855). If the DTsi is not the "don't care", dependent upon the received DTsi, the new ID generation step 855 or an ID generation skip step 856 is performed. Other steps are the same as those shown in FIG. 11. The IDs generated based on the "don't care" DT are shown in FIG. 15.

With reference to FIG. 19A, the DTsi contained in the SI is fed to the serial-to-parallel register 439, which in turn provides the m-bit parallel DTsi to the comparators 448 and 845. The comparator 845 receives a "don't care" code signal 843 from a code source (not shown) and determines whether the received DTsi matches the "don't care" code or not, in response to the ID generation control signal 421. Also, the reference device type DTref of m-bits is provided by a device type number storage/provider 842 to the comparator 448.

In the case where the received DTsi is the "don't care" device type, the DTsi does not match the DTref, resulting in the DT match signal 449 from the comparator 448 being "low". Simultaneously, the DTsi matches the "don't care", resulting in an additional match signal 847 from the comparator 845 being "high" for time period Tm. Thus, a selection signal 849 from the OR gate 848 becomes "high" and the selector 452 selects the calculation signal 451 having a +1 operation value. These operations are depicted in steps 854 and 855 in FIG. 20.

Figure 21:
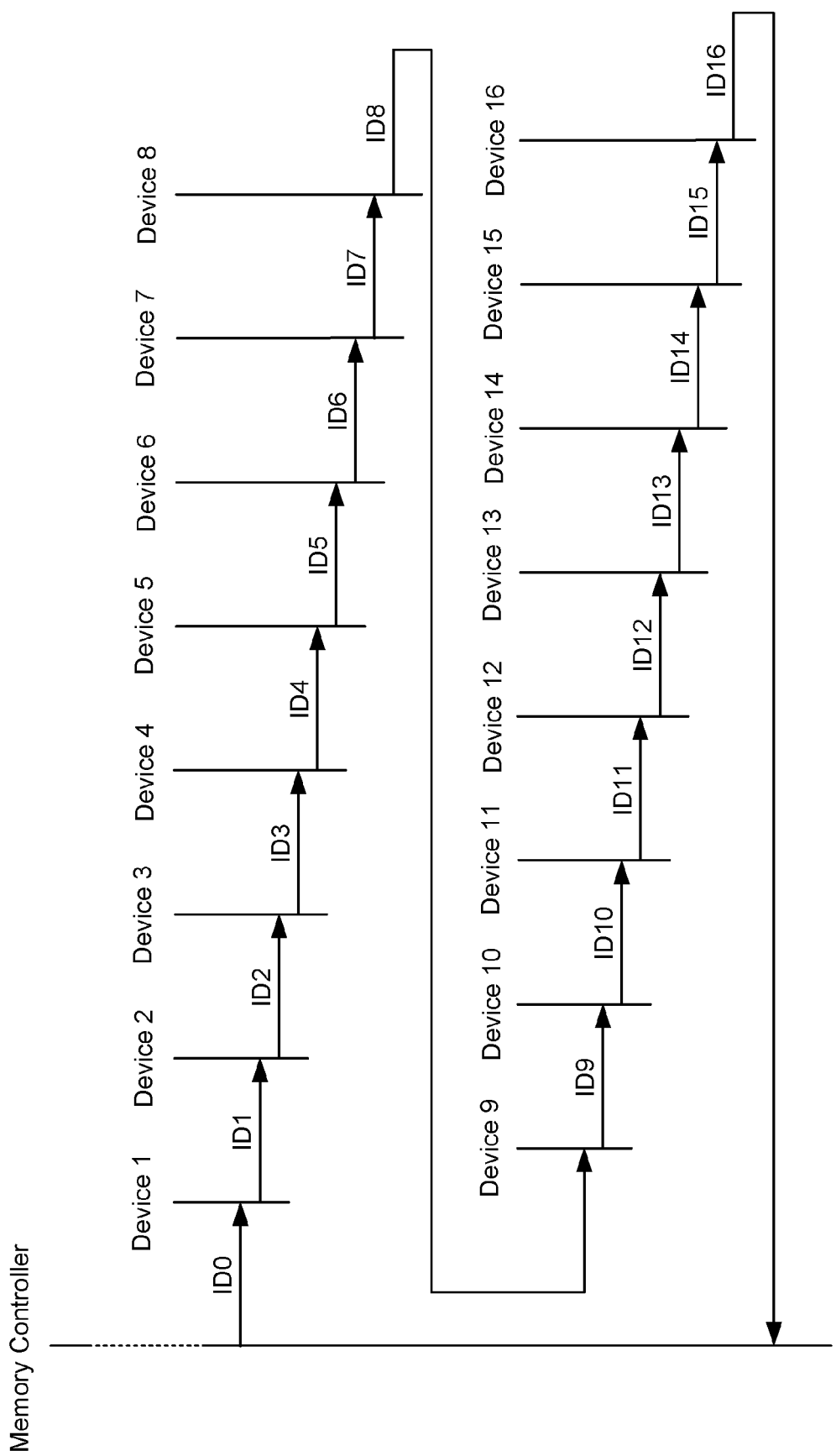
FIG. 21 is a schematic diagram illustrating a protocol conducted in the devices shown in FIG. 17, wherein all of the memory devices generate IDs.

In the case where the DTsi is not the "don't care" device type, the match signal 847 from the comparator 845 is "low". Furthermore, if the DTsi does not match the DTref, the match signal 449 from the comparator 448 will be "low", in response to the ID generation control signal 421. If the DTsi matches the DTref, the match signal 449 will be "high" for the time period Tm, with the result that the selection signal 849 is "high" and the "+1" operation value is selected by the selector 452. These operations are depicted in steps 853, 854 and 855 in FIG. 20. Therefore, the process shown in FIG. 20 can generate consecutive IDs for all devices of mixed type in the serial interconnection as shown in FIG. 21. Also, it can generate consecutive IDs only for specific type device depending upon the selected reference device type DTref.

When the selection signal 849 is "high" resulting from the match determination by the comparator 448 or 845, in response to the "high" selection signal and the ID write enable signal 433, the device type IDii for the present device is latched or registered in the ID register 431.

Figure 22:
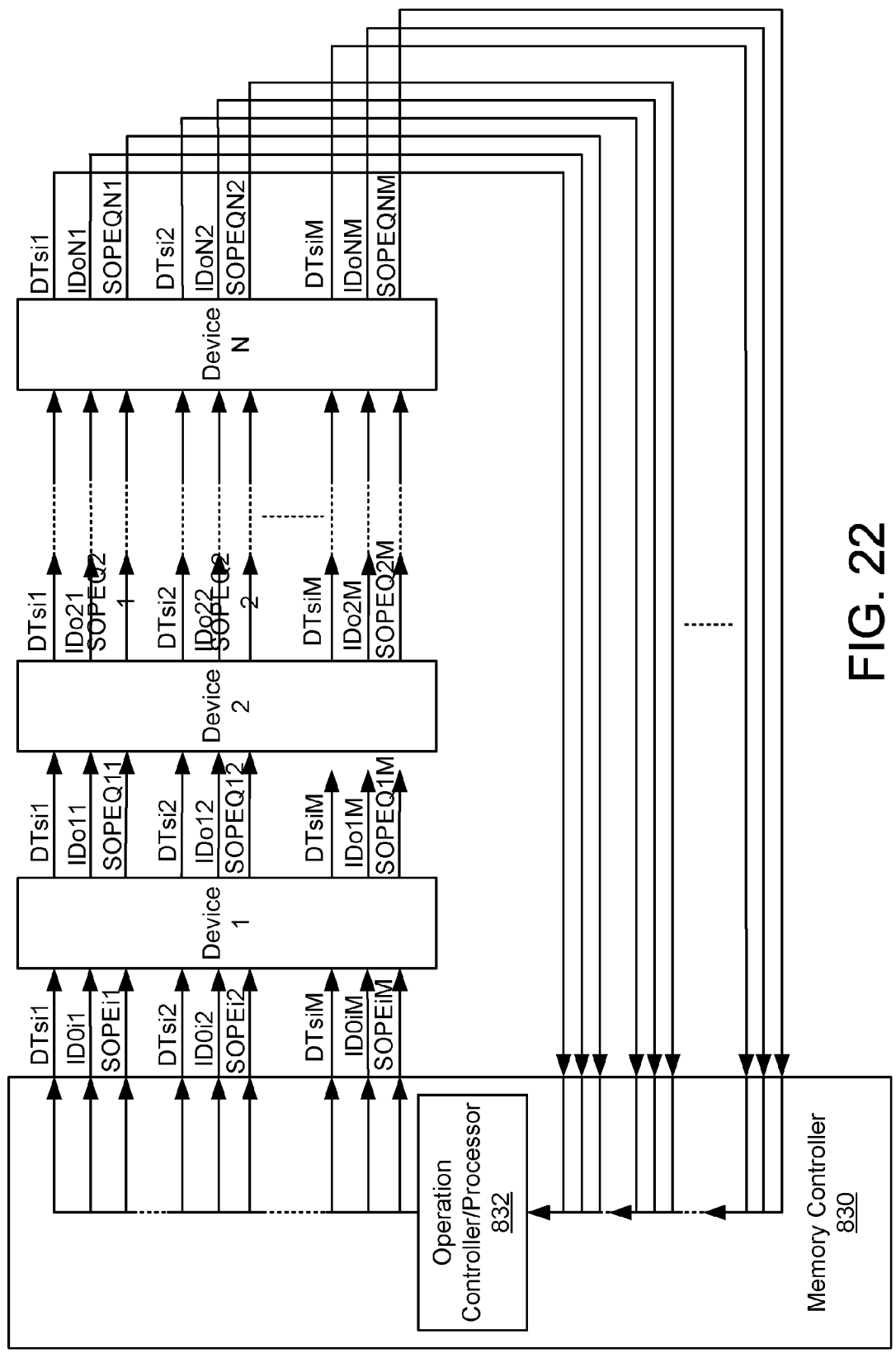
FIG. 22 is a block diagram of another example of ID generation operation in a serial interconnection configuration.

FIG. 22 shows another example of ID generation operation in a serial interconnection configuration. The serial interconnection configuration of devices shown in FIG. 22 is similar to that of FIG. 14.

Referring to FIG. 22, devices 1-N are serially interconnected to a memory controller 830 having an operation controller/processor 832. The N devices are the same or different type memory devices. Each of the devices has an associated device type (DT) number or information pre-defied as shown in Table 3 above. An ID number generation can start with distinct number assignment.

In the example shown in FIG. 22, the device type (DTsi) and the device identifiers (IDi, IDo1-IDON) are separately transmitted and are shown by separate routes. However, DTsi and IDs are transmitted through the SI link. The operation controller/processor 832 controls the transmission of the DT and the ID separately as the serial input SI. These operations are repeated M times.

Figure 23:
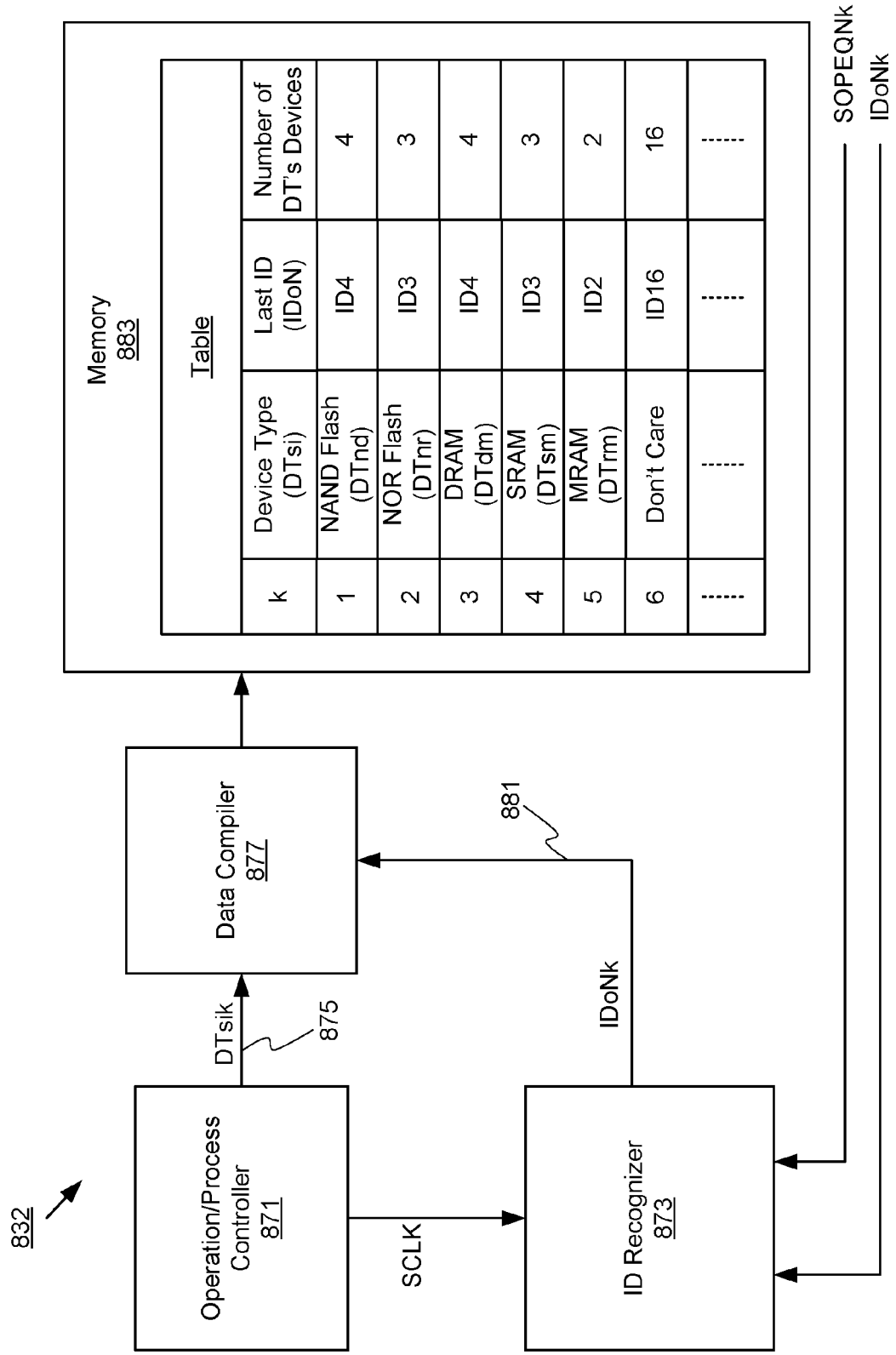
FIG. 23 is a block diagram of an example of a memory controller shown in FIG. 22.

FIG. 23 shows an example structure of the operation controller/processor 832. Referring to FIG. 23, the operation controller/processor 832 includes an operation/process controller 871 that provides the clock signal SCLK to an ID recognizer 873. The operation/process controller 871 provides a DT signal 875 containing a device type DTsik to a data compiler 877. The ID recognizer 873 receives the SOPEQ signal containing the SOPEQNk and the ID signal containing the IDoNk from the last device (i.e., device N) of the serial interconnection configuration. The ID recognizer 873 provides an ID signal 881 containing the IDoNk to the data compiler 877. The data compiler 877 provides a memory 883 with compiled data from the provided DTsik and IDoNk. The memory 883 stores compiled data as a table including the device types and the last IDs. Here, k is a parameter of repeated DT recognition and varies from 1 to M, M being an integer greater than 1.

Figure 24A:
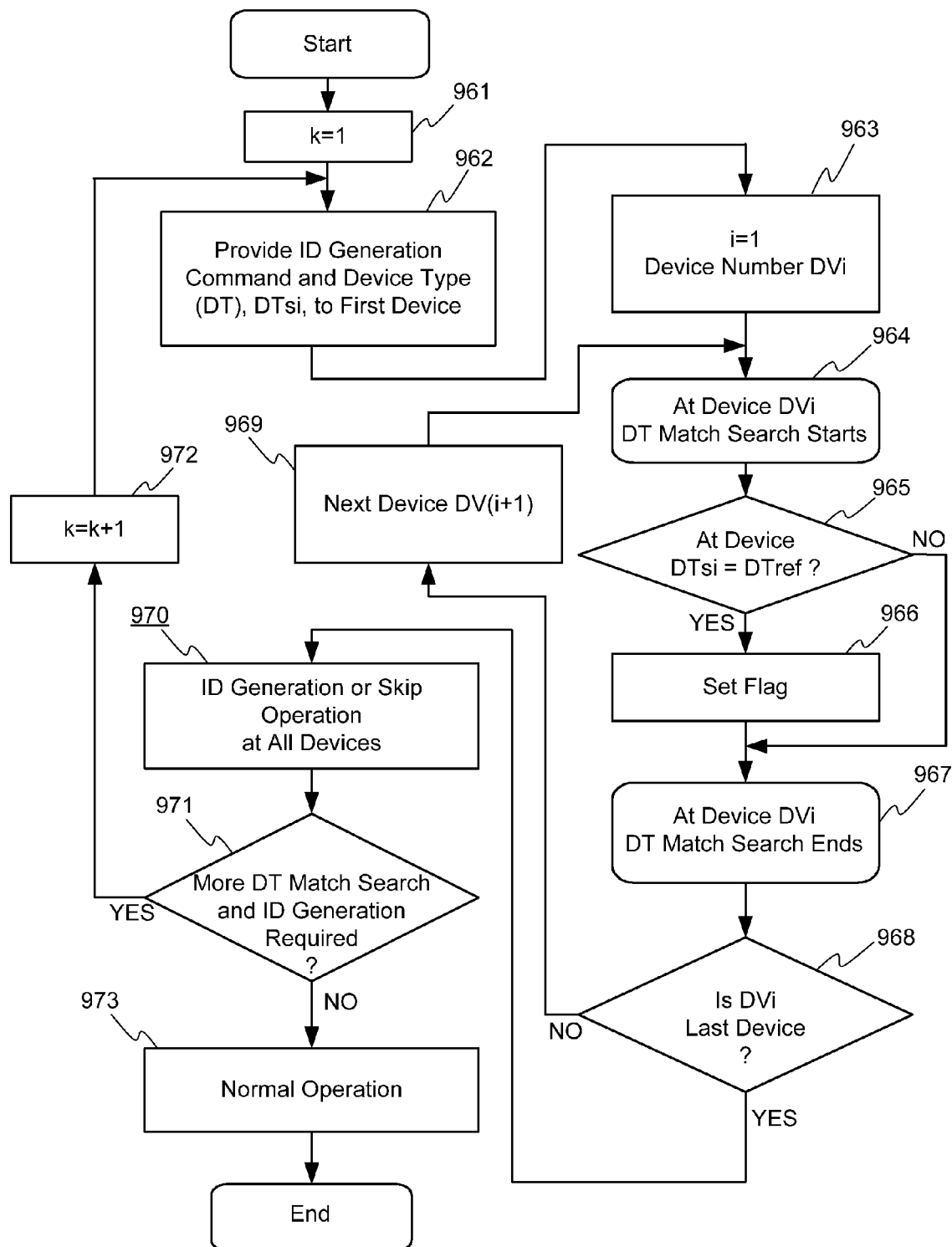
FIG. 24A is a flowchart illustrating an ID generation method performed by the devices shown in FIG. 22.
Figure 24B:
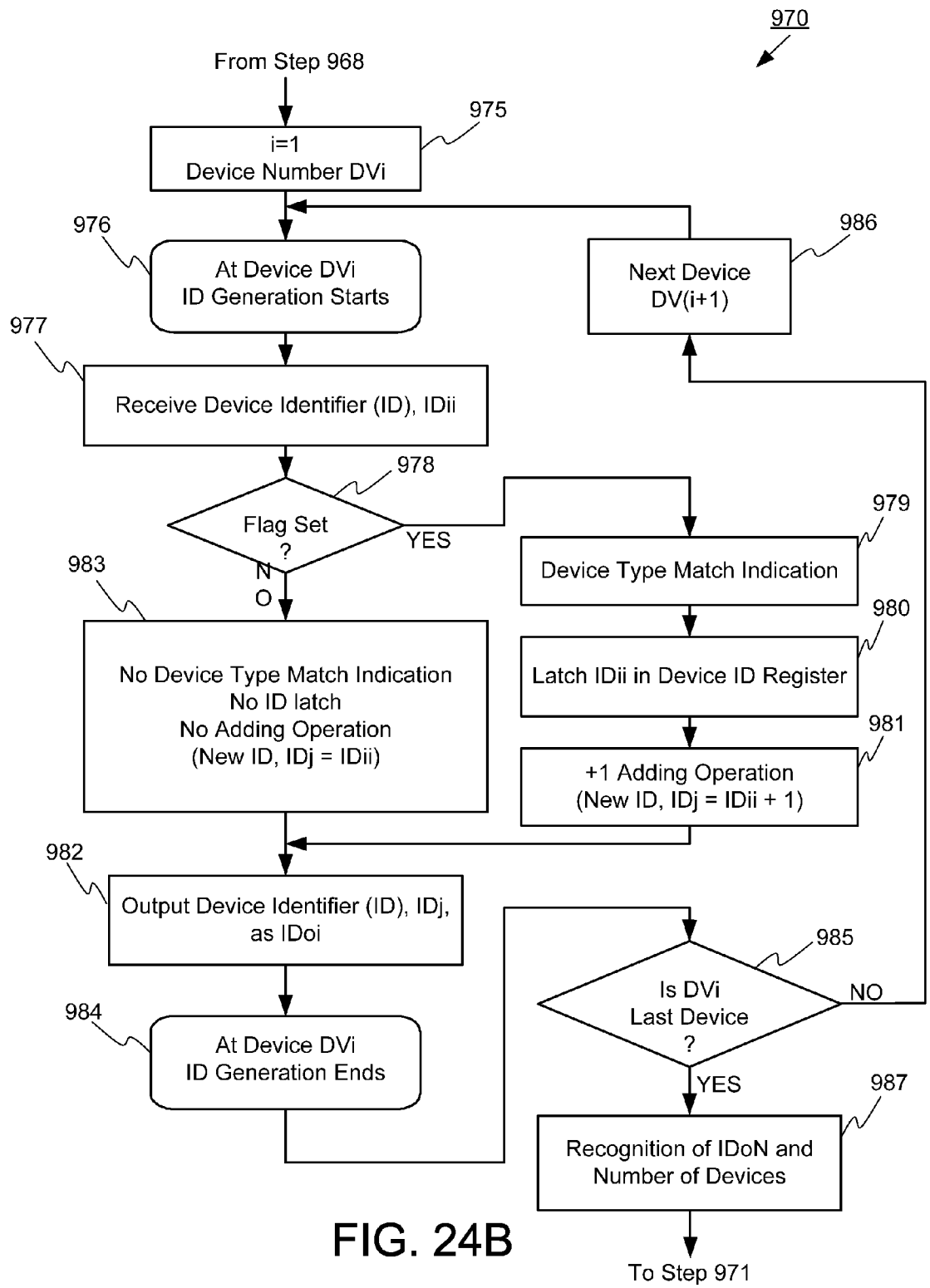
FIG. 24B is a flow chart illustrating part of the method shown in FIG. 24A.
Figure 25:
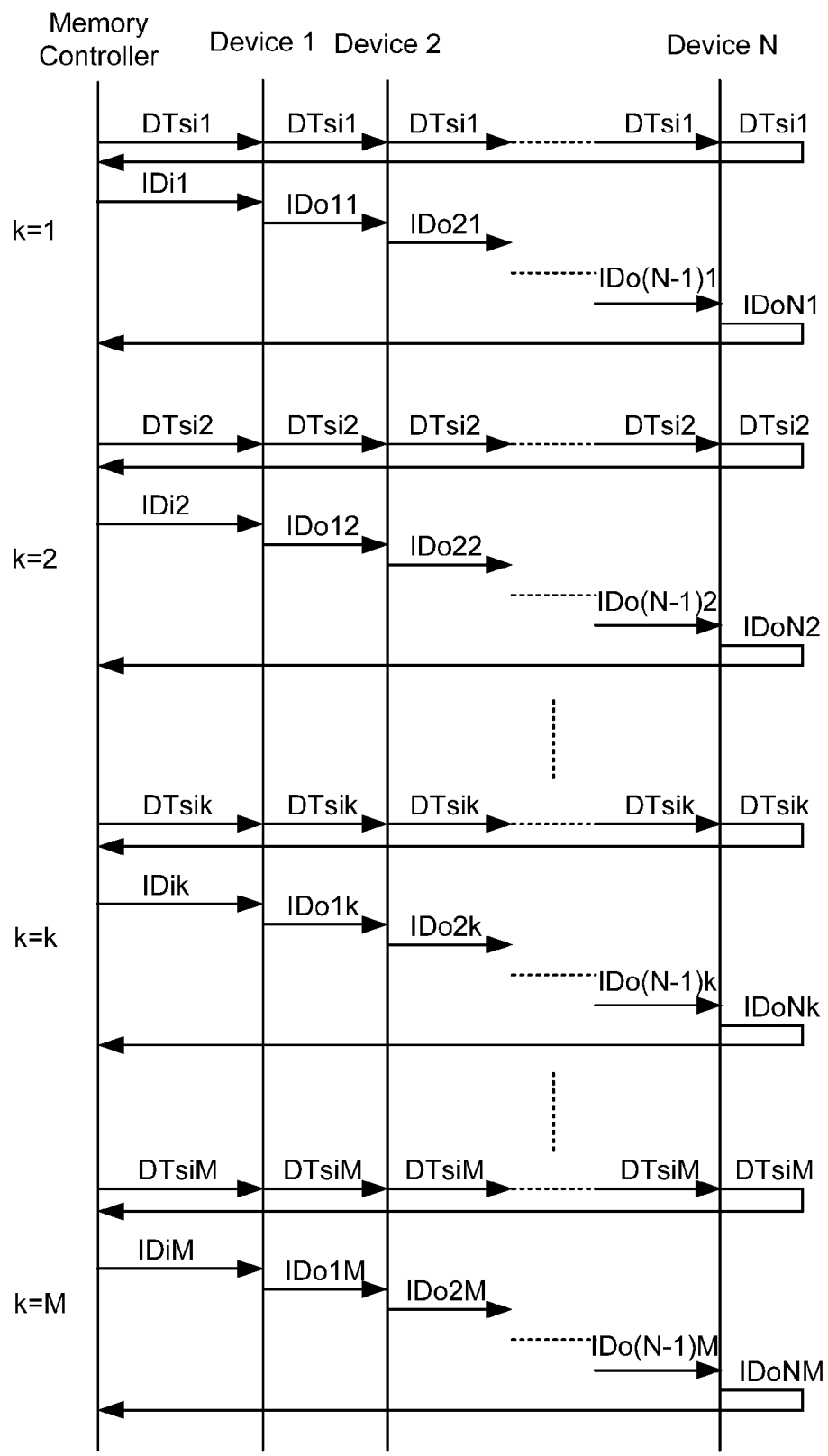
FIG. 25 is a schematic diagram illustrating a protocol conducted in the devices shown in FIG. 22.

FIG. 24A shows an ID generation method performed by the devices shown in FIG. 22. FIG. 24B shows part of the method shown in FIG. 24A. In the example method, the ID generation is performed by the ID generator shown in FIG. 6D. FIG. 25 shows another example of a protocol conducted in the devices shown in FIG. 22.

Referring to FIGS. 6D, 22, 23, 24A, 24B and 25, an operation repetition parameter k is assigned a value of 1 (step 961). The memory controller 830 (the operation controller/processor 832) sends an ID generation command IDGC, a device type DTsik and an initial IDOi1 to device 1 (step 962). Now, a device DVi is assigned as i=1 (step 963). Then, the ID generation occurs at the device DVi and thus, the device type match search starts (step 964). At the device DVi, the DT clock generator 441 of the ID generator 434 generates the DT register clocks in response to the clock signal SCLK and the received DTsik is shifted into the temporary DT register 439. The device type DTsik is held in the temporary DT register 439 of the present device DVi. The DT comparator 461 of the comparator 448 compares the held DTsi to the reference DT, DTref, associated with the device (step 965). If the values or numbers match between the DTsi and the DTref, a flag will be set (step 966). If no matches between the DTsi and the DTref, no flag will be set (i.e., skip). The flag set at step 966 is performed by registering a one-bit comparison result of the signal 465 in the comparison result register 463 of the comparator 448. The DT match search ends at the device DVi (step 967). If the device DVi is not the last device (i.e., device N) (NO at step 968), a next device DV(i+1) will be given (step 969), the DT match search will be repeated at the device DV(i+1). If the device DVi is device N (YES at step 968), it will mean that the operation of the ID match search has been conducted by all of the N devices.

Thereafter, the ID generation and/or skip operations are performed at all of the N devices (step 970). If the DT match search and ID generation operations are required with regard to another device type DTsi (YES at step 971), the memory controller 830 will change the device type DTsik (step 972). Then, with reference to the new device type DTsik, the DT match search and ID generation operations will be repeated. If no more match search and ID generation are required (NO at step 971), the operation mode will be changed to the normal operation mode (step 973).

At step 970, a device DVi is given (step 975). Then, the i-th device DVi starts the ID generation process (step 976). The device DVi (e.g., device 2) receives, from a previous device DV(i-1) (e.g., device 1), a device ID, IDii, and the received ID is held in the temporary ID register 440 (step 977). Then, it is determined whether the flag is set or not (step 978). If the flag is set (at step 966), i.e., a match between the DTsik and the DTref, the DT match signal 449 will be "high" (step 979). This signal indicates to the device to store or latch the received device ID, IDii, (step 980), thereby assigning or establishing the device ID for the present device, DVi.

After step 980, the ID number or value is altered by a "+1" operation (step 981), resulting in a new ID, IDj. The new ID, IDj, is converted to a serial signal (step 982) for transmission to the next device DV(i+1) (e.g., device 3) in the serial interconnection. As a result, the next device DV(i+1) receives the ID number, IDii The ID generation ends at the device DVi (step 984).

If the values of the DTsi and the DTref do not match (NO at step 965), then no flag is set and no DT determination result is registered, so that the DT match signal 449 is "low". The DT match determination is NO at step 978. This signal indicates to the device not to store the received device ID number, IDii, with no adding operation (step 983), and to transfer the ID number to the next device in the serial interconnection (step 982). Upon completion of step 982, the ID generation process at the device DVi ends (step 984). If the device DVi is not the last device (i.e., device N) (NO at step 985), a next device DV(i+1) will be given (step 986) and the process at steps 976-984 will be repeated at that device DV(i+1). After the ID generation and/or skip operations end at all devices (YES at step 985), the ID recognizer 873 of the operation controller/processor 832 recognizes the IDoNk provided by the last device (i.e., device N), at the time of receiving the output port enable output signal SOPEQNk from device N. From the recognized IDoNk, the number of the devices of the provide device type DTsik is recognized by the data compiler 877 (step 987). Such operations of the ID generation and the last ID recognition are repeated with reference to k being 1 to M (i.e., DTsi1 to DTsiM). In receipt of the DTsik from operation/process controller 871 and the IDoNk from the ID recognizer 873, the data compiler 877 compiles data with regard to the device type DTsi, the last ID and the number of devices having the device type DTsi. The compiled data is stored in the memory 883 as a table as shown in FIG. 23. In the example, the device types DTsi for the device type match search are the DTnd for NAND Flash memories, the DTnr for NAND Flash memories, the DTdm for DRAMs, the DTsm for SRAMs, the DTmm for MRAMs and the "don't care" for every type memory. The table depicts the devices serially interconnected as shown in FIG. 17.

Figure 26A:
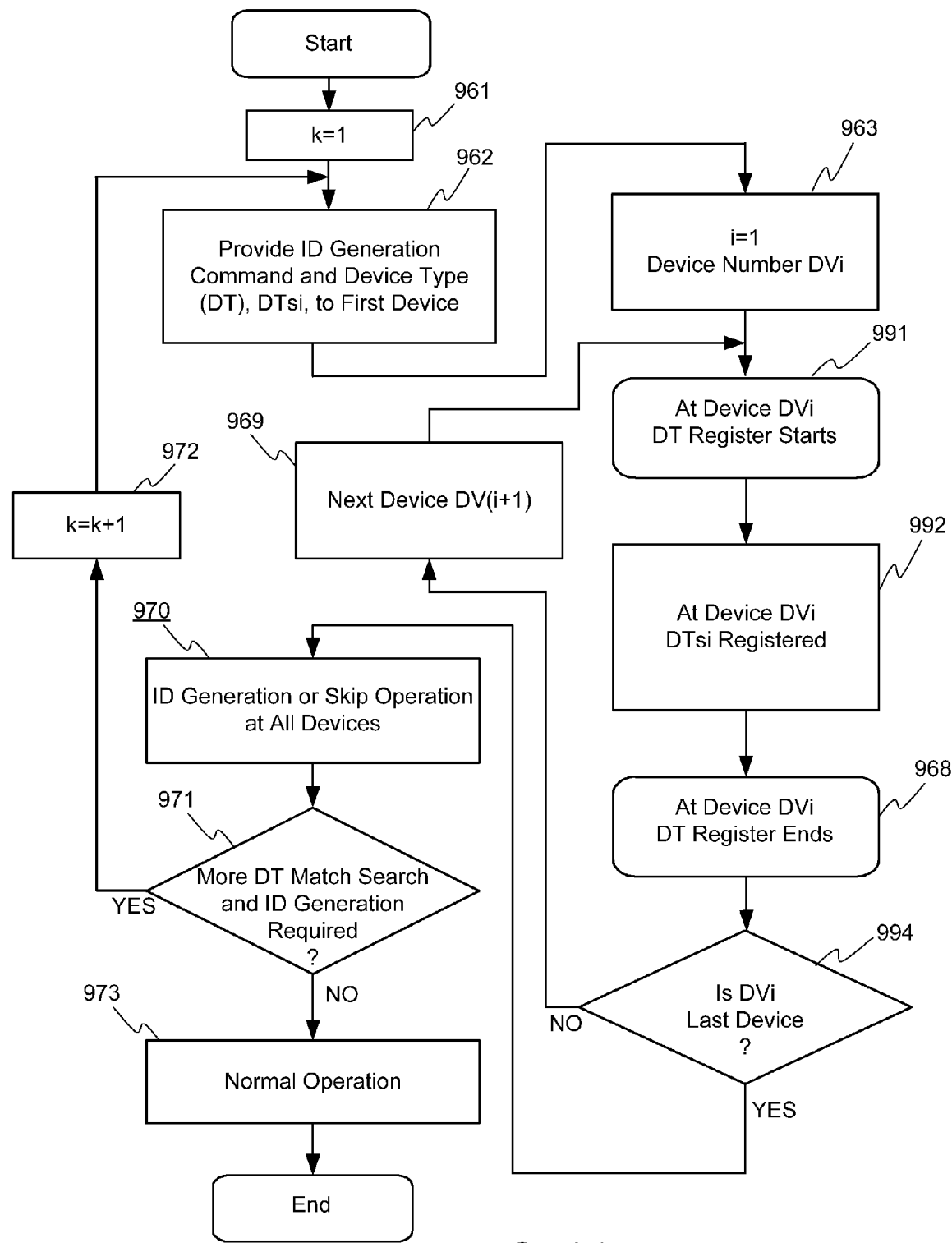
FIG. 26A is a flowchart illustrating another ID generation method performed by the devices shown in FIG. 22.
Figure 26B:
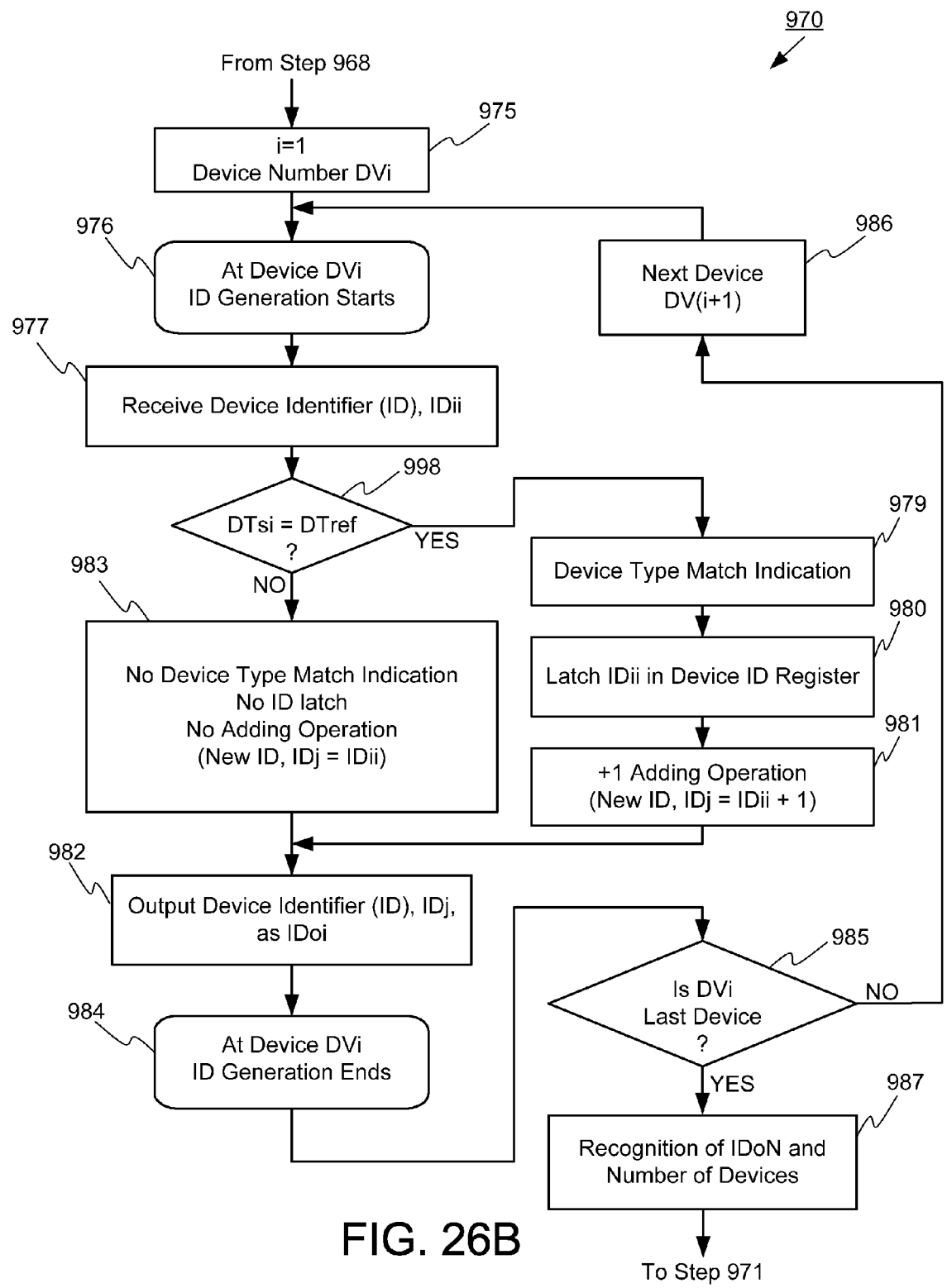
FIG. 26B is a flow chart illustrating part of the method shown in FIG. 26A.

FIG. 26A shows another ID generation method performed by the devices shown in FIG. 22. FIG. 26B shows part of the method shown in FIG. 26A. In the example shown in FIGS. 26A and 26B, the ID generation is performed by the ID generator shown in FIG. 10. The ID generation protocol is shown in FIG. 25.

The method shown in FIGS. 26A and 26B is similar to that of FIGS. 24A and 24B. A difference is that in the method shown in FIGS. 26A and 26B, the device type DTsik fed by the memory controller is registered in all of the N devices (steps 991-993) and then, the ID generation at step 970, the device type match between the registered DTsik and the reference DT, DTref, is conducted (step 998). The other operations, such as the ID generation and the skip operations, are the same as those of the method shown in FIGS. 24A and 24B.

There are variations to the above-described embodiments. The configuration of the devices 120-1-120-4 in FIG. 1A may include both a serial interconnection (e.g., an input SIP and an output SOP) and conventional multi-drop connections (e.g., the clock signal SCLK and the chip select signal /SCS). Thus, the configuration may be referred to as a hybrid of serial interconnection and multi-drop configurations, where the advantages of each may be realized. Alternatively, embodiments of the techniques described herein may be implemented in serial, parallel, multi-drop or other connections, and combinations thereof, between devices.

In the above-described embodiments, the operation has been described based on the active "high" signals for the purpose of simplicity. They may be designed to perform the operation based on the "low" active signals, in accordance with a design preference. The control signals may have two bytes or more than two bytes in accordance with operation code assignment. Timing control can be changed from the sequential and multiple clocks enabled by command type to the single clock with additional control signals to activate the selected serial registers. The sequence of issuing multiple clocks can be varied in accordance with the specification of timing, arrangement of addresses, and the length of addresses. As mentioned before, it can apply the serial Flash memory or the product with serial input bit stream control.

In the embodiments described above, the device elements and circuits are connected to each other as shown in the figures, for the sake of simplicity. In practical applications of the present invention to apparatus, devices, elements, circuits, etc. may be connected directly to each other. As well, devices, elements, circuits etc. may be connected indirectly to each other through other devices, elements, circuits, interfaces, etc., necessary for operation of the apparatus. Thus, in actual configuration, the circuit elements and devices are directly or indirectly coupled with or connected to each other.

It is apparent to those of ordinary skill in the art that the ID generators or producers, the controllers, the processors and the other device elements and the memory controllers may be achieved by hardware or software.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A system comprising:
  a serial interconnection configuration of N memory devices of mixed type, N being an integer greater than one, each of the devices having serial input and output connections, the serial input and output connections of one device being coupled to the serial output connection of a previous device and the serial input connection of a next device, respectively, each of the devices including:
    a determiner configured to determine if a received device type (DT) corresponds to a reference DT assigned to the device, and to provide a determination result, and
    a device identifier producer configured to produce a device identifier (ID) in response to the determination result; and
  a controller configured to provide a serial input signal and a control signal to a first device of the serial interconnection configuration, the serial input signal containing ID information and the received DT, the serial input signal and the control signal being propagated with or without being altered through the N devices, a propagated input signal being inputted to one device and outputted therefrom as a serial output signal, the N-th device providing the propagated serial output signal and the propagated control signal to the controller.

2. The system of claim 1, wherein the device further includes:
  a receiver configured to receive the ID information contained in the serial input signal through the serial input connection thereof, the received ID information being provided to the ID producer for producing the ID in response to the determination result.

3. The system of claim 2, wherein the ID producer comprises:
  a calculator configured to perform a calculation of the ID based on the received ID information and a pre-defined value to provide a calculated ID.

4. The system of claim 3, wherein the device further includes:
  a device type provider configured to provide device type information (DTI) of the device as the reference DT (DTref).

5. The system of claim 4, wherein the determiner comprises:
  a comparator configured to compare the received DT with the reference DT to produce the determination result.

6. The system of claim 5, wherein the ID producer further comprises:
  a selector configured to select one of the calculated ID and a non-calculated ID to output a selected ID in response to the determination result, the non-calculated ID corresponding to the received ID, the selected ID being outputted through the output connection of the device.

7. The system of claim 6, wherein the receiver comprises:
  a register configured to receive the ID information and the received DT in a serial manner through the serial input connection of the device, the register holding and providing in a parallel manner, the ID information to the calculator and the received DT to the comparator.

8. The system of claim 4, wherein the device type provider comprises:
  storage means configured to
    store the DTI of the device, and to
    provide the DTI for the determiner.

9. The system of claim 3, wherein the calculator comprises:
  an adder for adding one to the received ID information.

10. The system of claim 3, wherein the calculator comprises:
  a subtractor configured to subtract one from the received ID information.

11. The system of claim 1, wherein the N memory devices comprise:

any one of more than one type of random access memories and Flash memories.

12. The system of claim 11, wherein:
the random access memories comprise DRAM, SRAM, MRAM devices; and
the Flash memories comprise NAND-, NOR- and AND-type Flash memory.

13. The system of claim 1, wherein the controller comprises:
a signal sender configured to send the serial input signal and the control signals; and
a signal receiver configured to receive the serial output signal and the propagated control signal from the N-th device.

14. The system of claim 13, wherein the signal receiver comprises:
a recognizer configured to recognize the ID contained in the serial output signal in response to the propagated control signal provided by the N-th device.

15. The system of claim 14, wherein the signal receiver further comprises:
a data calculator configured to calculate the number of the devices in response to the recognized ID.

16. A system comprising a plurality of memory devices of mixed type in a serial interconnection configuration, a first device having a serial input connection coupled to a serial output connection of a previous device, a second device having a serial input connection coupled to a serial output connection of the first device, at least one of the devices comprising:
a receiver configured to receive a device identifier (ID) and a device type (DT) through the serial input connection of the device;
a determiner configured to determine a memory type of the device from the received DT or a pre-defined code relating to all memory types, the determiner providing a determination result when the DT corresponds at least one of the memory type and the pre-defined code; and
an ID producer configured to produce an ID in response to the determination result.

17. The system of claim 16, wherein the ID producer comprises:
a calculator configured to calculate a new ID based on the ID and a pre-defined value; and
a skip operator for passing the ID,
wherein, in response to the determination result, the new ID or the ID is provided by the ID producer.

18. The system of claim 17, wherein the one of the devices further comprises:
a device information provider configured to provide DT information (DTI) of the device.

19. The system of claim 18, wherein the determiner comprises:
a comparator configured to compare the DT to the DTI, to provide the determination result.

20. The system of claim 19, wherein the ID producer further comprises:
a selector configured to select one of the new ID and the ID as a selected ID in response to the determination result from the comparator, the selected ID being outputted through the output connection of the device.

21. The system of claim 20, wherein the receiver comprises:
a holder configured to hold the ID and DT as held ID and held DT, the held ID and the held DT being provided to the calculator and the comparator, respectively.

22. The system of claim 21, wherein the holder comprises:
a first serial to parallel holder configured to hold the ID in serial manner and outputting the ID in parallel manner; and
a second serial to parallel holder configured to hold the DT in serial manner and outputting the DT in parallel manner.

23. The system of claim 22, wherein the ID producer further comprises:
a parallel to serial holder configured to hold the selected ID in parallel manner and outputting it in serial manner.

24. The system of claim 23, wherein the device information provider comprises:
an information storage configured to store the DTI of the device, the DTI being provided in parallel manner to the comparator.

25. The system of claim 24, wherein:
the plurality of memory devices in the serial interconnection configuration comprises mixed type memory devices; and
the information storage comprises a storage configured to store the DTI of the different type memory devices; and providing provide the DTI corresponding to a selected one of the memory devices.

26. The system of claim 25, wherein the different type memory devices comprises more than one type of any random access memories and Flash memories.

27. The system of claim 26, wherein the one of the devices further comprises:
an ID holder configured to hold the ID in response to the determination result.

* * * * *